United States Patent
Rinerson et al.

(10) Patent No.: US 7,372,753 B1
(45) Date of Patent: May 13, 2008

(54) TWO-CYCLE SENSING IN A TWO-TERMINAL MEMORY ARRAY HAVING LEAKAGE CURRENT

(75) Inventors: Darrell Rinerson, Cupertino, CA (US); Christophe Chevallier, Palo Alto, CA (US); Chang Hua Siau, San Jose, CA (US)

(73) Assignee: Unity Semiconductor Corporation

( * ) Notice: Subject to any disclaimer, the term of this patent is extended or adjusted under 35 U.S.C. 154(b) by 41 days.

(21) Appl. No.: 11/583,676

(22) Filed: Oct. 19, 2006

(51) Int. Cl.
*G11C 7/02* (2006.01)

(52) U.S. Cl. .................. 365/209; 365/51; 365/63; 365/148

(58) Field of Classification Search ............ 365/51, 365/52, 63, 100, 148, 209
See application file for complete search history.

(56) References Cited

U.S. PATENT DOCUMENTS

| | | | |
|---|---|---|---|
| 3,886,577 A | 5/1975 | Buckley | |
| 5,296,716 A | 3/1994 | Ovshinsky et al. | |
| 5,994,757 A * | 11/1999 | Ichikawa et al. | 257/530 |
| 6,185,143 B1 | 2/2001 | Perner et al. | |
| 6,188,615 B1 | 2/2001 | Perner et al. | |
| 6,204,139 B1 | 3/2001 | Liu et al. | |
| 6,256,247 B1 | 7/2001 | Perner | |
| 6,317,375 B1 | 11/2001 | Perner | |
| 6,317,376 B1 | 11/2001 | Tran et al. | |
| 6,331,944 B1 | 12/2001 | Monsma et al. | |
| 6,473,332 B1 | 10/2002 | Ignatiev et al. | |
| 6,487,106 B1 | 11/2002 | Kozicki | |
| 6,487,124 B2 | 11/2002 | Semi | |
| 6,504,221 B1 | 1/2003 | Tran et al. | |
| 6,531,371 B2 | 3/2003 | Hsu et al. | |
| 6,552,409 B2 * | 4/2003 | Taussig et al. | 257/529 |
| 6,608,773 B2 | 8/2003 | Lowrey et al. | |
| 6,646,912 B2 * | 11/2003 | Hurst et al. | 365/175 |
| 6,657,888 B1 | 12/2003 | Doudin et al. | |
| 6,667,900 B2 | 12/2003 | Lowrey et al. | |
| 6,707,710 B1 | 3/2004 | Holden | |
| 6,707,712 B2 | 3/2004 | Lowery | |
| 6,717,874 B1 | 4/2004 | Perner et al. | |

(Continued)

FOREIGN PATENT DOCUMENTS

EP     1 376 598 A1     1/2004

(Continued)

OTHER PUBLICATIONS

U.S. Appl. No. 11/583,446, filed Oct. 19, 2006, Siau et al.

(Continued)

*Primary Examiner*—Gene N. Auduong

(57) ABSTRACT

A two-terminal memory array includes a plurality of first and second conductive traces. An address unit operatively applies a select voltage across a selected pair of the first and second conductive traces and applies a non-select voltage potential to unselected traces. A total current flowing in the selected first conductive trace and a leakage current flowing through unselected second conductive traces are sensed by a sense unit in a one cycle or a two cycle pre-read operation. The total and leakage currents can be combined with a reference signal to derive a data signal indicative of one of a plurality of conductivity profiles that represent stored data. The conductivity profiles can be stored in a resistive state memory element that is electrically in series with the selected first and second conductive traces.

25 Claims, 34 Drawing Sheets

U.S. PATENT DOCUMENTS

| | | | |
|---|---|---|---|
| 6,731,528 B2 | 5/2004 | Hush et al. |
| 6,751,147 B1 | 6/2004 | Smith et al. |
| 6,753,561 B1 | 6/2004 | Rinerson et al. |
| 6,754,107 B2 | 6/2004 | Khouri et al. |
| 6,807,088 B2 | 10/2004 | Tsuchida |
| 6,813,177 B2 | 11/2004 | Lowrey et al. |
| 6,825,489 B2 | 11/2004 | Kozicki |
| 6,826,094 B1 | 11/2004 | Perner et al. |
| 6,836,421 B2 | 12/2004 | Rinerson et al. |
| 6,836,422 B1 | 12/2004 | Perner et al. |
| 6,847,544 B1 | 1/2005 | Smith et al. |
| 6,856,536 B2 | 2/2005 | Rinerson et al. |
| 6,865,104 B2 | 3/2005 | Perner |
| 6,873,544 B2 | 3/2005 | Perner et al. |
| 6,885,573 B2 | 4/2005 | Sharma et al. |
| 6,888,745 B2 | 5/2005 | Ehiro et al. |
| 6,894,938 B2 | 5/2005 | Smith et al. |
| 6,898,134 B2 | 5/2005 | Smith et al. |
| 6,939,724 B2 | 9/2005 | Zhuang et al. |
| 6,940,744 B2 | 9/2005 | Rinerson et al. |
| 6,992,920 B2 | 1/2006 | Tamai et al. |
| 6,998,698 B2 | 2/2006 | Inoue et al. |
| 6,999,366 B2 | 2/2006 | Perner et al. |
| 7,002,197 B2 | 2/2006 | Perner et al. |
| 7,020,006 B2 | 3/2006 | Chevallier et al. |
| 7,029,924 B2 | 4/2006 | Hsu et al. |
| 7,038,948 B2 | 5/2006 | Hamilton et al. |
| 7,042,757 B2 | 5/2006 | Perner |
| 7,046,043 B2 | 5/2006 | Shibata et al. |
| 7,057,258 B2 | 6/2006 | Tran et al. |
| 7,060,586 B2 | 6/2006 | Li et al. |
| 7,061,790 B2 | 6/2006 | Morimoto et al. |
| 7,068,204 B1 | 6/2006 | Bathul et al. |
| 7,075,817 B2 | 7/2006 | Rinerson et al. |
| 7,079,436 B2 | 7/2006 | Perner et al. |
| 7,102,948 B2 | 9/2006 | Perner |
| 7,116,576 B2 | 10/2006 | Smith et al. |
| 7,130,235 B2 | 10/2006 | Perner et al. |
| 7,136,300 B2 | 11/2006 | Tran et al. |
| 7,148,533 B2 | 12/2006 | Hsu et al. |
| 2003/0003675 A1 | 1/2003 | Hsu |
| 2003/0132456 A1 | 7/2003 | Miyai et al. |
| 2004/0141369 A1 | 7/2004 | Noguchi |
| 2005/0135148 A1 | 6/2005 | Chevallier et al. |
| 2005/0151156 A1 | 7/2005 | Wu et al. |
| 2006/0034124 A1 | 2/2006 | Guterman et al. |
| 2006/0039191 A1 | 2/2006 | Perner et al. |
| 2006/0044878 A1 | 3/2006 | Perner et al. |
| 2006/0050551 A1 | 3/2006 | Perner |
| 2006/0050552 A1 | 3/2006 | Perner et al. |
| 2006/0050582 A1 | 3/2006 | Perner et al. |

FOREIGN PATENT DOCUMENTS

| EP | 1 376 598 B1 | 1/2004 |
|---|---|---|

OTHER PUBLICATIONS

U.S. Appl. No. 11/478,520, filed Jun. 29, 2006, Rinerson et al.

Zhuang, W.W. et al., "Novel colossal magnetoresistive thin film nonvolatile resistance random access memory (RRAM)"; IEDM Technical Digest, IEEE, Dec. 8, 2002, pp. 193-196.

U.S. Appl. No. 60/536,115, filed Jan. 13, 2004, Wu et al.

A.Baikalov, et al, "Field-driven hysteretic and reversible resistive switch at the Ag-Pr0.7Ca0.3MnO3 interface" Applied Physics Letters, vol. 83, No. 5, Aug. 4, 2003, pp. 957-959.

A. Beck, J. Bednorz, A. Bietsch, Ch. Gerber, C. Rossel, D. Widmer, "Reproducible switching effect in thin oxide films for memory applications," Applied Physics Letters, vol. 77, No. 1, Jul. 3, 2000, pp. 139-141.

A. Sawa, et al, "Hysteretic current-volyage characteristics and resisitance switching at a rectifying $Ti/Pr_{0.7}Ca_{0.3}MnO_3$ interface" Applied Physics Letters, vol. 85, No. 18, Nov. 1, 2004, pp. 4073-4075.

C. Rossel, G.I. Meijer, D. Brémaud, D. Widmer, "Electrical current distribution across a metal-insulator-metal structure during bistable switching," Journal of Applied Physics, vol. 90, No. 6, Sep. 15, 2001, pp. 2892-2898.

David Oxley, "Memory Effects in Oxide Films" in Oxides and Oxide Films, vol. 6, pp. 251-325 (Chapter 4) (Ashok. K. Vijh ed., Marcel Drekker) (1981).

J.G. Simmons and R.R. Verderber, "New Conduction and Reversible Memory Phenomena in Thin Insulting Films," Proc. Roy. Soc. A., 301 (1967), pp. 77-102.

Liu et al., "A New Concept for Non-Volatile Memory: The Electric-Pulse Induced Resistive Change Effect in Colossal Magnetoresistive Thin Films," Non-Volatile Memory Technology Symposium, Nov. 7, 2001, pp. 1-7.

Liu et al., "Electric-pulse-induced reversible resistance change effect in magnetoresistive films," Applied Physics Letters, vol. 76, No. 19, May 8, 2000, pp. 2749-2751.

R.E. Thurstans and D.P. Oxley, "The Electroformed metal-insulator-metal structure: A comprehensive model," J. Phys. D.: Appl. Phys. 35 (2002), Apr. 2, 2002, pp. 802-809.

Y. Watanabe, J.G. Bednorz, A. Bietsch, Ch. Gerber, D. Widmer, A. Beck, "Current-driven insulator-conductor transition and nonvolatile memory in chromium-doped SrTiO3 single crystals," Applied Physics Letters, vol. 78, No. 23, Jun. 4, 2001, pp. 3738-3740.

R. Oligschlaeger, R. Waser, R. Meyer, S. Karthäuser, R. Dittmann, "Resistive switching and data reliability of epitaxial (Ba,Sr)TiO thin films," Applied Physics Letters, 88 (2006), 042901.

S. Lai, T. Lowrey, "OUM—A 180 nm nonvolatile memory cell element technology for standalone and embedded applications," IEEE International Electron Device Meeting, Technical Digest, 803 (2001).

J. Mizusaki J, Y. Yonemura, H. Kamata, K. Ohyama, N. Mori, H. Takai, H. Tagawa, M. Dokiya, K. Naraya, T. Sasamoto, H. Inaba, T. Hashimoto, "Electronic conductivity, Seebeck coefficient, defect and electronic structure of nonstoichiometric $La_{1-x}Sr_xMnO_3$," Solid State Ionics 132, 167 (2000).

Zhao Y.G.; Rajeswari M.; Srivastava R. C.; Biswas A.; Ogale S. B.; Kang D. J.; Prellier W.; Zhiyun Chen; Greene R. L.; Venkatesan T., "Effect of oxygen content on the structural, transport, and magnetic properties of $La_{1-delta}Mn_{1-delta}O_3$ thin films," Journal of Applied Physics, vol. 86, No. 11, Dec. 1999, pp. 6327-6330.

J. R. Stetter, W. R. Penrose, S. Yao, "Sensors, Chemical Sensors Electrochemical Sensors, and ECS," Journal of The Electrochemical Society, 150 (2), S11-S16 (2003).

B.C. H. Steele, A. Heinzel, "Materials for Fuel-Cell Technologies," Nature 414, Nov. 2001, pp. 345-352.

A. Reller, J. M. Thomas, D. A. Jefferson, M. K. Uppal, "Superstructures Formed by the Ordering of Vacancies in a Selective Oxidation Catalyst: Grossly Defective $CaMnO_3$," Proceedings of Royal Society of London, vol. 394, No. 1807 Aug. 1984, pp. 223-241.

A. J. Millis, "Cooperative Jahn-Teller effect and electron-phonon coupling in $La_{1-x}A_xMnO_3$," Phys. Rev. B 53, 8434-8441 (1996).

Noboru Sakimura, et al, "A 512Kb Cross-Point Cell MRAM", IEEE International Solid-State Circuits Conference, 2003, paper 16.1.

\* cited by examiner

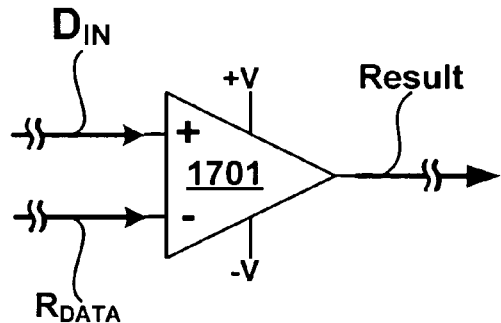
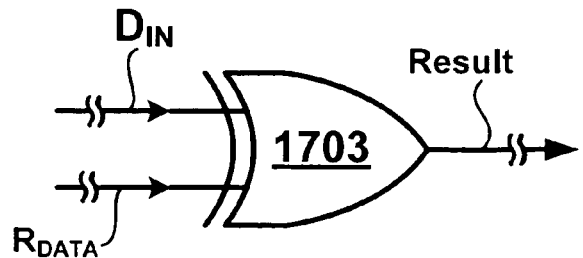
FIG. 17A  FIG. 17B
| | $R_{DATA}$ | $D_{IN}$ | Result | Stored Data |
|---|---|---|---|---|
| 1. | 0 | 0 | 0 | 0* |
| 2. | 0 | 1 | 1 | 1 |
| 3. | 1 | 0 | 1 | 0 |
| 4. | 1 | 1 | 0 | 1* |
FIG. 17C
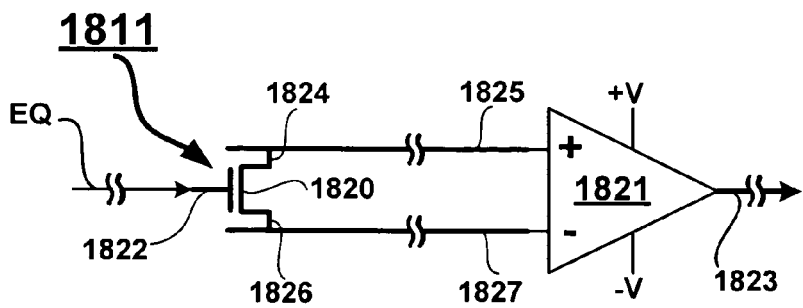
FIG. 18

| RE | WE | $D_{IN}$ | $V_{SR}$ | $V_{SC}$ |
|---|---|---|---|---|
| 0 | 0 | 0 | $V_{NR}$ | $V_{NC}$ |
| 0 | 0 | 1 | $V_{NR}$ | $V_{NC}$ |
| 0 | 1 | 0 | $+V_{W1}$ | $-V_{W2}$ |
| 0 | 1 | 1 | $-V_{W1}$ | $+V_{W2}$ |
| 1 | 0 | 0 | $-V_{R1}$ | $+V_{R2}$ |
| 1 | 0 | 1 | $-V_{R1}$ | $+V_{R2}$ |
| 1 | 1 | 0 | $V_{NR}$ | $V_{NC}$ |
| 1 | 1 | 1 | $V_{NR}$ | $V_{NC}$ |

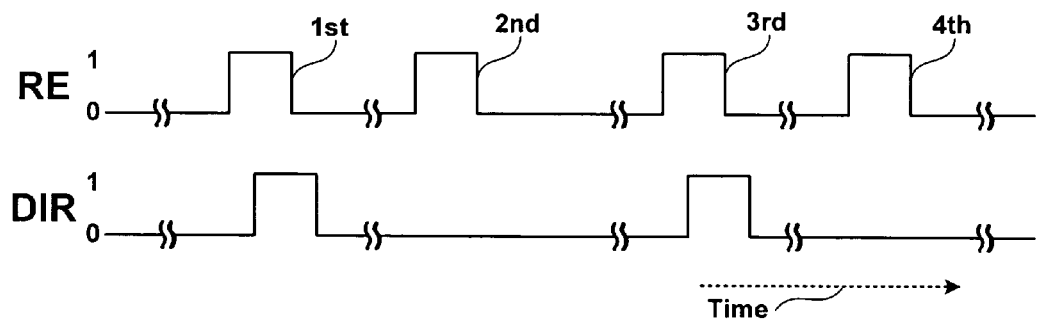
FIG. 26A
FIG. 26B
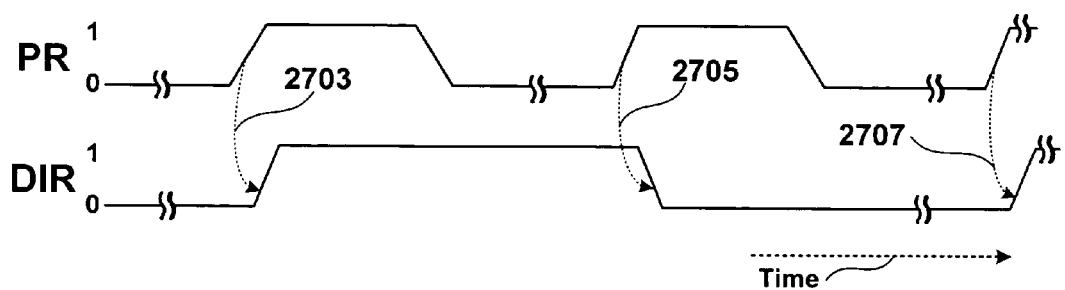
FIG. 27

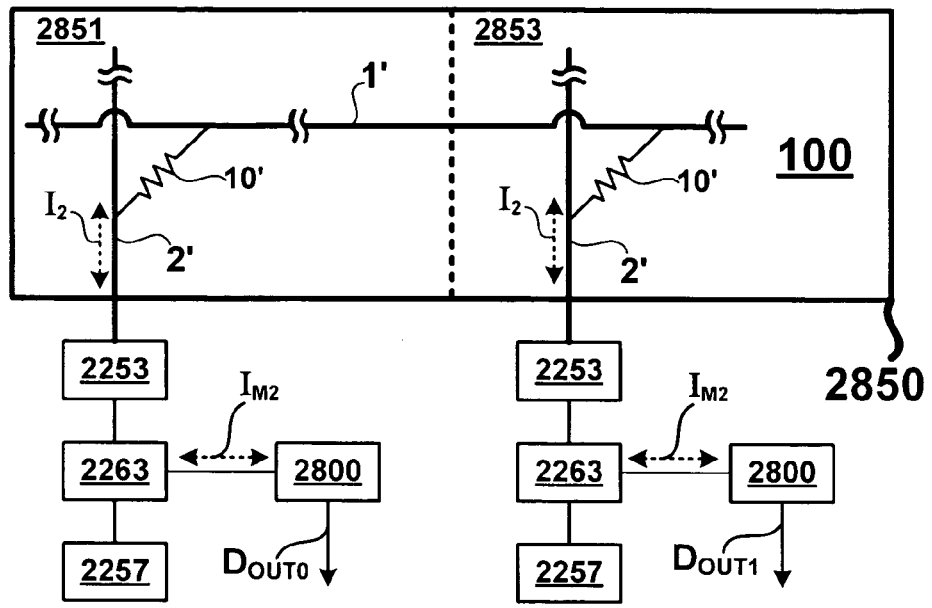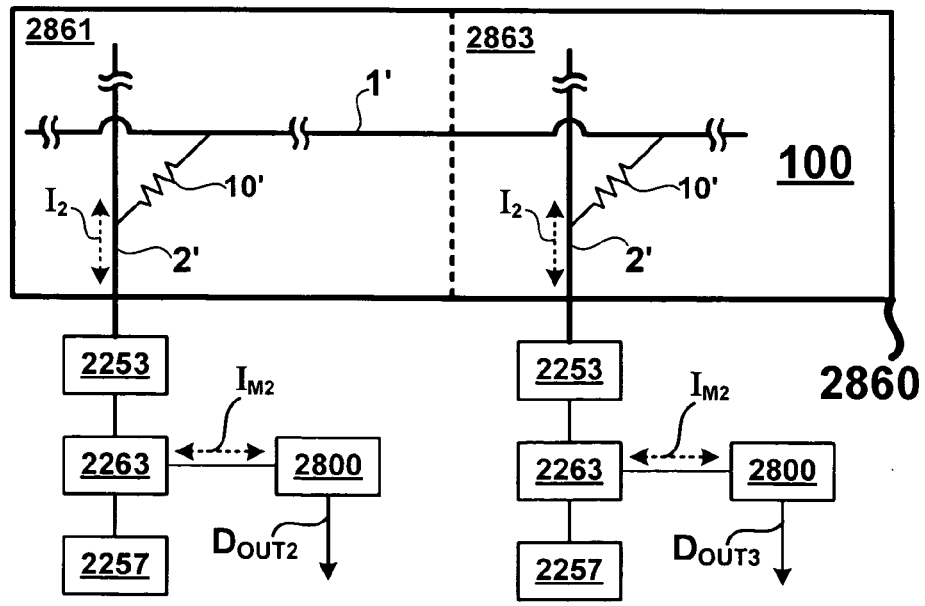
FIG. 28F

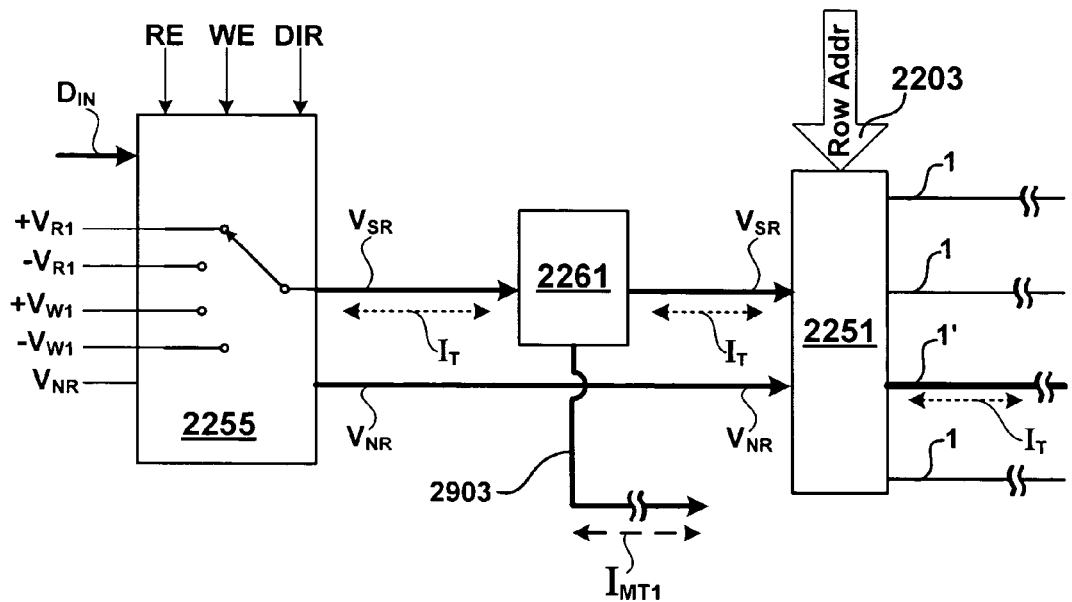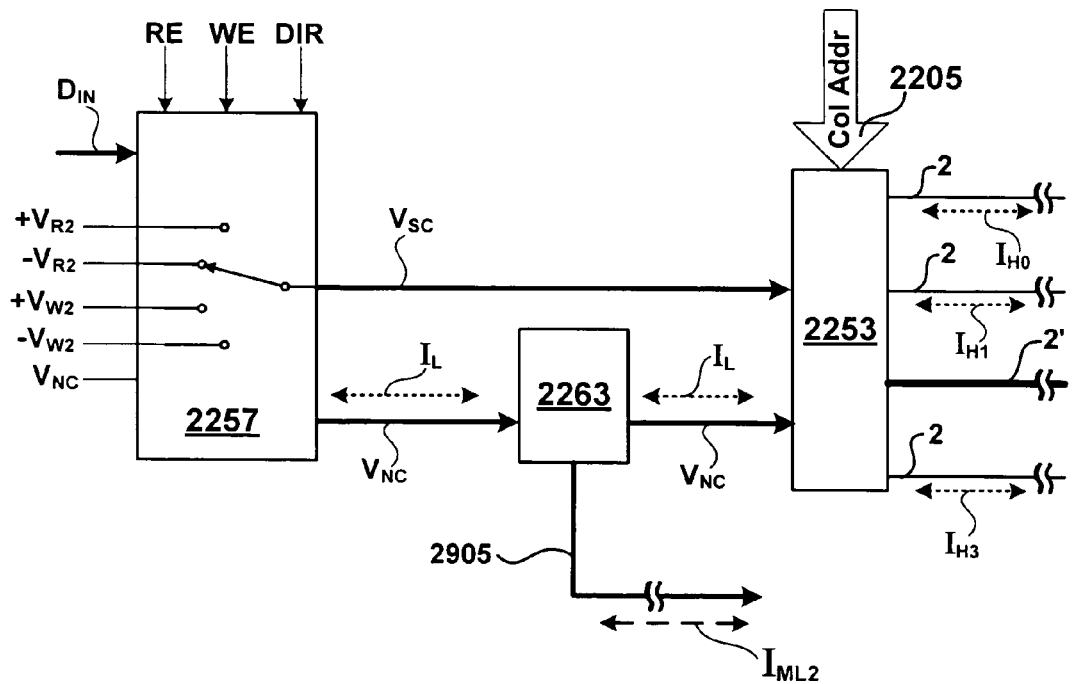
FIG. 29A

TWO-CYCLE SENSING IN A TWO-TERMINAL MEMORY ARRAY HAVING LEAKAGE CURRENT

FIELD OF THE INVENTION

The present invention relates generally to sensing a signal in a two-terminal memory array. More specifically, the present invention relates to sensing a signal in a two-terminal memory array during a read operation or in preparation for a write operation.

BACKGROUND OF THE INVENTION

Data storage in high-density memory devices can be accomplished using a variety of techniques. Often, the technique used depends on whether or not the stored data is volatile or non-volatile. In volatile memory devices, such as SRAM and DRAM, for example, stored data is not retained when power is removed from the memory device. On the other hand, for non-volatile memory devices, such as MRAM and Flash devices, stored data is retained when power is removed from the memory device.

Resistive state memory devices are a promising new type of non-volatile memory in which data is stored in a memory element as a plurality of resistive states. A first resistive state can represent a logic "1" and a second resistive state can represent a logic "0". The first and second resistive states can be set by applying a write voltage of a predetermined magnitude, polarity, and duration across the memory element during a write operation. For example, voltage pulses can be used to write a logic "1" and a logic "0", respectively.

In either case, after data has been written to the memory element, reading the value of the stored data in the memory element is typically accomplished by applying a read voltage across the memory element and sensing a read current that flows through the memory element. For example, if a logic "0" represents a high resistance and a logic "1" represents a low resistance, then for a constant read voltage, a magnitude of the read current can be indicative of the resistive state of the memory element. Therefore, based on Ohm's law, the read current will be low if the data stored is a logic "0" (e.g., high resistance) or the read current will be high if the data stored is a logic "1" (e.g., low resistance). Consequently, the value of the stored data can be determined by sensing the magnitude of the read current.

In high density memory devices, it is desirable to pack as many memory cells as possible in the smallest area possible in order to increase memory density and data storage capacity. One factor that can have a significant impact on memory density is the number of terminals that are required to access a memory element for reading or writing. As the number of terminals required to access the memory element increases, device area increases with a concomitant decrease in areal density. Most memory technologies, such as DRAM, SRAM, and some MRAM devices, require at least three terminals to access the core memory element that stores the data. However, in some memory technologies, such as certain resistance based memories, two terminals can be used to both read and write the memory element.

An array of two terminal memory elements can include a plurality of row conductors and a plurality of column conductors and each memory element can have a terminal connected with one of row conductors and the other terminal connected with one of the column conductors. The typical arrangement is a two terminal cross-point memory array where each memory element is positioned approximately at an intersection of one of the row conductors with one of the column conductors. The terminals of the memory element connect with the row and column conductors above and below it. A single memory element can be written by applying the write voltage across the row and column conductors the memory element is connected with. Similarly, the memory element can be read by applying the read voltage across the row and column conductors the memory element is connected with. The read current can be sensed (e.g., measured) flowing through the row conductor or the column conductor.

One challenge that arises from a two-terminal configuration is that memory elements that share a row or column conductor with the memory element being read will also have a potential difference across their respective row and column conductors. The adjacent memory elements can be referred to as half-selected memory elements. The potential difference across the terminals of half-selected memory elements can cause half-select currents to flow through those memory elements. The half-select currents are additive and can be considered as a leakage current that occurs during a read operation. In a high density memory device, the number of memory elements in an array can be several thousand or more. During a read operation to a selected memory element in the array, the half-select currents from half-selected memory elements in the same row or same column as the selected memory element can vastly exceed the magnitude of the read current flowing through the selected memory element. The read current can be considered to be a signal and a magnitude of that signal is indicative of a data value of the data stored in the selected memory element. On the other hand, the leakage current can be considered to be noise that masks the read current signal. Therefore, in a large array, a signal-to-noise ratio (S/N) of the read current to the leakage current is low. A low S/N ratio can make it difficult to distinguish between the read current and the leakage current. Consequently, the low S/N ratio makes it difficult to detect an accurate value for the stored data.

There are continuing efforts to improve accuracy in reading data and in increasing S/N ratios in memory arrays having leakage current.

BRIEF DESCRIPTION OF THE DRAWINGS

FIG. 17A is a schematic view depicting one embodiment of an analog circuit for generating a result signal.

FIG. 17B is a schematic view depicting one embodiment of a logic circuit for generating a result signal.

FIG. 17C depicts one example of a truth table for generating a result signal.

FIG. 18 is a schematic view depicting one embodiment of an equalization circuit.

FIG. 26A depicts an example of a truth table for alternating read voltage polarity.

FIG. 26B is a timing diagram depicting one example of toggling a direction signal.

FIG. 27 is a timing diagram depicting another example of toggling a direction signal.

FIG. 28F depicts an exemplary memory bank for a two-cycle pre-read operation.

FIG. 29A is a block diagram depicting one embodiment of a sense unit.

Figure 1:
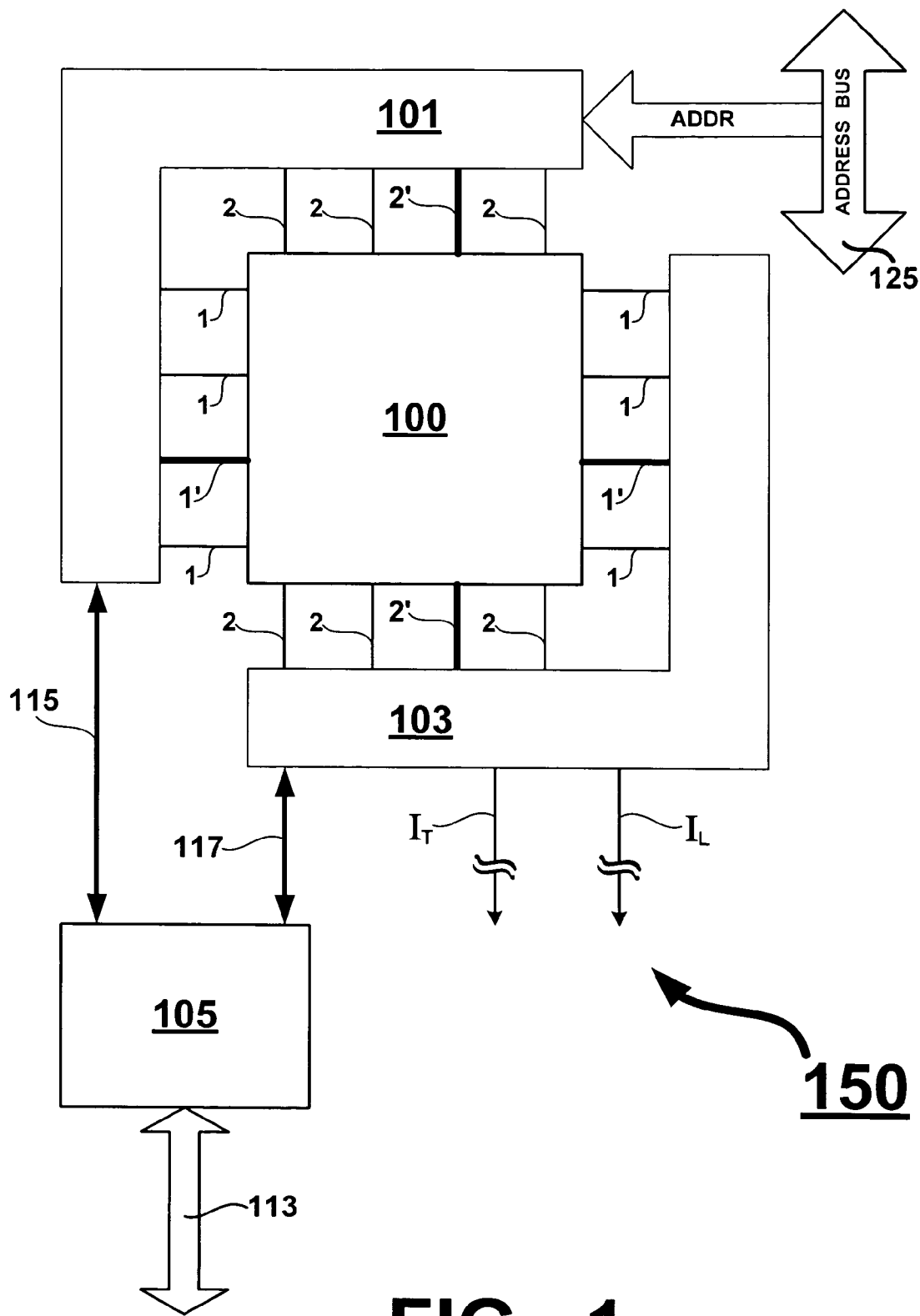
FIG. 1 is a block diagram depicting one embodiment of an apparatus for sensing current in a two-terminal memory array.

Although the previous Drawings depict various examples of the invention, the invention is not limited by the depicted examples. Furthermore, the depictions are not necessarily to scale.

DETAILED DESCRIPTION

In the following detailed description and in the several figures of the drawings, like elements are identified with like reference numerals. As shown in the drawings for purpose of illustration, the present invention is embodied in an apparatus for sensing current in a two-terminal memory array and in a method of sensing a signal in a two-terminal memory array.

In one embodiment, the present invention discloses an apparatus for two-cycle sensing in a two-terminal memory array having leakage current. The apparatus includes an array having a plurality of first conductive traces and a plurality of second conductive traces. An address unit receives an address, selects one of the plurality of second conductive traces during a first cycle, applies a first select voltage to the selected second conductive trace and applies a non-select voltage potential to un-selected traces. During a second cycle, the address unit selects one of the plurality of first conductive traces and applies a second select voltage to the selected first conductive trace. A sense unit senses a leakage current flowing through the selected second conductive trace during the first cycle and senses a total current flowing through the selected second conductive trace during the second cycle.

In another embodiment, the present invention discloses a method for two-cycle sensing in a two-terminal memory array having leakage current. The method includes providing an array having a plurality of first conductive traces and a plurality of second conductive traces. Receiving an address associated with a selected first conductive trace from the plurality of first conductive traces and one or more selected second conductive traces from the plurality of second conductive traces. A first select voltage is applied to one or more selected second conductive traces during a first cycle and during a second cycle. A non-select voltage potential is applied to the plurality of first conductive traces and unselected second conductive traces during the first cycle. During the first cycle, one or more leakage currents that flow through the one or more selected second conductive traces are sensed. During the second cycle, a second select voltage is applied to the selected first conductive trace while applying the non-select voltage potential to unselected first and second conductive traces and one or more total currents that flow through the one or more selected second conductive traces are sensed.

In the following detailed description, numerous specific details are set forth to provide a through understanding of the present invention. It will be apparent to one skilled in the art that the present invention may be practiced without some or all of these specific details. In other instances, well known elements and process steps have not been described in depth in order to avoid unnecessarily obscuring the present invention.

In FIG. 1, an apparatus 150 for sensing a signal in a two-terminal memory array 100 includes a plurality of first conductive traces 1, a plurality of second conductive traces 2, an address unit 101, and a sense unit 103. The address unit 101 receives an address ADDR and selects at least one of the plurality of first conductive traces (denoted as 1') and one of the plurality of second conductive traces (denoted as 2'). The address unit 101 applies a select voltage across the selected first and second conductive traces 1' and 2'. The address unit 101 also applies a non-select voltage potential (non-select voltage hereinafter) to unselected traces 1 and 2. The sense unit 103 senses a total current $I_T$ flowing through the selected first conductive trace 1' and senses a leakage current $I_L$ flowing through unselected second conductive traces 2. One skilled in the art will appreciate that the apparatus 150 and its sub-components (e.g. 101 and 103) can be coupled with and controlled by an external device (e.g., a microprocessor or a memory controller). Optionally, the apparatus 150 can include at least one control unit 105 operative to coordinate and control operation of the address and sense units 101 and 103. One or more signal lines 115 and 117 can couple the control unit 105 with the address and sense units 101 and 103. The control unit 105 can be electrically coupled with an external system (e.g., the microprocessor or the memory controller) through one or more signal lines 113.

Two-Terminal Memory Array

Figure 2A:
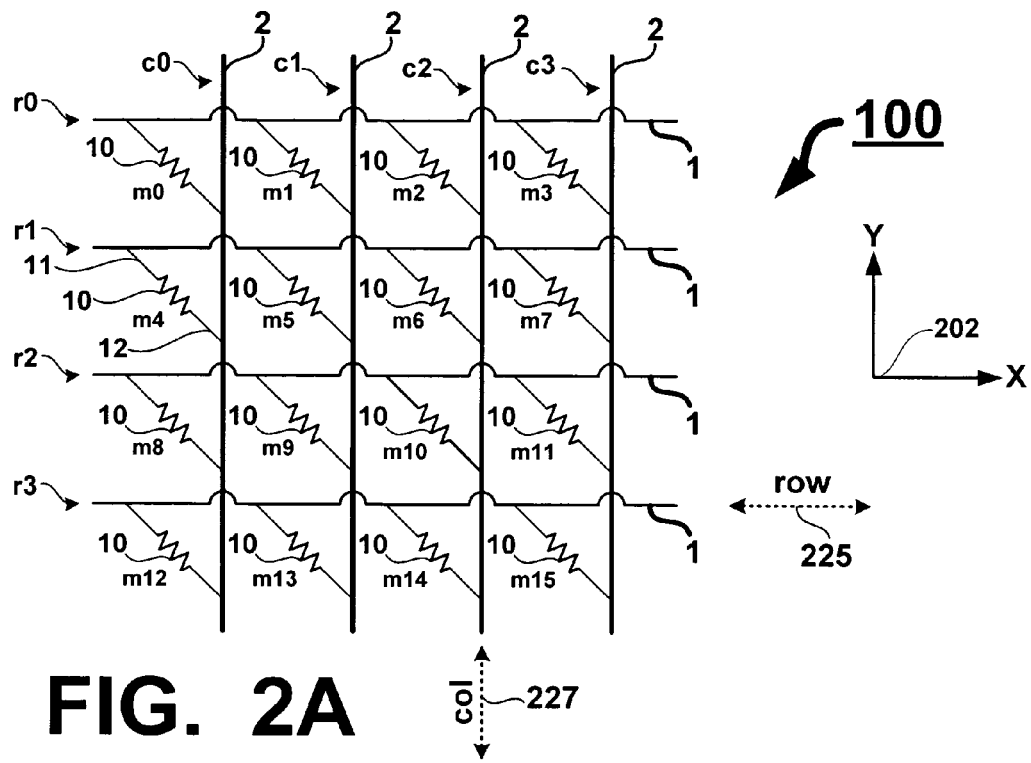
FIG. 2A is a schematic depicting one embodiment of a two-terminal memory array.

Turning to FIG. 2A, the two-terminal array 100 (array 100 hereinafter) includes the plurality of first conductive traces 1 and the plurality of second conductive traces 2. For purposes of explanation, an orientation of the first and second conductive traces 1 and 2 is depicted relative to an x-y coordinate system 202. Accordingly, the first conductive traces 1 are arranged in rows aligned with an x-axis (as depicted by dashed arrow 225 for row) and the second conductive traces 2 are arranged in columns aligned with a y-axis (as depicted by dashed arrow 227 for col). The arrangement of the first and second conductive traces 1 and 2 can be reversed such that the first conductive traces 1 are arranged in columns and the second conductive traces 2 are arranged in rows.

The array 100 includes a plurality of memory elements 10 for storing data. The memory elements 10 store data as a plurality of conductivity profiles with discrete resistances at certain voltages. Therefore, each memory element 10 is schematically depicted as a resistor. A magnitude of a resistance at a certain voltage of a specific memory element 10 is indicative of a value of stored data in the specific memory element 10. As an example, each memory element 10 can store a single bit of data as one of two distinct conductivity profiles with a first resistive state $R_0$ at a read voltage $V_R$ indicative of a logic "0" and a second resistive state $R_1$ at $V_R$ indicative of a logic "1", where $R_0 \neq R_1$. Preferably, a change in conductivity, measured at $V_R$, between $R_0$ and $R_1$, differs by at least a factor of approximately 10 (e.g., $R_0=1$ M$\Omega$ and $R_1=100$ k$\Omega$). The memory elements 10 are not necessarily linear resistors and the resistance of the memory elements 10 may not be a linear function of the voltage applied across the memory elements 10. Therefore, a resistance R of the memory elements 10 can approximately be a function of the read voltage $V_R$ such that $R \approx f(V_R)$.

The actual convention for determining which resistive state represents a logic "0" and a logic "1" will be application dependent and one skilled in the art will understand that the first resistive state $R_0$ can be indicative of a logic "0" and the second resistive state $R_1$ can be indicative of a logic "1". Initially, memory elements 10 in the array 100 may be in a predetermined initial resistive state in which the conductivity profile of all of the memory elements 10 is indicative of the first resistive state $R_0$ or the second resistive state $R_1$. Subsequently, write operations to selected memory element 10' can effectuate a change from the initial resistive state to the first resistive state $R_0$ or the second resistive state $R_1$. In some conventions, the first resistive state $R_0$ (e.g., high resistance at $V_R$) is referred to as a programmed state and the second resistive state $R_1$ (e.g., low resistance at $V_R$) is referred to as an erased state. Accordingly, a write operation in which a logic "1" is to be written to a programmed memory element 10 will result in the conductivity profile changing from the programmed state of $R_0$ to the erased state of $R_1$. One skilled in the art will appreciate that an opposite convention in which the erased state is $R_0$ and the programmed state is $R_1$ can also be used. Hereinafter, for the sake of clarity, the first resistive state $R_0$ denotes a high resistance and a logic "0" and the second resistive state $R_1$ denotes a low resistance and a logic "1".

As another example, each memory element 10 can store multiple bits of data. Therefore, if two-bits of data are stored in each memory element 10, then there will be four distinct conductivity profiles with corresponding resistive states of $R_{00}$, $R_{01}$, $R_{10}$, and $R_{11}$, where $R_{00} > R_{01} > R_{10} > R_{11}$. For multi-bit data storage, it may be desirable for the highest and lowest resistive states $R_{00}$ and $R_{11}$ to differ by at least a factor of 100 at $V_R$ (e.g., $R_{00} \approx 1$ M$\Omega$ and $R_{11} \approx 10$ k$\Omega$). Preferably, intermediate resistive states $R_{01}$ and $R_{10}$ have a resistance that falls between the highest and lowest resistance. For example, the intermediate resistive states $R_{01}$ and $R_{10}$ can have a resistance that is approximately evenly divided between the highest and lowest resistance or they may fall between the highest and lowest resistance based on a logarithmic scale. The difference between the highest and the lowest resistive states is necessary in order to distinguish between a magnitude of a read current that flows through a selected memory element 10 during a read operation. If the resistive states are spaced too closely together, then it may be difficult to sense differences between the read current for $R_{01}$ and the read current for $R_{10}$, for example. The ability to distinguish between the read currents for each resistive state becomes more critical in the presence of leakage currents that flow in the array 100 at the same time as the read current. The combined magnitude of the leakage currents can mask the read current, making it difficult to accurately determine the resistive state of the selected memory element 10 during the read operation.

Referring again to FIG. 2A, each memory element 10 includes a first terminal 11 in communication with only one of the first conductive traces 1 and a second terminal 12 in communication with only one of the second conductive traces 2. Moreover, each memory element 10 is electrically in series with its first and second terminals 11 and 12. Consequently, each memory element 10 in the array 100 can be uniquely selected for a read operation or for a write operation by applying an appropriate select voltage across the first conductive trace 1 in communication with the first terminal 11 of the selected memory element 10 and the second conductive trace 2 in communication with the second terminal 12 of the selected memory element 10. As used herein, a memory element that is selected for a read operation or a write operation will be denoted as 10' and the selected conductive traces that are electrically in series with the selected memory element 10' will be denoted as 1' and 2' for the selected first and second conductive traces respectively. Furthermore, as used herein, memory elements 10 can include a plurality of layers, some of which directly contribute to switching and some of which are included for other considerations such as process related considerations and/or electrical considerations, for example.

Cross-Point Array

Figure 2B:
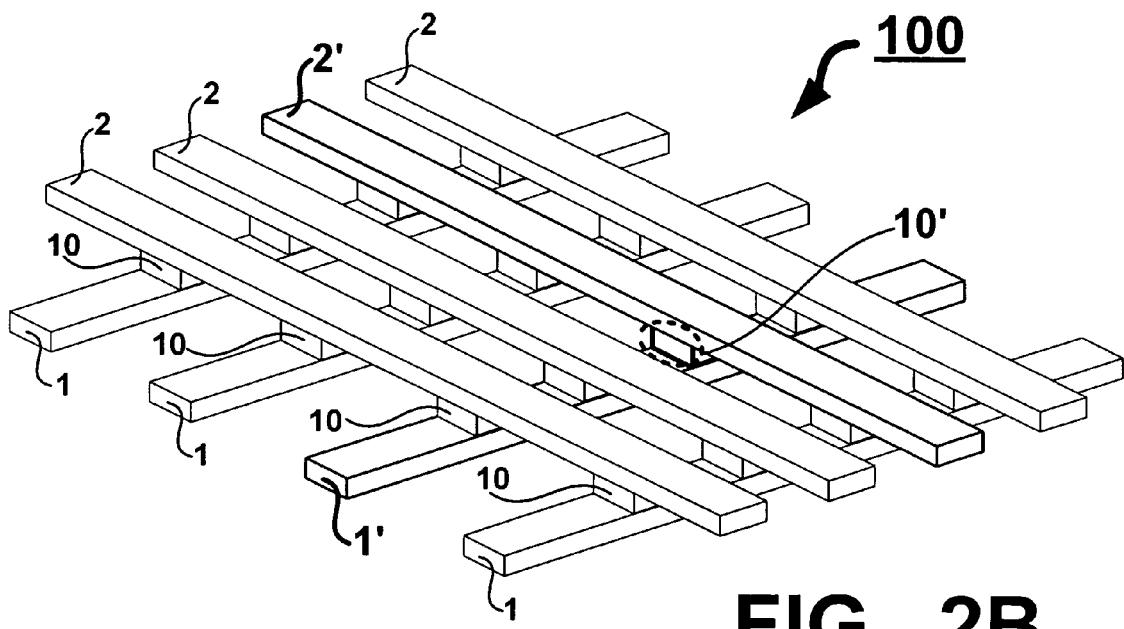
FIG. 2B is a perspective view depicting the two-terminal memory array of FIG. 2A.

In FIG. 2B, the first conductive traces 1 are spaced apart from one another and do not come into direct contact with each other or with any of the second conductive traces 2. Similarly, the second conductive traces 2 are also spaced apart from one another other and do not come into direct contact with each other or with any of the first conductive traces 1. Preferably, the first and second conductive traces 1 and 2 cross one another in a substantially orthogonal orientation (i.e., approximately 90 degrees) and each memory element 10 is positioned approximately at an intersection of one of the first conductive traces 1 with one of the second conductive traces 2 so that the array 100 comprises a cross-point array structure. Access (e.g., for a read or write operation) to a selected memory element 10' is accomplished by applying a select voltage across the first and second conductive traces 1' and 2' that cross the selected memory element 10'. In a manner similar to the order of the rows and columns in the array 100, the second conductive traces 2 may be positioned above the first conductive traces 1 or vice-versa, with the memory elements 10 positioned between the first and second conductive traces 1 and 2.

Read Operations

A read operation to the selected memory element 10' is effectuated by applying a select voltage $V_S$ having an appropriate read voltage magnitude across the selected first and second conductive traces 1' and 2'. The select voltage $V_S$ is applied to the selected first and second conductive traces 1' and 2' based on the address ADDR received by the address unit 101. For example, the address ADDR can be from an address bus 125. The address unit 101 decodes the address ADDR and applies the select voltages across the appropriate pair of selected conductive traces 1' and 2'. Furthermore, the address unit 101 applies the non-select voltage to the remaining conductive traces 1 and 2 (i.e., unselected traces 1 and 2).

Figure 3:
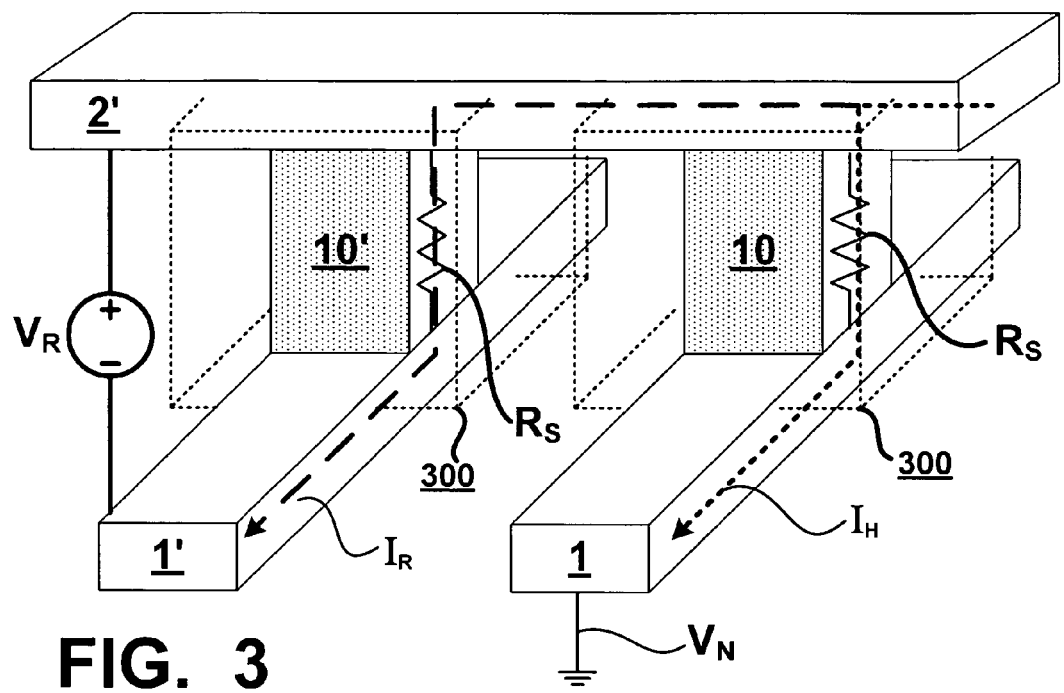
FIG. 3 is a perspective view depicting a selected memory element and a half-selected memory element during a read operation.

Turning now to FIG. 3, a portion of the array 100 is depicted during a read operation to a selected memory element 10'. Different magnitudes of the select voltage $V_S$ can be used to read data from and to write data to the selected memory element 10'. Typically, a magnitude of the select voltage $V_S$ for a read operation is lower than a magnitude of the select voltage $V_S$ for a write operation. By using a lower magnitude for the select voltage during read operations, read disturbs that can overwrite or corrupt the stored data in the selected memory element 10' are substantially reduced or eliminated. Hereinafter, the select voltage $V_S$ used for a read operation will be denoted as a read voltage $V_R$ and the select voltage $V_S$ used for a write operation will be denoted as a write voltage $V_W$. Accordingly, for a read operation, the read voltage $V_R$ is applied across the selected first and second conductive traces 1' and 2'

The read voltage $V_R$ can be supplied by a single voltage source coupled with the selected first and second conductive traces 1' and 2' as depicted in FIG. 3 or the read voltage $V_R$ can be supplied by multiple voltage sources with one voltage source electrically coupled with the selected first conductive trace 1' and a second voltage source electrically coupled with the selected second conductive trace 2'. On the other hand, the read voltage $V_R$ can be applied to only one of the selected conductive traces and the other selected conductive trace can be at approximately a ground potential. For example, the read voltage $V_R$ can be applied to the selected second conductive trace 2' and the selected first conductive trace 1' can be at approximately a ground potential, or vice-versa.

FIG. 3 also depicts a memory plug 300 that includes the memory element 10' and any other materials that may be necessary to form an operable memory device. For example, the memory plug 300 includes a portion of the first and second conductive traces 1' and 2' that cross the memory element 10'. Although a selected memory element 10' is depicted, the concept of the memory plug 300 also applies to unselected and half-selected memory elements 10 as well. For example, memory plug 300 is adjacent to the selected memory element 10' and its memory element 10 is a half-selected memory element because the read voltage $V_R$ is electrically coupled only to the selected second conductive trace 2' and the first conductive trace 1 is electrically coupled with a non-select voltage $V_N$.

Read Current

The selected memory element 10' is electrically in series with the selected traces 1' and 2'. Consequently, the read voltage $V_R$ causes a read current $I_R$ to flow through the selected memory element 10'. The magnitude of the read current $I_R$ will depend on the magnitude of the read voltage $V_R$ and a resistive state $R_S$ of the selected memory element 10', such that $I_R \approx V_R \div R_S$. For a given read voltage $V_R$, the read current $I_R$ will be lower when $R_S \approx R_0$ (e.g., high resistance) and $I_R$ will be higher when $R_S = R_1$ (e.g., low resistance). The direction of flow for the read current $I_R$ will depend on a polarity of the read voltage $V_R$. The read voltage $V_R$ need not be a constant voltage and $V_R$ may be applied as a pulse. Preferably, $V_R$ is applied as a voltage pulse (e.g., a positive and/or negative pulse) One advantage to using a voltage pulse is that voltage pulses can have varying waveform shapes. Examples of waveform shapes include but are not limited to square waves, triangle waves, sine waves, and complex waveforms. A potential difference for the read voltage $V_R$ can be provided by separate voltage sources coupled with the selected conductive traces 1' and 2' such that $V_R = (V_{R1'} - V_{R2'})$, where $V_{R1'}$ is a first read voltage applied to the selected first conductive trace 1' and $V_{R2'}$ is a second read voltage applied to the selected second conductive trace 2'.

Half-Select Current

During a read or write operation, it is preferable that unselected traces 1 and 2 not be allowed to float. Floating traces can result in voltages that disturb the resistive state in unselected memory elements 10. Accordingly, in FIG. 3, an unselected memory element 10 has the non-select voltage $V_N$ applied to its unselected first conductive trace 1. As mentioned above, the unselected memory element 10 is referred to as a half-selected memory element because it has one of its conductive traces 2' connected with the read voltage $V_R$ and one of its conductive traces 1 connected with the non-select voltage $V_N$ resulting in a potential difference across the half-selected memory element 10. Consequently, during the read operation, a half-select current $I_H$ flows through the half-selected memory element 10 due to the potential difference across conductive traces 1 and 2'. As a first example, if the non-select voltage $V_N$ is applied to the un-selected first conductive trace 1 and the read voltage $V_{R2'}$ is applied to the selected second conductive trace 2', then the potential difference is $(V_{R2'} - V_N)$ and a magnitude of the half-select current is $I_H = (V_{R2'} - V_N) \div R_S$. As a second example, if the non-select voltage $V_N$ is applied to the un-selected second conductive trace 2 and read voltage $V_{R1'}$ is applied to the selected first conductive trace 1', then the potential difference is $(V_{R1'} - V_N)$ and a magnitude of the half-select current is $I_H \approx (V_{R1'} - V_N) \div R_S$. As was described above, the resistive state $R_S$ may not be a linear function of the voltage applied across the memory elements 10 such that $R_S \approx f(V_{R2'} - V_N)$ for the first example and $R_S \approx f(V_{R1'} - V_N)$ for the second example. In either case, a direction of current flow for the half-select current $I_H$ will depend on a polarity of the read voltage $V_R$ and a polarity of the non-select voltage $V_N$. The magnitude and polarity of the non-select voltage $V_N$ will be application dependent and can depend on several factors including but not limited to the magnitude and polarities of the read and write voltages applied across the selected traces (1', 2').

Write Operations

Figure 4:
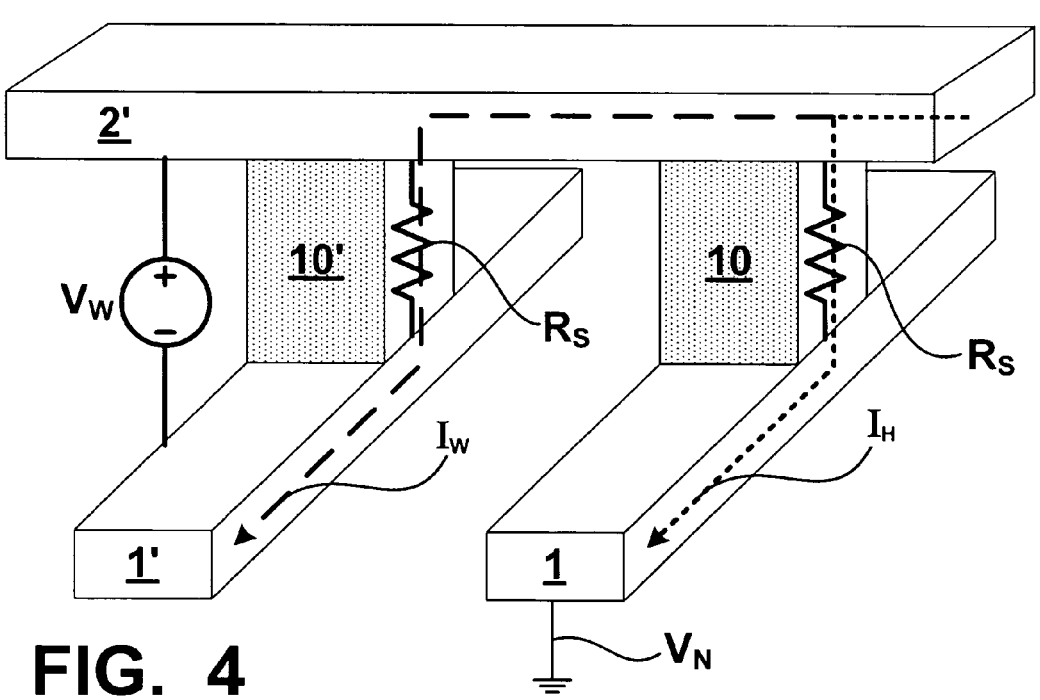
FIG. 4 is a perspective view depicting a selected memory element and a half-selected memory element during a write operation.

A write operation to the selected memory element 10' in the array 100 is effectuated by applying a select voltage $V_S$ having an appropriate write voltage magnitude and polarity across the selected first and second conductive traces 1' and 2'. In FIG. 4, a portion of the array 100 is depicted during a write operation to the selected memory element 10'. The write voltage is denoted as $V_W$ and is applied across the selected traces 1' and 2' during the write operation. The write voltage $V_W$ can be applied as a voltage pulse. Preferably, the write voltage $V_W$ is applied as a bipolar voltage pulse. One example of a bipolar voltage pulse includes applying a positive voltage pulse to one of the selected conductive traces and applying a negative voltage pulse to the other of the selected conductive traces. The voltage pulses (positive and/or negative) can have varying waveform shapes. Examples of waveform shapes include but are not limited to square waves, triangle waves, sine waves, and complex waveforms.

The resistive state $R_S$ of the selected memory element 10' can be changed by applying the appropriate write voltage $V_W$ to the selected traces 1' and 2'. As one example, if the memory elements 10 are initially in the first resistive state $R_0$ (e.g., high resistance) indicative of a logic "0", then to overwrite the logic "0" with a logic "1", a negative write voltage is applied to the selected second conductive trace 2' and a positive write voltage is applied to the selected first conductive trace 1'. As a result, the selected memory element 10' is overwritten and the first resistive state $R_0$ is replaced by the second resistive state $R_1$ (e.g., low resistance). As another example, to overwrite the state $R_1$, a positive write voltage is applied to the selected second conductive trace 2' and a negative write voltage is applied to the selected first conductive trace 1'. Consequently, the memory element 10' is overwritten and the state $R_1$ is replaced by the state $R_0$.

A write current $I_W$ flows through the selected memory element 10' during the write operation. A magnitude of the write current $I_W$ will depend on the resistive state $R_S$ (e.g., $R_0$ or $R_1$) of the selected memory element 10' and a magnitude of the write voltage $V_W$, such that $I_W \approx V_W \div R_S$. A direction of current flow for the write current $I_W$ will depend on a polarity of the write voltage $V_W$. During the write operation, a half-select current flows through half-selected memory elements 10 as is depicted by a half-select current $I_H$ flowing through adjacent memory element 10 in FIG. 4. The memory element 10 is half-selected because the write voltage $V_W$ is applied to the selected second conductive trace 2' and the non-select voltage $V_N$ is applied to the un-selected first conductive trace 1. Typically, the magnitude of the write voltage $V_W$ is higher than the magnitude of the read voltage $V_R$. Consequently, the magnitude of the half-select current $I_H$ can be higher during write operations. A direction of current flow for the half-select current $I_H$ will depend on a polarity of the write voltage $V_W$ and a polarity of the non-select voltage $V_N$. A potential difference for the write voltage $V_W$ can be supplied by separate voltage sources coupled with each of the selected conductive traces 1' and 2' such that $V_W = (V_{W1'} - V_{W2'})$, where $V_{W1'}$ is a first write voltage applied to the selected first conductive trace and $V_{W2'}$ is a second write voltage applied to the selected second conductive trace. Therefore, if the non-select voltage $V_N$ is applied to the un-selected first conductive trace 1 and the write voltage $V_{W2'}$ is applied to the selected second conductive trace 2', then the potential difference across half-selected memory elements 10 is $(V_{W2'} - V_N)$. Conversely, if the non-select voltage $V_N$ is applied to the un-selected second conductive trace 2 and the write voltage $V_{W1'}$ is applied to the selected first conductive trace 1', then the potential difference across half-selected memory elements 10 is $(V_{W1'} - V_N)$. A magnitude of the half-select current $I_H$ will depend on the resistive state $R_S$ of the half-selected memory element 10 and a magnitude of the potential difference $(V_W - V_N)$ across traces (1, 2'), such that $I_H \approx (V_W - V_N) \div R_S$.

One-Cycle Pre-Read Operation

During a read operation, the read current $I_R$ flows through the selected memory element 10' and the half-select current $I_H$ flows through the half-selected memory elements 10. In a memory device suitable for high-density data storage, the selected memory element 10' will be greatly outnumbered by the half-selected memory elements 10 because in a large array 100 there can be several thousand or more half-selected memory element 10 in the same row and column as the selected memory element 10'. On an individual basis, each half-select current $I_H$ will typically be lower in magnitude than the read current $I_R$. However, a combined magnitude of the half-select currents $I_H$ for all of the half-selected memory elements 10 can exceed that of the read current $I_R$. Therefore, in order to accurately read the value of stored data in the selected memory element 10', it is necessary to separate a signal representing the read current $I_R$ from a signal representing the total half-select currents $I_H$.

Referring back to FIG. 2A, the first conductive traces 1 are arranged in rows labeled r0, r1, r2, and r3 and the second conductive traces 2 are arranged in columns labeled c0, c1, c2, and c3. In the array 100, there are sixteen memory elements 10 labeled m0 through m15. The $0^{th}$ memory element 10 is positioned in an upper left-hand corner of the array 100 (i.e., m0 is at r0, c0) and the $15^{th}$ memory element 10 is positioned in a lower right-hand corner of the array 100 (i.e., m15 is at r3, c3). One skilled in the art will appreciate that the array 100 may be smaller or larger than the four-by-four array 100 depicted in FIG. 2A. Moreover, the array 100 may be symmetrical with an equal number of rows and columns or the array 100 may be non-symmetrical with an unequal number of rows and columns.

Figure 2C:
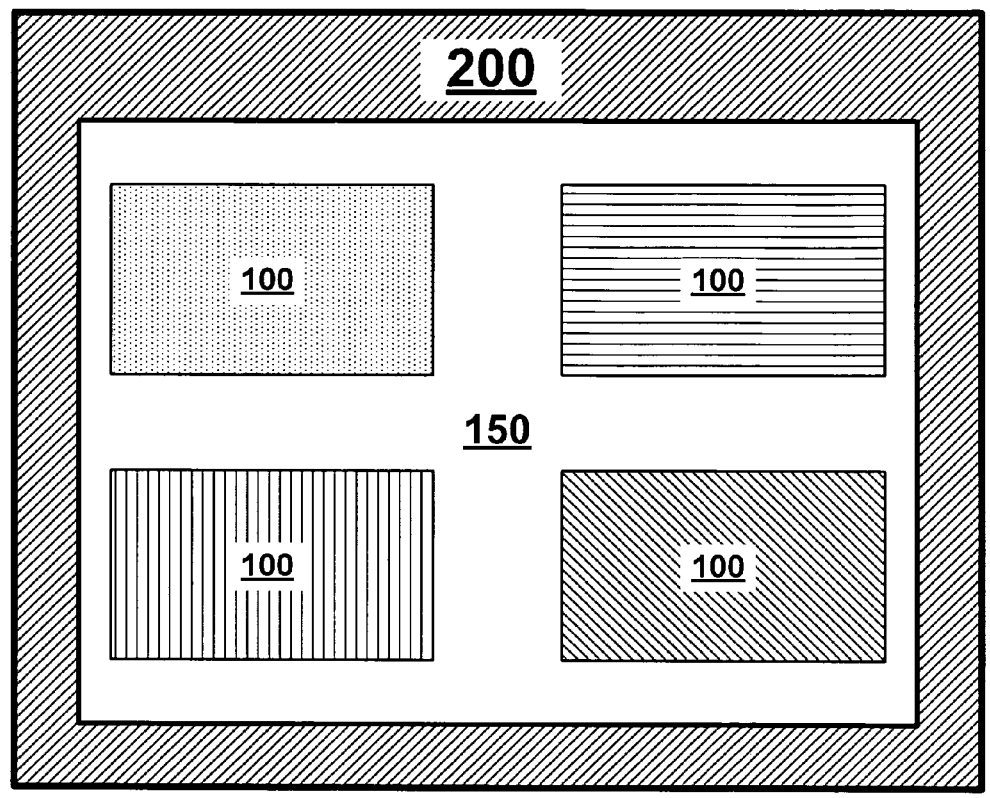
FIG. 2C is a block diagram depicting an exemplary apparatus for sensing current in a two-terminal memory array that includes bit-block arrays laid out next to one another and positioned above a substrate including circuitry.
Figure 2D:
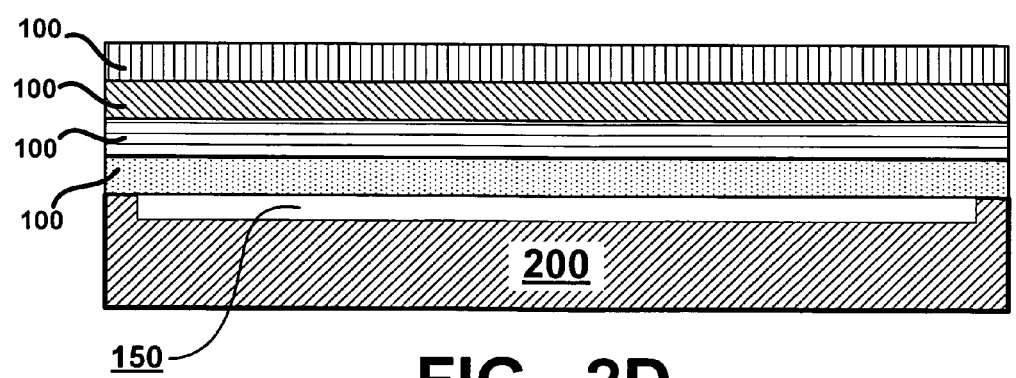
FIG. 2D is a cross-sectional view depicting another exemplary apparatus for sensing current in a two-terminal memory array that includes stacked bit-block arrays positioned above a substrate including circuitry.

Furthermore, it should be appreciated that this technique will typically generate data from only one memory cell. Accordingly, multiple bit block arrays are typically used in a multi-bit memory. Bit blocks arrays are typically electrically isolated from each other and are only capable of selecting a single memory cell at a time. The term bit block array describes both memories that store a single bit of data and multiple bits of data in a single memory cell (e.g., a memory cell that can store two bits of data as 00, 01, 10, and 11). The bit block arrays may be laid out next to each other in a single-layer cross-point array fabricated over a substrate in which the circuitry portions of the apparatus 150 (e.g., address unit 101, sense unit 103, and control unit 105) are fabricated, or may be stacked one upon another over a substrate in which the circuitry portions of the apparatus 150 are fabricated in a stacked cross-point memory, or some combination of both techniques. Reference is now made to FIGS. 2C and 2D where a substrate 200 includes the apparatus 150 fabricated in the substrate 200 and a plurality of bit block arrays 100. In FIG. 2C, the bit block arrays 100 are fabricated over the substrate 200 and are laid out next to one another and each array 100 is electrically coupled with the apparatus 150 by an interconnect structure (not shown). In FIG. 2D, the bit block arrays 100 are fabricated above the substrate 200, are stacked upon one another, and are electrically coupled with the apparatus 150 by an interconnect structure (not shown). In either case, the apparatus 150 and any other circuitry are fabricated in the substrate 200.

Figure 5:
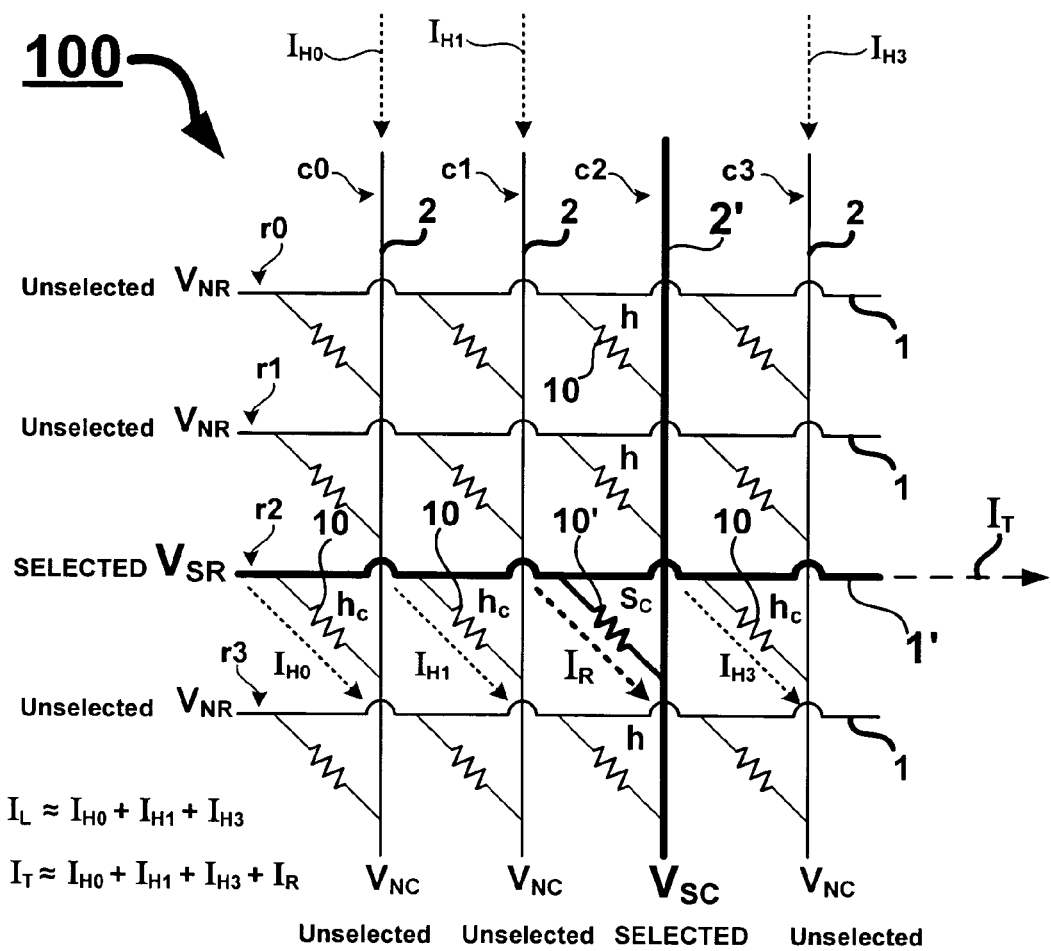
FIG. 5 is a schematic view depicting one embodiment of sensing current in a two-terminal memory array during a read operation.

Turning now to FIG. 5, based on the address ADDR received by the address unit 101, the $10^{th}$ memory element 10' (i.e., m10 at r2, c2) is selected for a read operation. Accordingly, a select voltage $V_{SR}$ is applied to the first conductive trace 1' in row r2 and a select voltage $V_{SC}$ is applied to the second conductive trace 2' in column c2. For purposes of explanation, $V_{SR}$ denotes a select voltage applied to a selected first conductive trace 1' in a row and $V_{SC}$ denotes a select voltage applied to a selected second conductive trace 2' in a column. Additionally, a non-select voltage $V_{NR}$ is applied to the remaining first conductive traces 1 in rows r0, r1, and r3. Similarly, a non-select voltage $V_{NC}$ is applied to the remaining second conductive traces 2 in columns c0, c1, and c3. Therefore, $V_{NR}$ denotes a non-select voltage applied to unselected first conductive traces 1 in the rows and $V_{NC}$ denotes a non-select voltage applied to unselected second conductive traces 2 in the columns.

As was described above, the application of the select voltages $V_{SR}$ and $V_{SC}$ across the first and second conductive traces 1' and 2' causes the read current $I_R$ to flow through the selected memory element 10' (denoted by a heavy dashed arrow for $I_R$). In FIG. 5, the select voltage $V_{SR}$ is more positive than the select voltage $V_{SC}$ so that the read current $I_R$ flows in a direction depicted by the heavy dashed arrow through the selected memory element 10' (denoted as $S_C$). Accordingly, the read current $I_R$ flows from the selected first conductive trace 1' to the selected second conductive trace 2'. In the same row r2 as the selected memory element 10', there are also three half-selected memory elements 10 (denoted as $h_C$). The aforementioned half-select current $I_H$ flows through each of the half-selected memory elements 10 as denoted by dashed arrows $I_{H0}$, $I_{H1}$, and $I_{H3}$. The half-select current $I_H$ flows from the selected first conductive trace 1' to the unselected second conductive traces 2 because the unselected second conductive traces 2 are at a lower voltage potential than the selected first conductive trace 1'.

Therefore, a total current $I_T$ flowing through the selected first conductive trace 1' in row r2 is approximately: $I_T \approx I_{H0} + I_{H1} + I_{H3} + I_R$, where the half-select currents $I_{H0}$, $I_{H1}$, and $I_{H3}$ represent leakage currents. A total leakage current $I_L$ flowing from the selected first conductive trace 1' to the unselected second conductive traces 2 in columns (c0, c1, c3) is approximately: $I_L \approx I_{H0} + I_{H1} + I_{H3}$. The half-select currents $I_{H0}$, $I_{H1}$, and $I_{H3}$ can be sensed through the unselected second conductive traces 2 in columns (c0, c1, c3) because the memory elements 10 above and below the half-selected $h_C$ memory elements 10 in columns (c0, c1, c3) have the non-select voltages $V_{NR}$ and $V_{NC}$ applied across their respective terminals 11 and 12 so that the potential difference across those terminals is approximately 0 volts, assuming $V_{NR}$ and $V_{NC}$ are approximately equal to each other (i.e., $V_{NR} \approx V_{NC}$). Therefore, little or no current flows through those memory elements 10 and the current entering the unselected second conductive traces 2 is approximately the half-select currents $I_{H0}$, $I_{H1}$, and $I_{H3}$.

Both the total current $I_T$ and the leakage current $I_L$ represent signals that can be processed to derive another signal that is indicative of a value of stored data in the selected memory cell 10'. Accordingly, the sense unit 103 senses the total current $I_T$ flowing in the selected first conductive trace 1' and senses the leakage current $I_L$ flowing in the unselected second conductive traces 2 and output those currents as signals (see FIG. 1) that are processed along with other signals (to be described below) to derive the value of stored data in the selected memory cell 10'.

Figure 7:
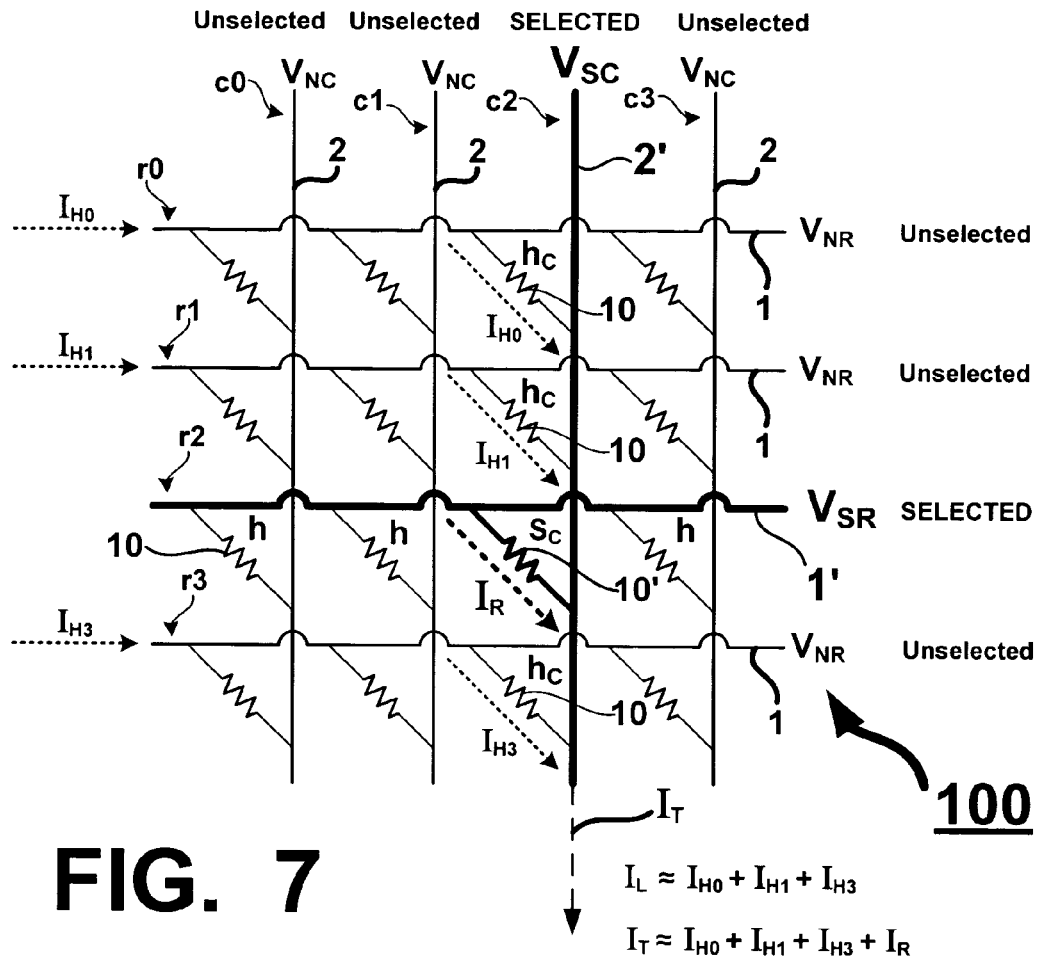
FIG. 7 is a schematic view depicting an alternative embodiment of sensing current in a two-terminal memory array during a read operation.

Since the row and column orientation is arbitrary, one skilled in the art will appreciate that the total current $I_T$ can be sensed flowing through the selected second conductive trace 2' and the leakage current $I_L$ can be sensed flowing through unselected first conductive traces 1. Accordingly, FIG. 7 depicts an alternative embodiment for sensing the total current $I_T$ and the leakage current $I_L$, where the address unit 101 selects the same memory element 10' (i.e., m10 at r2, c2) for a read operation, the appropriate select voltages $V_{SR}$ and $V_{SC}$ are applied to the selected first and second conductive traces 1' and 2', and the appropriate non-select voltages $V_{NR}$ and $V_{NC}$ are applied to unselected conductive traces 1 and 2. However, the sense unit 103 senses the total current $I_T$ flowing through the selected second conductive trace 2' and senses the leakage current $I_L$ flowing through the unselected first conductive traces 1. Therefore, the total current $I_T$ flowing through the selected second conductive trace 2' in column c2 is approximately: $I_T \approx I_{H0} + I_{H1} + I_{H3} + I_R$. The total leakage current $I_L$ flowing from the unselected first conductive traces 1 in rows r0, r1, and r3 and into the selected second conductive trace 2' is approximately: $I_L \approx I_{H0} + I_{H1} + I_{H3}$. The embodiment depicted in FIG. 7 assumes that the select voltage $V_{SR}$ is more positive than the select voltage $V_{SC}$ so that the read current $I_R$ and the half-select currents $I_{H0}$, $I_{H1}$, and $I_{H3}$ flow in the direction indicated by their respective dashed arrows.

Therefore, pre-reading can be an apparatus and/or a method for sensing a signal indicative of stored data in a selected memory element 10' by distinguishing the signal represented by the read current $I_R$ from a noise signal represented by the leakage current $I_L$. In the context of a read operation where the signal to noise ratio between the read current $I_R$ and the leakage current $I_L$ is low (i.e., $I_L >> I_R$), it is desirable for the pre-read operation to be an integral part of a read operation to the array 100 so that an accurate sensing of the read current $I_R$ can be used to accurately determine the value of the stored data.

In the context of a write operation, it is not necessary to separate the read current $I_R$ from the leakage current $I_L$ in order to accurately determine the value of the stored data. However, the optional use of the pre-read operation during a write operation may be desirable and can have several advantages, particularly when the stored data and the data to be written are approximately identical to each other (e.g., overwriting redundant data). The advantages in a redundant data scenario include but are not limited to preventing the overwriting of redundant data, reducing write operation latency by aborting the write operation when the data is redundant, and reducing memory element 10 wear out and stress by preventing unnecessary write operations to selected memory elements 10'.

Read Operation Select Voltages

Figure 6A:
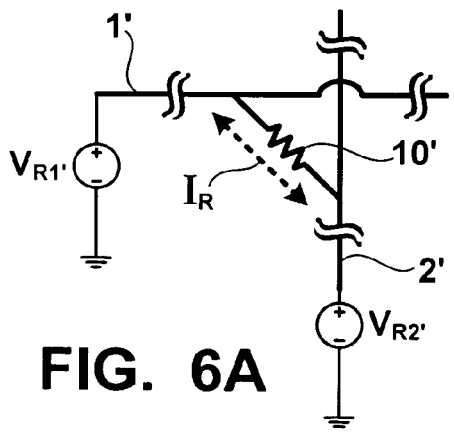
FIGS. 6A and 6B are schematic views depicting examples of select voltages applied across selected first and second conductive traces during a read operation.
Figure 6B:
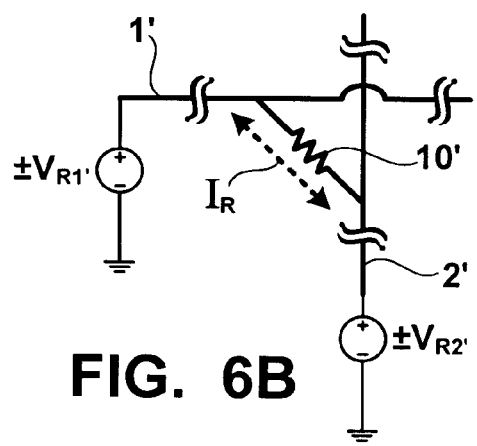

The select voltages $V_{SR}$ and $V_{SC}$ can be generated in a variety of ways. As one example, $V_{SR}$ can be a positive or negative voltage and $V_{SC}$ can be approximately at a ground potential. On the other hand, $V_{SC}$ can be a positive or negative voltage and $V_{SR}$ can be approximately at a ground potential. As another example, both $V_{SR}$ and $V_{SC}$ can be either positive or negative voltages with one of the voltages more positive or more negative than the other. Preferably, the select voltage for a read operation comprises the first read voltage $V_{R1'}$ applied to the selected first conductive trace 1' and the second read voltage $V_{R2'}$ applied to the selected second conductive trace 2'. It is preferable, but not necessary, that the first read voltage $V_{R1'}$ is approximately equal in magnitude and opposite in polarity to second read voltage $V_{R2'}$. In FIG. 6A, the first and second read voltages $V_{R1'}$ and $V_{R2'}$ are applied to the selected first and second conductive traces 1' and 2' respectively, so that the read current $I_R$ will flow in a direction determined by the relative magnitudes and polarities of the first and second read voltages $V_{R1'}$ and $V_{R2'}$. In FIG. 6B, the first read voltage $V_{R1'}$ can have a positive polarity and the second read voltage $V_{R2'}$ can have a negative polarity, or vice-versa. The positive and negative polarities can be referenced to ground, for example.

Moreover, the first and second read voltages $V_{R1'}$ and $V_{R2'}$ can be applied as voltage pulses as was describe above.

Non-Select Voltages

Preferably, the non-select voltages $V_{NR}$ and $V_{NC}$ are equal to each other so that no current flows through memory elements 10 that have the non-select voltages $V_{NR}$ and $V_{NC}$ applied across their respective first and second conductive traces 1 and 2. The non-select voltages $V_{NR}$ and $V_{NC}$ can be generated by the same voltage source or by different voltage sources. As an example, for a very large array 100, the non-select voltages $V_{NR}$ and $V_{NC}$ can be generated by separate voltage sources. If separate voltage sources are used, then it is desirable for the voltages supplied be equal voltages (e.g., $V_{NR} = V_{NC}$) to eliminate half-select current flow through unselected memory elements 10. The non-select voltages $V_{NR}$ and $V_{NC}$ can be the same for read and write operations. Preferably, the voltage potentials for the non-select voltages $V_{NR}$ and $V_{NC}$ are approximately half-way between the select voltages $V_{SR}$ and $V_{SC}$ for read and write operations, such that $V_{NR} = V_{NC} = \frac{1}{2}(|V_{SR}| - |V_{SC}|)$. Alternatively, $V_{NR} = V_{NC} = \frac{1}{2}(|V_{SC}| - |V_{SR}|)$. The non-select voltages $V_{NR}$ and $V_{NC}$ can be positive or negative voltage potentials. As one example, for a read operation, the non-select voltages are $V_{NR} = V_{NC} = \frac{1}{2}(|V_{R1'}| - |V_{R2'}|)$. As a second example, for a write operation, the non-select voltages are $V_{NR} = V_{NC} = \frac{1}{2}(|V_{W1'}| - |V_{W2'}|)$. TABLE 1 and TABLE 2 below list examples of the non-select voltages $V_{NR}$ and $V_{NC}$ for read and write operations respectively, where $V_{NR} = V_{NC} = \frac{1}{2}(|V_{SR}| - |V_{SC}|)$. The read and write voltages can be uni-polar or bi-polar. Furthermore, the read and write voltages can be applied as voltage pulses.

TABLE 1

| $V_{R1'}$ | $V_{R2'}$ | $V_{NR}$ | $V_{NC}$ |
|---|---|---|---|
| +2 V | −2 V | 0 V | 0 V |
| −2 V | +2 V | 0 V | 0 V |
| +4 V | 0 V | 2 V | 2 V |
| 0 V | −4 V | −2 V | −2 V |
| +1 V | −3 V | −1 V | −1 V |
| +2 V | −1 V | +0.5 V | +0.5 V |

TABLE 2

| $V_{W1'}$ | $V_{W2'}$ | $V_{NR}$ | $V_{NC}$ |
|---|---|---|---|
| +3 V | −3 V | 0 V | 0 V |
| −3 V | +3 V | 0 V | 0 V |
| +6 V | 0 V | 3 V | 3 V |
| 0 V | −6 V | −3 V | −3 V |
| +4 V | −3 V | +0.5 V | +0.5 V |
| +2 V | −4 V | −1.0 V | −1.0 V |

One skilled in the art will appreciate that the non-select voltages $V_{NR}$ and $V_{NC}$ may not be exactly equal to each other due to process variations, voltage drops due to variations in the as-routed length of interconnect structures, just to name a few. As a result, when $V_{NR}$ and $V_{NC}$ are not exactly equal to each other, (e.g., $V_{NR} \approx V_{NC}$) there will be some current flow through unselected memory elements 10.

Write Operation Select Voltages

Figure 8A:
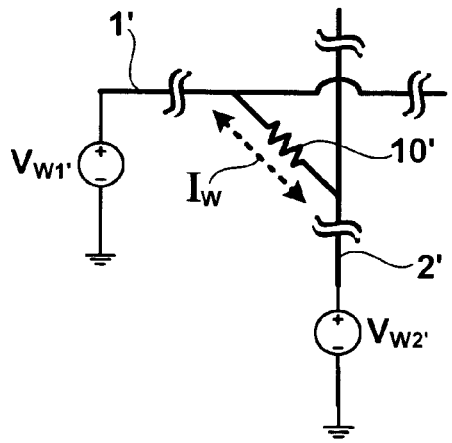
FIGS. 8A and 8B are schematic views depicting examples of select voltages applied across selected first and second conductive traces during a write operation.
Figure 8B:
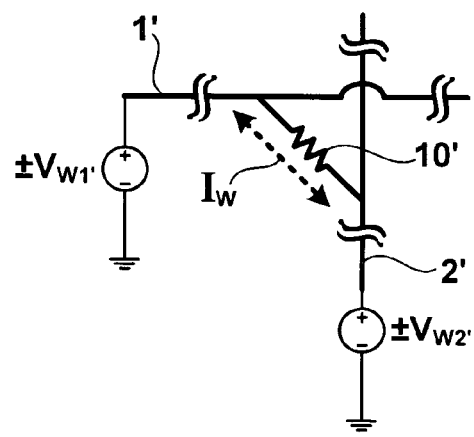

As was described above, the appropriate select voltages can be applied to the selected first and second conductive traces 1' and 2' during a read or a write operation. The select voltages $V_{SR}$ and $V_{SC}$ used for write operations can be generated in a variety of ways. As one example, $V_{SR}$ can be a positive or negative voltage and $V_{SC'}$ can be approximately at a ground potential, or $V_{SC'}$ can be a positive or negative voltage and $V_{SR'}$ can be approximately at a ground potential. As another example, both $V_{SR'}$ and $V_{SC'}$ can be either positive or negative voltages with one of the voltages more positive or more negative than the other. Preferably, the select voltage for the write operation comprises the first write voltage $V_{W1'}$ applied to the selected first conductive trace 1' and the second write voltage $V_{W2'}$ applied to the selected second conductive trace 2'. It is preferable, but not necessary, that the first write and second write voltages $V_{W1'}$ and $V_{W2'}$ be approximately equal in magnitude but opposite in polarity to each other. In FIG. 8A, the first and second write voltages $V_{W1'}$, and $V_{W2'}$ are applied to the selected first and second conductive traces 1' and 2' respectively, and a direction of write current $I_W$ flow will depend on the relative magnitudes and polarities of the first and second write voltages $V_{W1'}$, and $V_{W2'}$. In FIG. 8B, the first write voltage $V_{W1'}$ can have a positive polarity and the second write voltage $V_{W2'}$ can have a negative polarity, or vice-versa. Moreover, the first and second write voltages $V_{W1'}$, and $V_{W2'}$ can be applied as voltage pulses. The positive and negative polarities can be referenced to ground, for example. As was described above, select voltages for write operations are typically greater in magnitude than the select voltages for a read operation. Typically, this means $|V_W| > |V_R|$ such that the relationship between the voltages is: $|V_{W1'}| > |V_{R1'}|$; $|V_{W1'}| > |V_{R2'}|$; $|V_{W2'}| > |V_{R2'}|$; and $|V_{W2'}| > |V_{R1'}|$.

Memory Elements and Memory Plugs

Figure 9A:
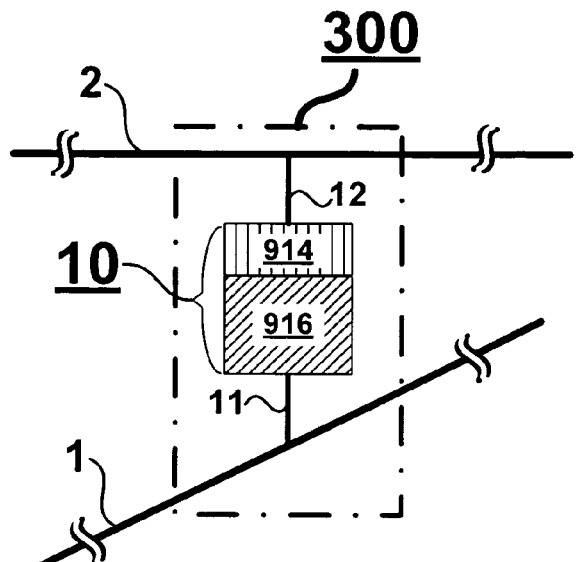
FIG. 9A is a schematic view depicting one embodiment of a memory plug.

In FIG. 9A, the memory element 10 includes a thin layer of an electronic insulator material 914 in series with a conductive metal oxide material 916, a first terminal 11 in communication with the first conductive trace 1, and a second terminal 12 in communication with the second conductive trace 2. Although the thickness of the electronic insulator material 914 will be application dependent, typically the thickness is approximately 50 Å or less. Preferably, the thickness of the electronic insulator material 914 is approximately 25 Å or less. A material for the conductive metal oxide 916 includes but is not limited to a manganite, such as a perovskite, for example. Examples of perovskites include but are not limited to praseodymium-calcium-manganese-oxygen (PCMO) and lanthanum-nickel-oxygen (LNO). Suitable materials for the electronic insulator material 914 include but are not limited to yttria stabilized zirconia (YSZ) and hafnium oxide ($HfO_X$), for example.

The memory element 10 is electrically in series with the first and second terminals 11 and 12. The configuration depicted in FIG. 9A also applies to selected memory elements 10'. Accordingly in FIG. 9B, each memory element 10 is electrically in series with the first and second terminals (11, 12) and is electrically in series with the first and second conductive traces (1, 2). As depicted in FIG. 9B, the terminals 11 and 12 can be electrodes made from an electrically conductive material including but not limited to platinum (Pt), gold (Au), silver (Ag), iridium (Ir), ruthenium (Ru), palladium (Pd), and aluminum (Al), for example.

FIGS. 9A and 9B also depict the memory plug 300. The memory plug 300 includes the memory element 10 and any other materials that may be necessary to form an operable memory device. For example, the memory plug 300 includes the first and second terminals 11 and 12 that electrically couple the memory element 10 in series with the first and second conductive traces 1 and 2 and a portion of the first and second conductive traces 1 and 2 that cross the memory element 10. In FIG. 9B, the first and second terminals 11 and 12 comprise electrodes as was described above. One skilled in the art will appreciate that other layers of materials may be included in the memory plug 300. For example, those layers can include but are not limited to adhesion layers, glue layers, diffusion barriers, and seed layers.

One method of creating memory elements 10 that store data as a plurality of distinct resistive states is described in "Memory Using Mixed Valence Conductive Oxides," U.S. application Ser. No. 11/095,026, filed Mar. 30, 2005, which is incorporated herein by reference in its entirety and for all purposes. The application describes a two terminal memory element that changes conductivity when exposed to an appropriate voltage drop across the two terminals. The memory element includes an electrolytic tunnel barrier and a mixed valence conductive oxide. A voltage drop across the electrolytic tunnel barrier causes an electrical field within the mixed valence conductive oxide that is strong enough to move oxygen ions out of the mixed valence conductive oxide and into the electrolytic tunnel barrier. When certain mixed valence conductive oxides (e.g., praseodymium-calcium-manganese-oxygen perovskites—PCMO and lanthanum-nickel-oxygen perovskites—LNO) change valence, their conductivity changes. Additionally, oxygen accumulation in certain electrolytic tunnel barriers (e.g., yttrium stabilized zirconia—YSZ) can also change conductivity. If a portion of the mixed valence conductive oxide near the electrolytic tunnel barrier becomes less conductive, the tunnel barrier width effectively increases. If the electrolytic tunnel barrier becomes less conductive, the tunnel barrier height effectively increases. Both mechanisms are reversible if the excess oxygen from the electrolytic tunnel barrier flows back into the mixed valence conductive oxide. A memory can be designed to exploit tunnel barrier height modification, tunnel barrier width modification, or both. One skilled in the art will recognize that some aspects of the present invention are not limited to a particular choice of memory elements.

Figure 9C:
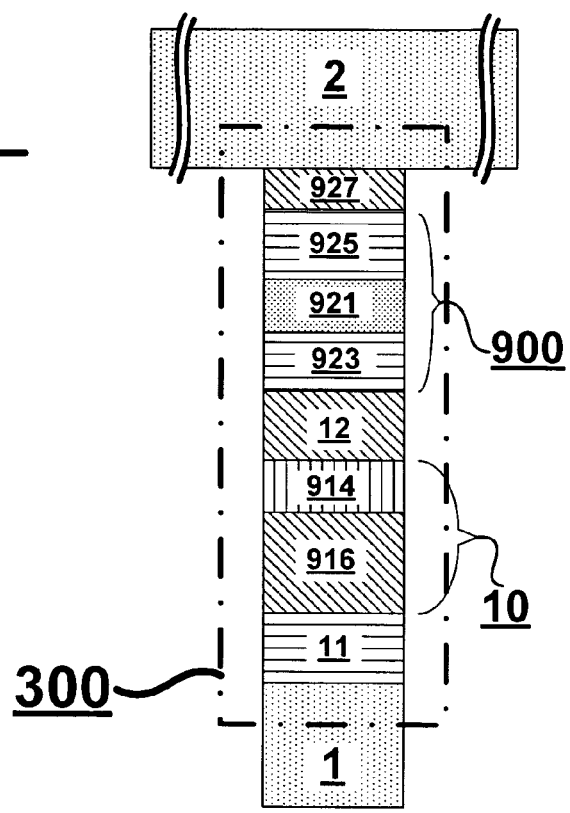
FIG. 9C is a cross-sectional view depicting an exemplary memory plug.
Figure 9B:
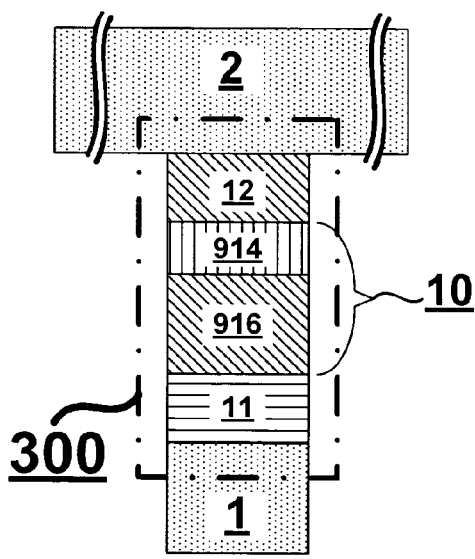
FIG. 9B is a cross-sectional view of the memory plug depicted in FIG. 9A.

In FIG. 9C, an exemplary memory plug 300 would preferably include a non-ohmic device 900 coupled with the memory element 10, as is described in issued U.S. Pat. No. 6,917,539, which is incorporated herein by reference in its entirety and for all purposes. The memory plug 300 includes a plurality of separate thin film layers that are sandwiched between the first and second conductive traces 1 and 2. Those layers are the second terminal 12, the electronic insulator material 914, the conductive metal oxide material 916, the first terminal 11, a plurality of layers that make up a metal-insulator-metal (MIM) structure 923, 921, and 925 (providing the non-ohmic device 900), and an optional electrode 927. In the MIM structure, one of the plurality of layers is an insulator layer 921 (e.g., a dielectric material). The layers 11, 12, and 927 are only necessary to the extent fabrication methods require them. Therefore, the layers 11, 12, and 927 would ideally be as thin as possible while still preventing metal inter-diffusion and if necessary, being useful as a seed layer.

Figure 9D:
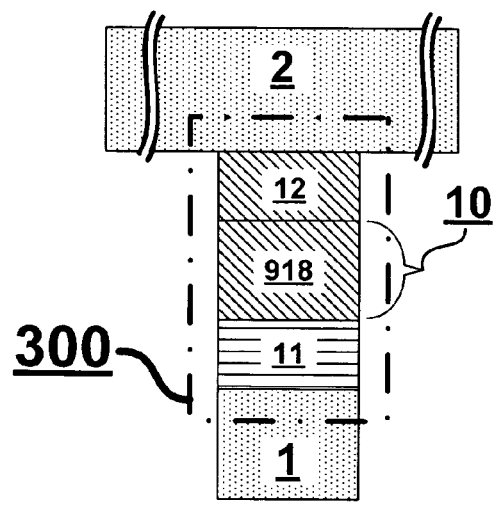
FIG. 9D is as cross-sectional view depicting an alternative embodiment of a memory plug.

In FIG. 9D, in an alternative embodiment of the memory plug 300 the memory element 10 includes the conductive metal oxide material 916 electrically in series with the first and second terminals (11, 12) and electrically in series with the first and second conductive traces (1, 2). Unlike the memory element 10 depicted in FIG. 9B, the memory element 10 in FIG. 9D does not include the thin layer of the electronic insulator material 914.

In the embodiments depicted in FIGS. 9A through 9D, the first terminal 11, the second terminal 12, or both, can be a portion of the first and second conductive traces 1 and 2 if at least one of the electrodes is not needed to electrically couple the memory element 10 with the first and second conductive traces 1 and 2 in the array 100. Advantages to eliminating one or both of the terminals (11, 12) and coupling the memory element 10 with the first and second conductive traces (1, 2) include reducing microelectronic processing steps required to fabricate the array 100. Reducing the processing steps can result in an increase in device yield and lower manufacturing costs.

Furthermore, the embodiments depicted in FIGS. 9A through 9D do not need to operate in a silicon substrate, and, therefore, can be fabricated above circuitry fabricated on the silicon substrate and being used for other purposes (e.g., address, decode, and selection circuitry). Optionally, the apparatus 150 can include a stacked cross-point array as described in "Re-writable Memory With Multiple Memory Layers", U.S. Pat. No. 7,095,643, which is incorporated herein by reference in its entirety and for all purposes. The stacked cross-point array consists of multiple cross point arrays 100 stacked upon one another, sometimes sharing first and second conductive traces (1, 2) between layers, and sometimes having electrically isolated and second conductive traces (1, 2) that are not shared between layers. Both single-layer cross-point arrays and stacked cross-point arrays may be arranged as third dimension memories. The apparatus 150 (i.e., sans the single-layer cross-point array or the stacked cross-point arrays) can be fabricated in a silicon substrate and the arrays can be fabricated above the substrate and electrically coupled with the apparatus 150 using an interconnect structure. One skilled in the art will appreciate that the substrate can include other circuitry that interacts with the apparatus 150 or that acts independently of the apparatus 150 (e.g., a μP, a DSP, a memory controller, programmable logic, or application specific logic).

Figure 10:
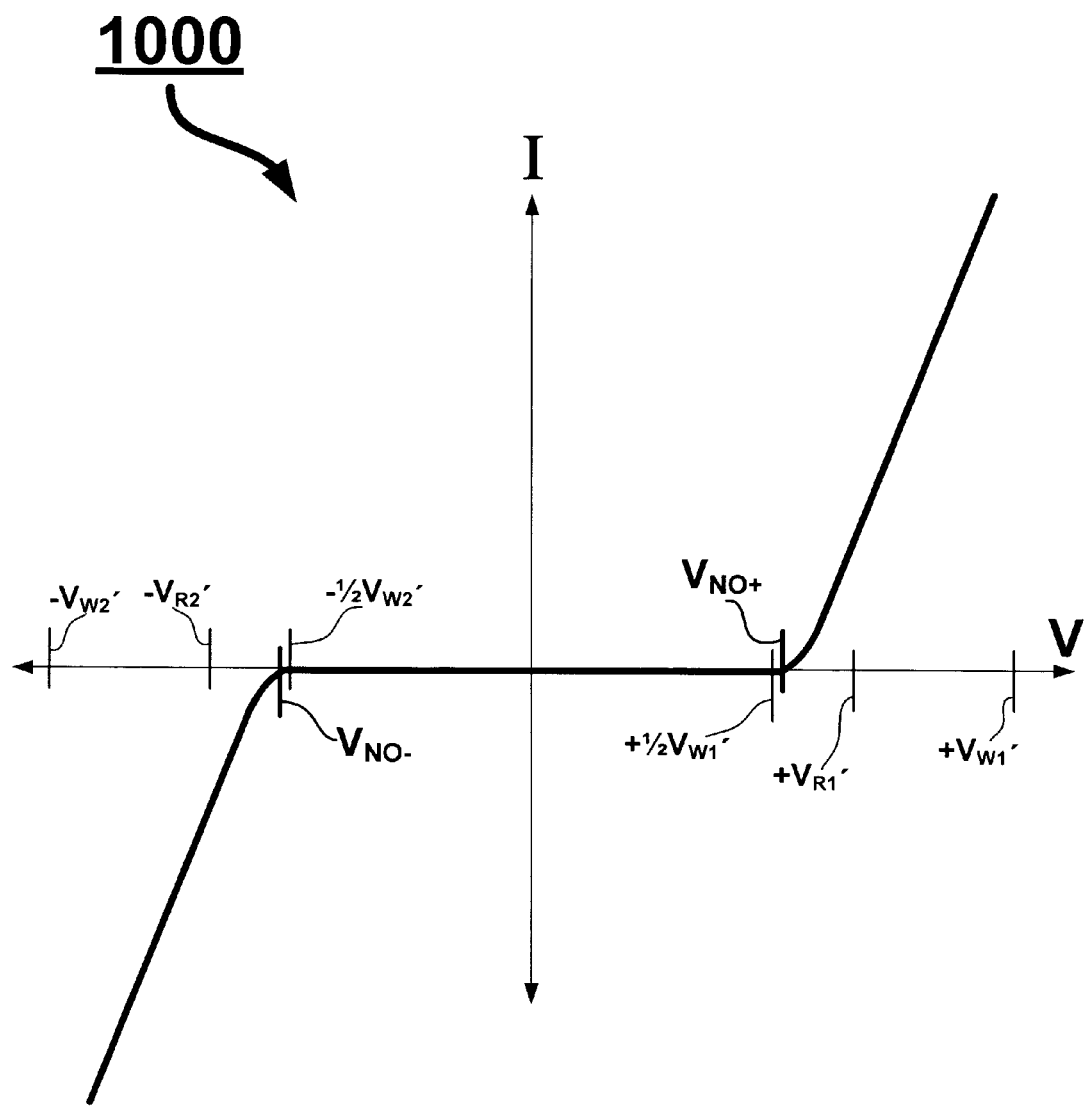
FIG. 10 is a graph depicting an exemplary IV characteristic of a memory plug.

FIG. 10 depicts an exemplary I-V curve 1000 for the non-ohmic device 900. The non-ohmic device 900 imparts a high resistance to the memory plug 300 at low voltages and a low resistance to the memory plug 300 at high voltages. Therefore, leakage current is limited at low voltages and current is able to flow at high voltages. Specifically, a low voltage might be considered to be approximately one-half of a first write voltage $+\frac{1}{2}V_{W1'}$ and approximately one-half a second write voltage $-\frac{1}{2}V_{W2'}$. A high voltage might be the first write voltage $+V_{W1'}$ and the second write voltage $-V_{W2'}$. For purposes of reading stored data from a selected memory element 10' without disturbing or overwriting the stored data, a suitable voltage might be a first read voltage $+V_{R1'}$ and a second read voltage $-V_{R2'}$. Applying approximately one-half of the voltage to the memory plug 300 via the selected first conductive trace 1' and applying approximately one-half of the voltage via the selected second conductive trace 2' can be used to apply a full write voltage to a particular memory element 10' while unselected memory elements 10 are not subject to excessive current. The non-ohmic device 900 exhibits a very high resistance regime for a certain range voltages ($V_{NO-}$ to $V_{NO+}$) and a very low resistance regime for voltages above and below that range.

Generating a Data Signal

Figure 11:
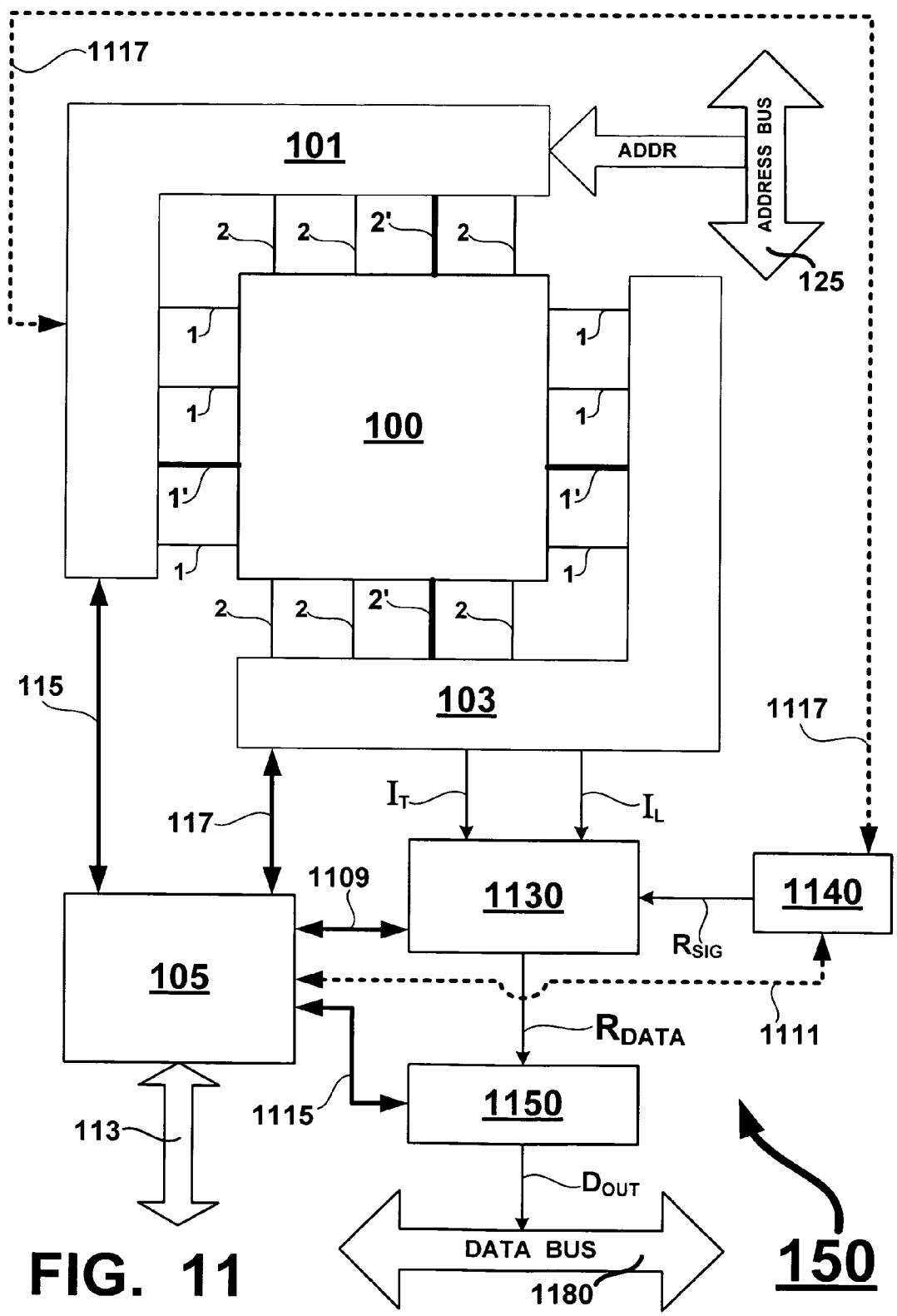
FIG. 11 is a block diagram depicting another embodiment of an apparatus for sensing current in a two-terminal memory array.

In FIG. 11, the total current $I_T$ and leakage current $I_L$ signals from the sense unit 103 may require additional processing in order to accurately derive a signal that is indicative of the stored data in the selected memory element 10'. Therefore, the apparatus 150 includes a data unit 1130 in communication with the sense unit 103. Signals in addition to the total current $I_T$ and the leakage current $I_L$ are electrically coupled with the data unit 1130 in order to derive the signal that is indicative of the stored data. During the read operation, the address unit 101 receives the address ADDR and selects the selected memory element 10' by applying the appropriate read voltage $V_R$ across the selected conductive traces 1' and 2'. In some embodiments using certain memory elements 10, the magnitude of the read voltage $V_R$ is non-destructive to the stored data in the selected memory element 10'. That is, the magnitude of the read voltage $V_R$ is not sufficient to overwrite or corrupt the stored data.

The application of the read voltage $V_R$ causes the total and leakage currents ($I_T$, $I_L$) to flow. The data unit 1130 combines the total current $I_T$, the leakage current $I_L$, and a reference signal $R_{SIG}$ to generate a data signal $R_{DATA}$ that is indicative of the value of stored data in the selected memory element 10'. For example, if the selected memory element 10' is in the first resistive state $R_0$ (i.e., high resistance), such that the read current $I_R$ is low, then $R_{DATA}$ will have a value indicative of the stored data being approximately a logic "0". Conversely, if the selected memory element 10' is in the second resistive state $R_1$ (i.e., low resistance), such that the read current $I_R$ is high, then $R_{DATA}$ will have a value indicative of the stored data being approximately logic a "1". Communication and control between the control unit 105 and the data unit 1130 can be effectuated by at least one signal 1109. One skilled in the art will appreciate that other units in the apparatus 150 may also communicate with and/or control operation of the data unit 1130. The reference signal $R_{SIG}$ can be generated by a reference generator 1140. The reference signal $R_{SIG}$ can be a voltage or a current. The reference generator 1140 can be in communication with and/or controlled by the address unit 101 and/or the control unit 105 as indicated by the dashed lines 1117, and 1111 respectively, or the reference generator 1140 can be part of the array 100 as described in "Two terminal memory array having reference cells", U.S. application Ser. No. 10/895,218, filed on Jul. 20, 2004, which is incorporated herein by reference in its entirety and for all purposes, or can exist as memory elements positioned outside of the array 100.

Figure 12A:
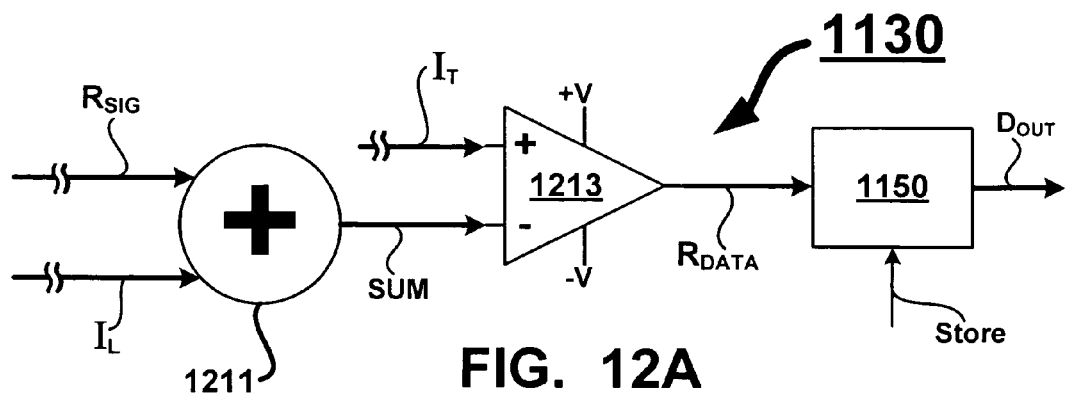
FIG. 12A is a schematic view depicting one embodiment a data unit.
Figure 12B:
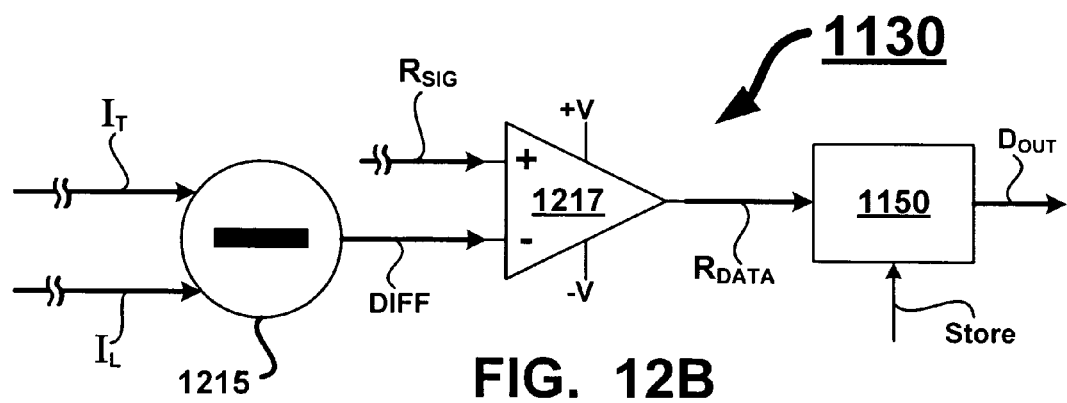
FIG. 12B is a schematic view depicting another embodiment of a data unit.

Turning to FIG. 12A, in one embodiment of the data unit 1130, an add unit 1211 adds the leakage current $I_L$ with the reference signal $R_{SIG}$ and generates a sum signal SUM as an output (e.g., SUM≈$I_L$+$R_{SIG}$). Additionally, the data unit 1130 can include a comparator 1213 that compares the sum signal SUM with the total current $I_T$ and generates the data signal $R_{DATA}$. In FIG. 12B, in an alternative embodiment of the data unit 1130, a subtract unit 1215 subtracts the leakage current $I_L$ from the total current $I_T$ and generates a difference signal DIFF as an output (e.g., DIFF≈$I_T$−$I_L$). Additionally, the data unit 1130 can include a comparator 1217 that compares the difference signal DIFF with the reference signal $R_{SIG}$ and generates the data signal $R_{DATA}$.

Figure 12C:
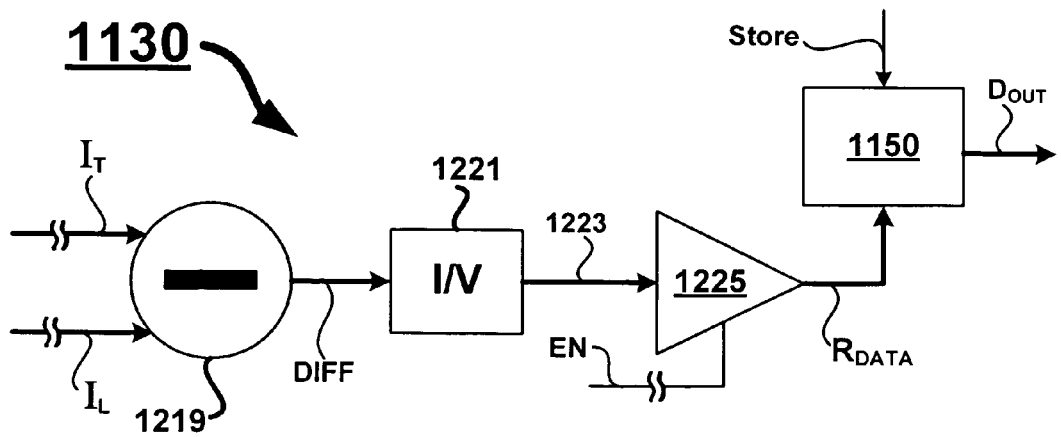
FIG. 12C is a schematic view depicting yet another embodiment of a data unit.

In FIG. 12C, in yet another embodiment of the data unit 1130, the difference signal DIFF is generated by a subtract unit 1219 and the output of the subtract unit 1219 is coupled with a current-to-voltage converter (I/V converter) 1221. The I/V converter 1221 converts the difference signal DIFF from a current domain signal to a voltage domain signal. An output 1223 of the I/V converter 1221 is coupled with an input to a circuit 1225 that generates the data signal $R_{DATA}$. The circuit 1225 can be a logic gate, such as a buffer or an inverter, for example. The circuit 1225 generates the data signal $R_{DATA}$ based on a value (e.g., a magnitude of the voltage) of the difference signal DIFF. For example, if the circuit 1225 is a logic gate that generates a logic "0" if the difference signal DIFF is below a first threshold voltage $V_{T1}$ and generates a logic "1" if the difference signal DIFF is above a second threshold voltage $V_{T2}$, then the value of the data signal $R_{DATA}$ will be determined by a property of the circuit 1225 and not by a comparison between signals (i.e., a comparison between $R_{SIG}$ and DIFF or a comparison between $I_T$ and SUM). Accordingly, the embodiment depicted in FIG. 12C provides one example in which the reference signal $R_{SIG}$ can be eliminated and the value of the data signal $R_{DATA}$ is indicative of a property (e.g., a threshold voltage) of the circuitry that generates the data signal $R_{DATA}$. Optionally, an enable signal EN can be used to enable the circuit 1225 (e.g., switch the output between a logic state and a high-impedance state).

Figure 13A:
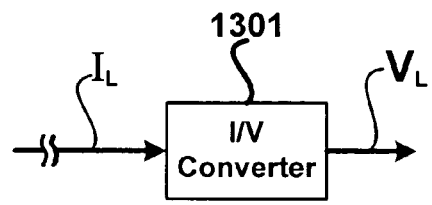
FIGS. 13A, 13B, and 14 are schematic views depicting exemplary current-to-voltage converters.
Figure 13B:
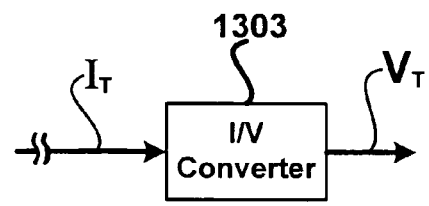
Figure 14:
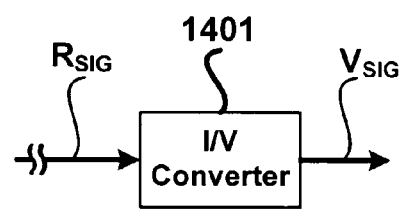

It may be desirable to perform the adding, subtracting, and comparing functions on voltages rather than currents. Accordingly, the leakage current $I_L$, the total current $I_T$, and optionally the reference signal $R_{SIG}$ may be processed as voltages by using an I/V converter to convert signals in the current domain to signals in the voltage domain or by sensing the voltages directly. Therefore, in FIG. 13A, an I/V converter 1301 converts leakage current $I_L$ to an equivalent voltage signal $V_L$. Consequently, the add unit 1211 or subtract unit 1215 can receive the voltage signal $V_L$ instead of the leakage current $I_L$. Similarly, in FIG. 13B, an I/V converter 1303 converts total current $I_T$ to an equivalent voltage signal $V_T$ and the comparator 1213 or subtract unit 1215 can receive the voltage signal $V_T$ as an input instead of the total current $I_T$. In FIG. 14, an IV converter 1401 converts the reference signal $R_{SIG}$ to an equivalent voltage signal $V_{SIG}$. Consequently, the add unit 1211 or the comparator 1217 can receive the voltage signal $V_{SIG}$ as an input in place of the reference signal $R_{SIG}$.

Storing the Data Signal

Optionally, the value of $R_{DATA}$ can be stored for later use by the apparatus 150 or by another system in communication with the apparatus 150. In FIG. 11, the apparatus 150 includes a storage unit 1150 for storing the data signal $R_{DATA}$. The storage unit 1150 can be a device including but not limited to a flip-flop, a latch, a buffer, and a register, for example. Moreover, the storage unit 1150 can output the stored data signal $R_{DATA}$ as a data out signal $D_{OUT}$. The data out signal $D_{OUT}$ can be coupled with a data bus 1180, with the apparatus 150, or with another system in communication with the apparatus 150, for example. One skilled in the art will appreciate that the storage unit 1150 can include a tri-state buffer or the like so that the output of the storage unit 1150 can be placed in a high impedance state when the storage unit 1150 is not driving the data out signal $D_{OUT}$ onto the data bus 1180, for example. One skilled in the art will understand that the stored data in the memory elements 10 of the array 100 can be non-volatile and retain data in the absence of power; however, the storage unit 1150 may be fabricated from circuitry (e.g., CMOS circuitry) that does not retain the data signal $R_{DATA}$ in the absence of power.

Figure 15:
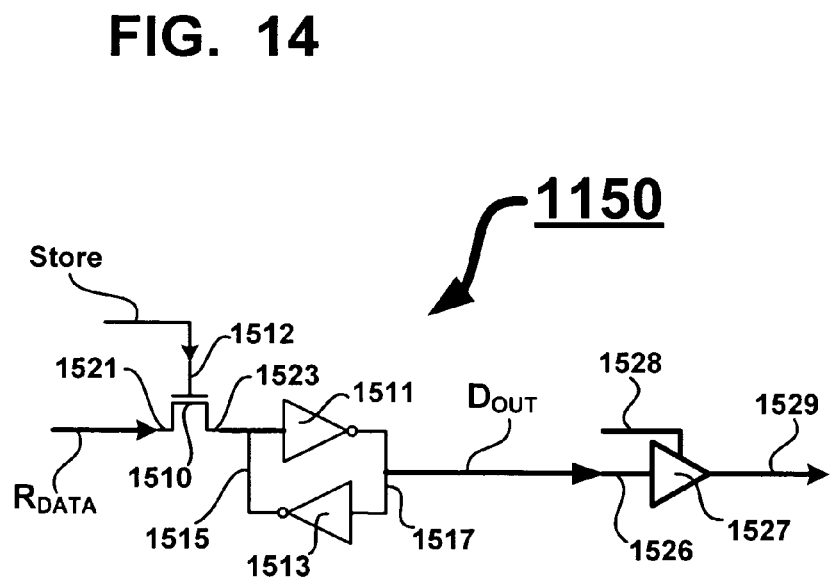
FIG. 15 is a schematic view depicting one embodiment of a storage unit.

In FIGS. 12A through 12C, the data signal $R_{DATA}$ is input into the storage unit 1150 and a signal Store can be pulsed (i.e., high or low) to store the data signal $R_{DATA}$ in the storage unit 1150. In FIG. 15, one example of an implementation of the storage unit 1150 is depicted. The data signal $R_{DATA}$ is connected to an input terminal 1521 of a FET 1510 and the other terminal 1523 of the FET 1510 is connected with an input 1515 of a latch comprising back-to-back inverters 1511 and 1513. The signal Store is connected with a gate 1512 of the FET 1510 and is driven high to allow the data signal $R_{DATA}$ to pass from the source node 1521 to the drain node 1523. The latch (1511, 1513), latches $R_{DATA}$ and the data out signal $D_{OUT}$ is driven onto an output 1517 of the latch. Optionally, the data out signal $D_{OUT}$ can be connected with an input 1526 of a tri-state buffer 1527. An output 1529 of the tri-state buffer 1527 can be connected to the data bus 1180. The tri-state buffer 1527 provides buffering and a high impedance output connection to the data bus 1180. A signal applied to the enable input 1528 can drive $D_{OUT}$ onto the data bus 1180 or place the output 1529 in a high-impedance state. Although only one-bit of data is depicted for $R_{DATA}$ and $D_{OUT}$, one skilled in the art will appreciate that apparatus 150 can include multiple arrays 100 that can be simultaneously accessed during read or write operations such that several bits of data (e.g., bytes or words) are read or written during a memory access cycle. Therefore, the read data can be stored in a multi-bit register or latch and data bus 1180 can be a multi-bit wide data bus.

Pre-Read Timing

Figure 20:
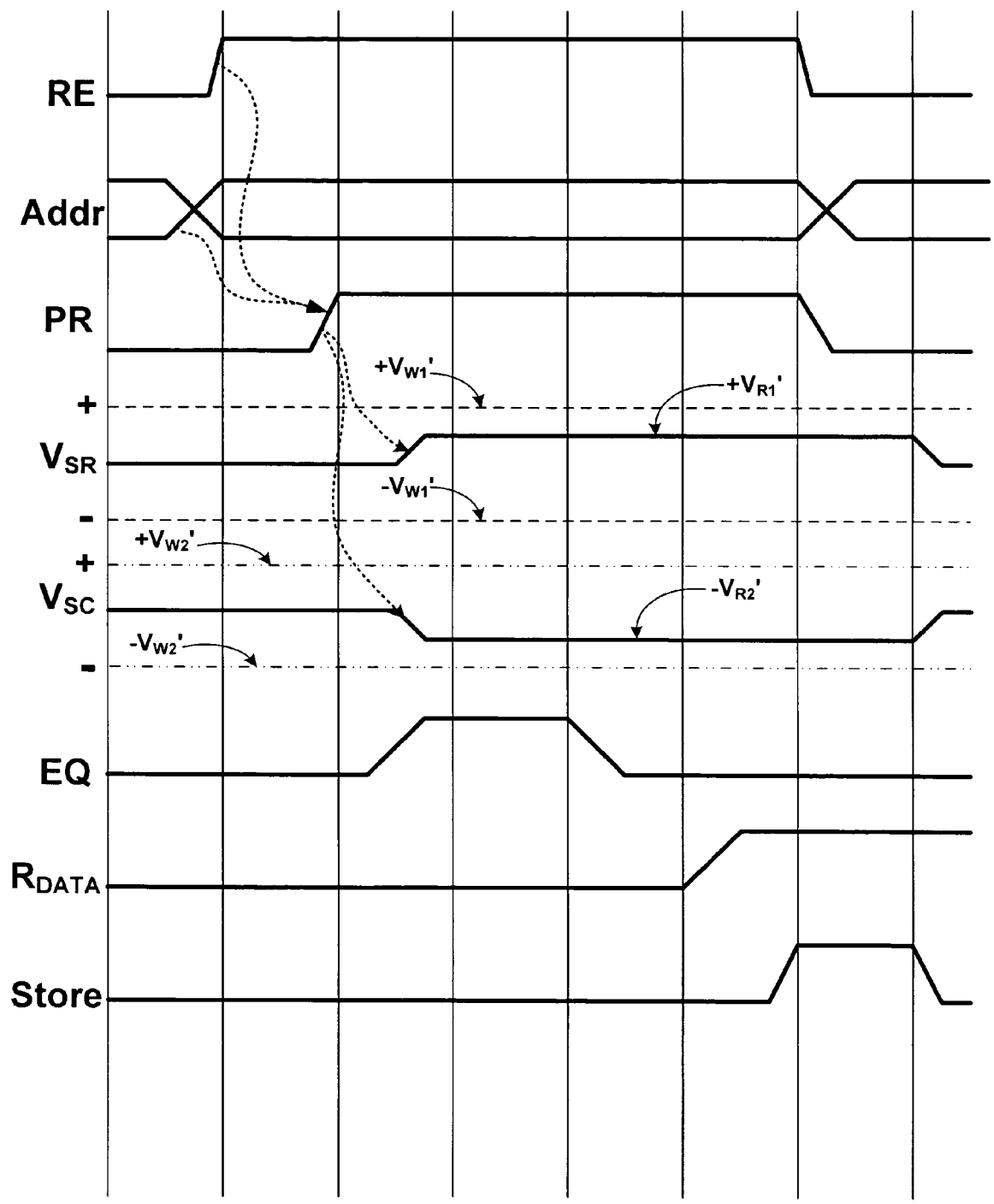
FIG. 20 is a timing diagram depicting one example of a pre-read operation.

Referring to FIG. 20, a timing diagram depicts an example of timing for a pre-read operation that is triggered by a read operation to the array 100 as was described above. For example, a read enable signal RE can be used to initiate the pre-read operation. Accordingly, a low-to-high transition on RE indicates a read operation has been initiated. After the transition on RE and when the address ADDR is stable, a pre-read signal PR transitions high and causes the select voltages ($V_{SR}$, $V_{SC}$) to increase in magnitude from a zero voltage or the non-select voltage level, for example, to the aforementioned voltage levels for the read voltages $V_{R1}$' and $V_{R2}$'. A maximum positive range and a maximum negative range for the select voltages are denoted by the dashed lines "+" and "−" for $V_{SR}$ and $V_{SC}$ respectively. Although the write voltages can be applied at or near their positive and negative maximums, the read voltages $V_{R1}$' and $V_{R2}$' are applied below the ± maximums to prevent overwriting the stored data during the pre-read operation. Consequently, the pre-read operation is non-destructive to stored data in the selected memory element 10'. Following the high transition on PR, the read voltages +$V_{R1}$' and −$V_{R2}$' are applied across the selected conductive traces 1' and 2'. After a sufficient time has passed for the data unit 1130 to combine the total current $I_T$, the leakage current $I_L$, and optionally the reference signal $R_{SIG}$, the data signal $R_{DATA}$ is generated. The Store signal can be pulsed to store the data signal $R_{DATA}$ in the storage unit 1150.

Pre-Reading Data During a Write Operation

Figure 16:
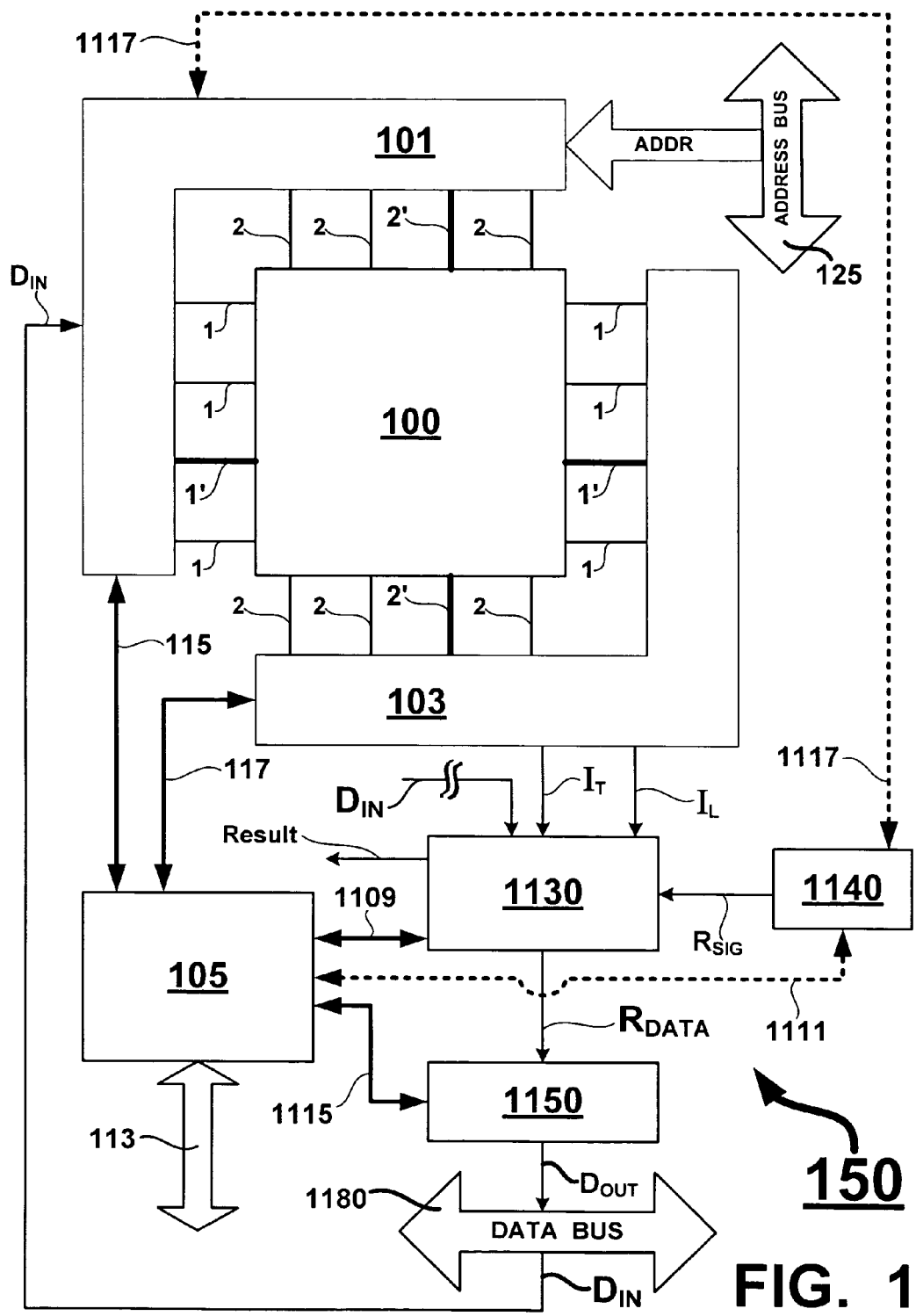
FIG. 16 is a block diagram depicting yet another embodiment of an apparatus for writing data in a two-terminal memory array.

Turning to FIG. 16, during a write operation to the array 100, the address unit 101 receives the address ADDR and selects the selected memory element 10' to which write data $D_{IN}$ is to be written to. For example, write data $D_{IN}$ can be at least one bit of data from the data bus 1180. Prior to writing the write data $D_{IN}$ to the selected memory element 10', the aforementioned pre-reading operation can optionally be performed and the stored data in the selected memory element 10' can be compared with the write data $D_{IN}$. If the value of the stored data and the value of the write data $D_{IN}$ are approximately equal to each other (i.e., the write data $D_{IN}$ is redundant to the stored data), then the write operation can be aborted to prevent the overwriting of identical data (i.e., $R_{DATA} \approx D_{IN}$). For example, if $D_{IN}$ is a logic "0" and $R_{DATA}$ is indicative of a logic "0", then there is no need to re-write the selected memory element 10' to the $R_0$ state. Similarly, if $D_{IN}$ is a logic "1" and $R_{DATA}$ is indicative of a logic "1", then there is no need to re-write the selected memory element 10' to the $R_1$ state.

However, if $R_{DATA} \neq D_{IN}$, then the write operation can be consummated, that is, $D_{IN}$ overwrites the current value of the stored data. Consequently, the value of $D_{IN}$ is written to the selected memory element 10' by applying the appropriate write voltage $V_W$ across the selected first and second conductive traces 1' and 2'. As was described above, the write voltage $V_W$ can be the combination of the first and second write voltages $V_{W1}'$ and $V_{W2}'$. For example, the address unit 101 can receive the write data $D_{IN}$ as an input and the value of the write data $D_{IN}$ can be used by the address unit 101 to determine the polarity and/or magnitude of the write voltage $V_W$ to be applied across the selected first and second conductive traces 1' and 2'. For example, the write voltages can be $+V_{W1}'$ and $-V_{W2}'$ to write a logic "0" and $-V_{W1}'$ and $+V_{W2}'$ to write a logic "1". One skilled in the art will appreciate that the write data $D_{IN}$ need not be coupled with the address unit 101 and that a signal from another unit in the apparatus 150 (e.g., the control unit 105) can be used to communicate the value of the write data $D_{IN}$ to the address unit 101.

During a write operation, before write data $D_{IN}$ is written to the selected memory element 10', the pre-reading operation may be initiated to pre-read the stored data in the selected memory element 10'. Therefore, the select voltage applied across the selected first and second conductive traces 1' and 2' is initially the read voltage $V_R$ as was described above (e.g., $V_{R1}'$ and $V_{R2}'$). The data unit 1130 combines the write data $D_{IN}$, the total current $I_T$, the leakage current $I_L$, and optionally the reference signal $R_{SIG}$ to generate the data signal $R_{DATA}$ as was described above in reference to FIGS. 11 through 15. After $R_{DATA}$ is generated, the write data $D_{IN}$ is compared with $R_{DATA}$ to determine whether or not to abort ($R_{DATA} \approx D_{IN}$) or consummate ($R_{DATA} \neq D_{IN}$) the write operation.

A signal Result can be generated based on the comparison between $D_{IN}$ and $R_{DATA}$. A variety of means can be used to generate the signal Result, including but not limited to analog circuitry, digital circuitry, or a combination of analog and digital circuitry. Depending on the value of the signal Result, the write operation is either consummated or aborted. In FIG. 17A, an analog comparator 1701 compares $R_{DATA}$ with $D_{IN}$ and generates the signal Result. If necessary, additional circuitry can be used to convert Result into a logic level signal. On the other hand, in FIG. 17B, Result is a logic level output of a XOR gate 1703 that receives the signals $R_{DATA}$ and $D_{IN}$ as logic level signals. Alternatively, an adaptive programming scheme, such as described in "An Adaptive Programming Technique for a Re-Writable Conductive Memory Device", U.S. Pat. No. 6,940,744, which is incorporated herein by reference in its entirety and for all purposes, can be used to generate the signal Result.

In FIG. 17C, a truth table depicts one example of logic for aborting or consummating the write operation using Result. The truth table depicts a XOR relationship between $R_{DATA}$, $D_{IN}$, and Result; however, one skilled in the art will appreciate that XOR logic depicted can be replaced by other logic that determines whether or not to abort or consummate the write operation. In row 1 of the truth table, $R_{DATA}$ and $D_{IN}$ are both approximately a logic "0" and in row 4, $R_{DATA}$ and $D_{IN}$ are both approximately a logic "1". Therefore, in rows 1 and 4 where $R_{DATA} \approx D_{IN}$, Result=0 and the write operation is aborted because the data to be written is redundant to the stored data in the selected memory element 10'. Consequently, there is no change in the stored data as denoted by the asterisk "*" in the "Stored Data" column of the truth table. The aborting of the write operation can be triggered by Result alone or by another signal that is generated in response to Result. In that Result=0, the voltages applied across the selected conductive traces (1', 2') do not reach write voltage magnitudes and the stored data in the selected memory element 10' is not affected.

On the other hand, in row 2, $R_{DATA}$=0 and $D_{IN}$=1, and in row 3, $R_{DATA}$=1 and $D_{IN}$=0. Therefore, in rows 2 and 3 where $R_{DATA} \neq D_{IN}$, Result=1 and the write operation is consummated because the stored data and the data to be written are different from each other (i.e., they are not redundant). Consequently, the stored data is overwritten with the value of $D_{IN}$ by applying the appropriate write voltages ($V_{W1}'$, $V_{W2}'$) across the selected conductive traces (1', 2').

Consummating the Write Operation

Figure 21A:
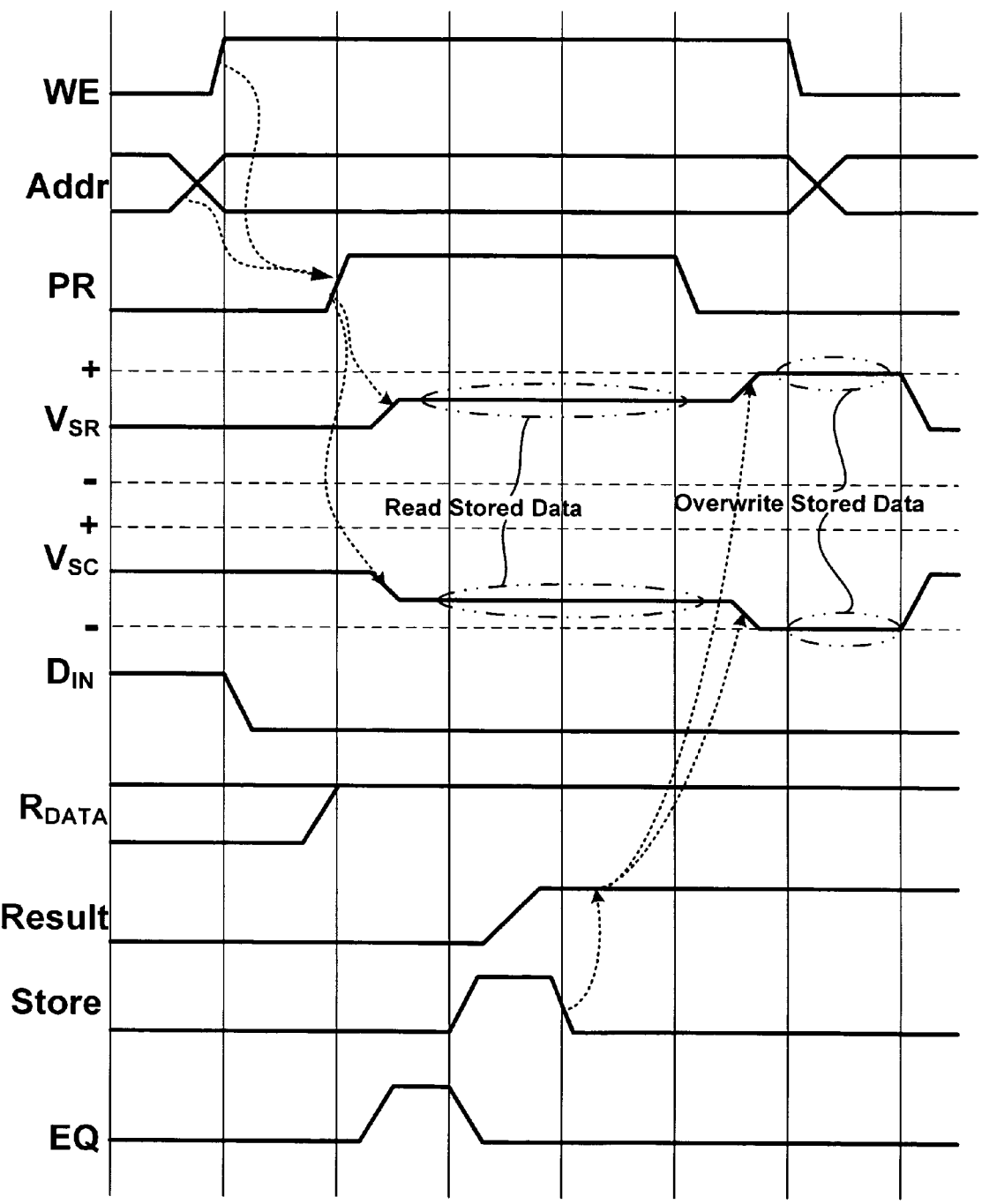
FIG. 21A is a timing diagram depicting one example of a consummated write operation.

In FIG. 21A, a timing diagram depicts one example of a write operation to a selected memory element 10' in which a pre-read operation is performed with a resulting consummation of the write operation. In this example, the Result from the pre-reading is a logic "1"; therefore, $R_{DATA} \neq D_{IN}$ and the stored data will be overwritten with the write data $D_{IN}$. Initiation of the write operation is triggered by a high transition on a write enable signal WE, a stable write address on ADDR, and stable write data $D_{IN}$ on data bus 1180. A high transition on a pre-read signal PR triggers a transition of the select voltages applied across the selected first and second conductive traces 1' and 2'. Therefore, the select voltage $V_{SR}$ for a row is applied to the selected first conductive trace 1' and the select voltage $V_{SC}$ for a column is applied to the selected second conductive trace 2'.

Initially, the select voltages $V_{SR}$ and $V_{SC}$ are read voltages so that the stored data in the selected memory element 10' can be read to determine whether or not to abort or consummate the writer operation. A maximum positive range and a maximum negative range for the select voltages are denoted by the dashed lines "+" and "−" for $V_{SR}$ and $V_{SC}$ respectively. The write voltages can be applied at or near their positive and negative maximums; however, the read voltages are applied below the positive and negative maximums to prevent overwriting the stored data during the pre-reading. Accordingly, at this stage of the write operation, stored data in the selected memory element 10' is being pre-read to determine if $R_{DATA} \neq D_{IN}$. A low-to-high transition on Result can be used to indicate that $R_{DATA} \neq D_{IN}$. The low-to-high transition on Result causes the select voltages $V_{SR}$ and $V_{SC}$ to change (i.e., increase in magnitude) from the lower magnitude read voltages to the higher magnitude write voltages so that the stored data is overwritten by the write data $D_{IN}$. The polarities of the write voltages will depend on the value of the write data $D_{IN}$. For example, if the write data $D_{IN}$ is a logic "0" and $R_{DATA}$ is a logic "1", then the polarities of the select voltages can be $+V_{SR}$ and $-V_{SC}$ to overwrite the logic "1" with the logic "0". Conversely, if the write data $D_{IN}$ is a logic "1" and $R_{DATA}$ is a logic "0", then the polarities of the select voltages can be $-V_{SR}$ and $+V_{SC}$ to overwrite the logic "0" with the logic "1". In FIG. 21A, $R_{DATA} \approx 1$ and $D_{IN} \approx 0$; therefore, from the truth table in FIG. 18, Result=1 and the write operation is consummated to overwrite the stored data with the write data $D_{IN}$. Following the low-to-high transition on Result, the Store signal can be used to by the system 150 to test the value of Result. If Result=1, then a transition on Store can be used to trigger (e.g., on a falling edge) the change in select voltage levels ($V_{SR}$, $V_{SC}$) from the lower level read voltages ($V_{R1}'$, $V_{R2}'$) to the higher level write voltages ($V_{W1}'$, $V_{W2}'$).

Aborting the Write Operation

Figure 21B:
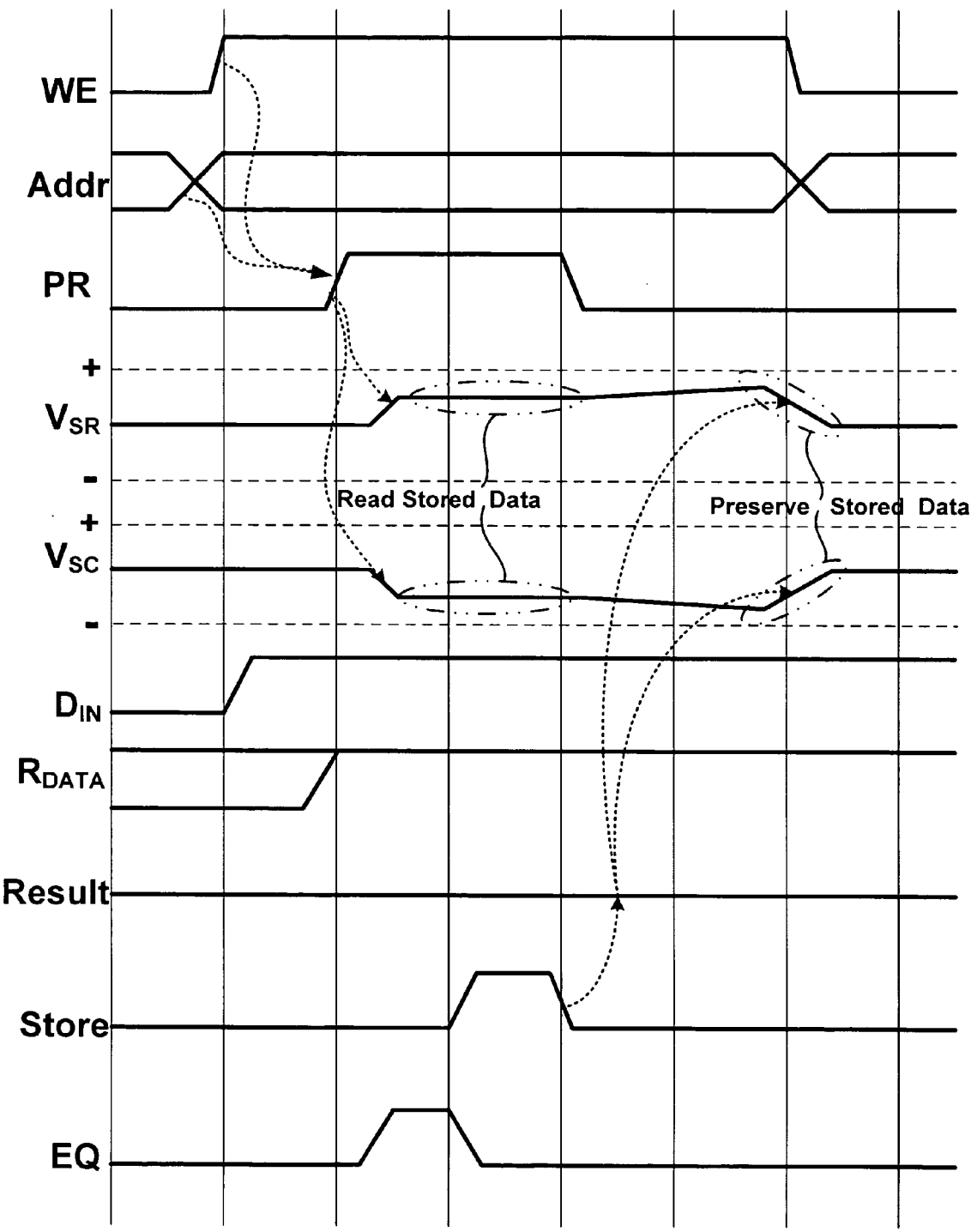
FIG. 21B is a timing diagram depicting one example of an aborted write operation.

In FIG. 21B, a timing diagram depicts one example of a write operation to a selected memory element 10' in which a pre-read operation is performed with a resulting abort of the write operation. In this example, the Result from the pre-reading is a logic "0". Therefore, $R_{DATA} \neq D_{IN}$, and the stored data will not be overwritten by the write data $D_{IN}$. The initiation of the write operation is the same as described above in reference to FIG. 21A. However, even though the Result signal is a logic "0", the read voltages may be changing (i.e., increasing) to the write voltage levels in anticipation of the possibility that Result=1 and the write operation would be consummated. In this example, Result does not make the low-to-high transition and stays at a logic "0". The Store signal can be used to by the system 150 to test the value of Result. If Result=0, then a transition on Store can be used to trigger (e.g., on a falling edge) a change in select voltage levels ($V_{SR}$, $V_{SC}$) that halts an increase in the select voltages $V_{SR}$ and $V_{SC}$ before they reach write voltages levels at or near the ± maximums. Consequently, the select voltages decrease to the lower level read voltages ($V_{R1}'$, $V_{R2}'$) thereby preventing the overwriting of the stored data with redundant write data $D_{IN}$.

Write operations to the array 100 can be accomplished by applying the select voltages $V_{SR}$ and $V_{SC}$ at a write voltage magnitude to the selected first and second conductive traces 1' and 2' selected by the ADDR received by the address unit 101 such that the write voltage is applied across the terminals 11 and 12 of the selected memory element 10'. Therefore, the aforementioned pre-read operation is not necessary for write operations to the array 100 and may optionally be used, particularly when some of the aforementioned advantages to pre-reading are necessary for a specific application.

Equalizing Charge on Inputs

In the comparators depicted in FIGS. 12A, 12B, and 17A, residual charge can accumulate on the inputs to the comparators prior to a read or write operation or can be left-over voltage from a previous read or write operation. Accumulated charge can result in output signals (e.g., Result or $R_{DATA}$) that are not accurate because the built up charge is added to the signals to be compared, such as $R_{DATA}$ and $D_{IN}$, $I_T$ and SUM, or $R_{SIG}$ and DIFF, for example. Moreover, the charge build up on the inputs may not be equal for both inputs, resulting in an input bias to the comparator. Errors caused by input bias and/or by unequal charge build up can be substantially reduced or eliminated by using an equalization circuit to equalize the charge on the inputs to the comparator. One skilled in the art will appreciate that there are a variety of ways for implementing such equalization techniques, which are typically used with differential sensing circuits. In particular, a FET may be replaced by a CMOS pass gate with NMOS and PMOS transistors to pass all appropriate levels.

In FIG. 18, one example of an equalization circuit 1811 includes a FET 1820 with a gate node 1822 in communication with an EQ signal, a source node 1824 connected with an input 1825 of a comparator 1821, and a drain node 1826 connected with an input 1827 of the comparator 1821. Driving the EQ signal to a logic "1" turns the FET 1820 on, resulting in a low resistance path between the source 1824 and drain 1826 that equalizes built up charge on the inputs 1825 and 1827 of the comparator 1821. The equalization circuit 1811 can be used with the comparators 1213, 1217, and 1701 in FIGS. 12A, 12B, and 17A. The timing diagrams in FIGS. 20, 21A and 21B depict an optional use of the EQ signal to equalize charge build up. For example, in FIG. 20, during a pre-read operation, EQ can be pulsed after the select voltages ($V_{SR}$, $V_{SC}$) have stabilized. The pulse on EQ stays active long enough to equalize any charge build up on the inputs to a comparator (e.g., comparator 1213 or 1217).

Prior to the signals at the inputs being compared to each other, EQ goes inactive, turning the FET 1720 off and placing a high impedance across the inputs to the comparator. Subsequently, the signals at the inputs can be compared and the comparator can generate an accurate value for $R_{DATA}$.

As another example, in FIGS. 21A and 21B, for a write operation in which a pre-read is performed to determine whether or not the stored data $R_{DATA}$ is approximately equal to the write data $D_{IN}$. The signal EQ can be pulsed prior to the comparison of $R_{DATA}$ and $D_{IN}$ in the comparator 1701 of FIG. 17A. The pulse on EQ stays active long enough to equalize any charge build up on the inputs to the comparator 1701 and then EQ goes inactive so that the signals $R_{DATA}$ and $D_{IN}$ can be compared and the comparator can generate an accurate value for Result.

Applying Select Voltages

Figure 22:
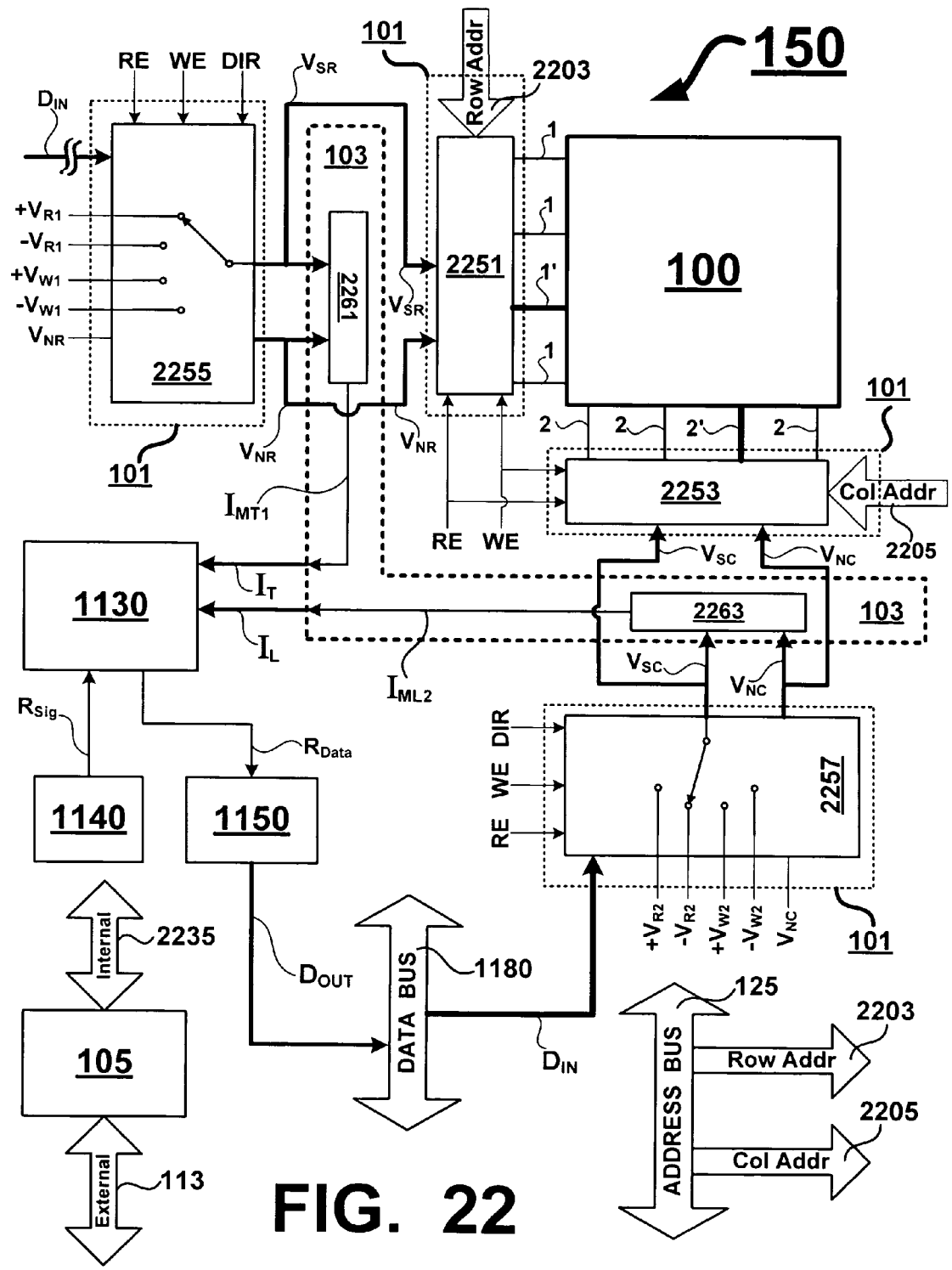
FIG. 22 is a block diagram depicting another embodiment of an apparatus for sensing current in a two-terminal memory array.

In FIG. 22, the address unit 101 can include a row decoder 2251, a column decoder 2253, a row voltage switch 2255, and a column voltage switch 2257. The address ADDR from the address bus 125 can be divided into a row address 2203 and a column address 2205 that are coupled with their respective row and column decoders (2251, 2253). Read enable RE, write enable WE, direction DIR, and data in $D_{IN}$ signals can be coupled with both voltage switches 2255 and 2257. The row voltage switch 2255 can include the following voltages as inputs: read voltages $+V_{R1}$ and $-V_{R1}$, write voltages $+V_{W1}$ and $-V_{W1}$, and non-select voltage $V_{NR}$. The column voltage switch 2257 can include the following voltages as inputs: read voltages $+V_{R2}$ and $-V_{R2}$, write voltages $+V_{W2}$ and $-V_{W2}$, and non-select voltage $V_{NC}$.

For a read operation to a selected memory element 10', the row voltage switch 2255 selects one of the read voltages ($+V_{R1}$ or $-V_{R1}$) and outputs the selected voltage as the row select voltage $V_{SR}$. The row select voltage $V_{SR}$ is an input to the row decoder 2251. Based on the row address 2203, the row decoder 2251 applies the row select voltage $V_{SR}$ to the selected first conductive trace 1' in the appropriate row in the array 100. Similarly, the column voltage switch 2257 selects one of the read voltages ($+V_{R2}$ or $-V_{R2}$) and outputs the selected voltage as the column select voltage $V_{SC}$. The column select voltage $V_{SC}$ is an input to the column decoder 2253. Based on the column address 2205, the column decoder 2253 applies the column select voltage $V_{SC}$ to the selected second conductive trace 2' in the appropriate column in the array 100. As a result, the memory element 10 positioned at the intersection of the selected first and second conductive traces (1', 2') becomes the selected memory element 10' for the read operation.

Similarly, for a write operation to a selected memory element 10', the row voltage switch 2255 selects one of the write voltages ($+V_{W1}$ or $-V_{W1}$) and outputs the selected write voltage to the row decoder 2251 as the row select voltage $V_{SR}$. Based on the row address 2203, the row decoder 2251 applies the row select voltage $V_{SR}$ to the selected first conductive trace 1'. Furthermore, the column voltage switch 2257 selects one of the write voltages ($+V_{W2}$ or $-V_{W2}$) and outputs the selected write voltage to the column decoder 2253 as the column select voltage $V_{SC}$. Based on the column address 2205, the column decoder 2253 applies the column select voltage $V_{SC}$ to the selected second conductive trace 2'.

The non-select voltages $V_{NR}$ and $V_{NC}$ for the rows and columns can be connected with their respective switches 2255 and 2257. The switches 2255 and 2257 pass those voltages through to their respective decoders 2251 and 2253 as depicted in FIG. 22. On the other hand, because the non-select voltages $V_{NR}$ and $V_{NC}$ for the rows and columns will be applied to all of the unselected conductive traces 1 and 2, the non-select voltages $V_{NR}$ and $V_{NC}$ can be connected directly to their respective decoders 2251 and 2253 and the connection to the switches 2255 and 2257 can be eliminated in certain applications. As will be described in greater detail below, the sense unit 103 can include a row current mirror 2261 and a column current mirror 2263 that output mirrored equivalents of the total current $I_T$ and the leakage current $I_L$ to the data unit 1130.

Figures 23A, 23B:
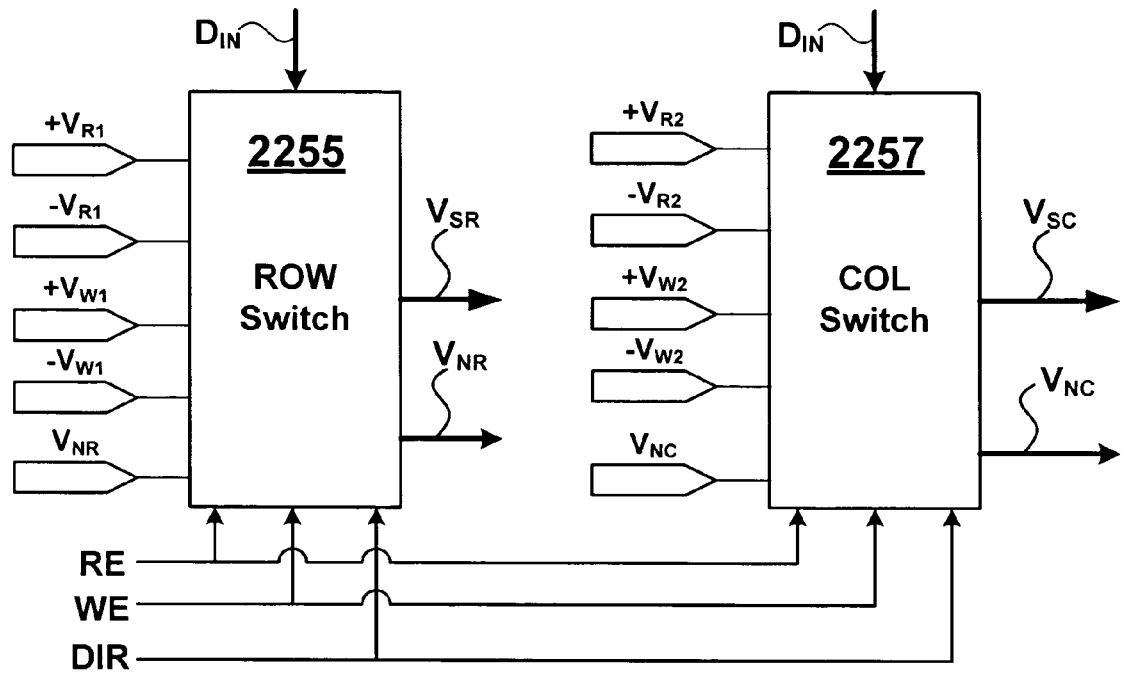
FIG. 23A is a block diagram depicting a row voltage switch and a column voltage switch.
FIG. 23B depicts an example of a truth table for the row and column voltage switches.

Turning now to FIG. 23A, the application of the select voltages $V_{SR}$ and $V_{SC}$ to the selected first and second conductive traces (1', 2') depends on the type of operation being performed. For a valid read operation, the row and column voltage switches 2255 and 2257 need to apply the appropriate read voltages. Similarly, for a valid write operation the appropriate write voltages must be applied. Therefore, if both RE and WE are active high signals, then for a valid read operation RE=1 and WE=0 and for a valid write operation is RE=0 and WE=1. When there is a conflict between RE and WE that results in either operation being invalid (i.e., RE=WE=1 or RE=WE=0), then row and column decoders 2251 and 2253 can apply the non-select voltages to all of the conductive traces (1, 2) in the array 100.

In FIG. 23B, a truth table depicts one example of logic for determining which select voltages to apply to the selected first and second conductive traces (1', 2') for read and write operations and which non-select voltages to apply during an invalid operation. For a valid read operation (i.e., RE=1 and WE=0) the row voltage switch 2255 selects $-V_{R1}$ for the row select voltage $V_{SR}$ and the column voltage switch 2257 selects $+V_{R2}$ for the column select voltage $V_{SC}$. In this example, the same read voltage polarity ($-V_{R1}$, $+V_{R2}$) is selected for each read operation. For a valid write operation (i.e., RE=0 and WE=1) the polarities of the write voltages can depend on the value of the write data $D_{IN}$. Therefore, when $D_{IN}$=0, row voltage switch 2255 selects $+V_{W1}$ and column voltage switch 2257 selects $-V_{W2}$. Conversely, when $D_{IN}$=1, row voltage switch 2255 selects $-V_{W1}$ and column voltage switch 2257 selects $+V_{W2}$. One skilled in the art will appreciate that the polarities of the select voltages for write operations may be reversed so that when WE=1 and $D_{IN}$=0, the row select voltage $V_{SR}$=$-V_{W1}$ and column select voltage $V_{SC}$=$+V_{W2}$ and when WE=1 and $D_{IN}$=1, the row select voltage $V_{SR}$=$+V_{W1}$ and column select voltage $V_{SC}$=$-V_{W2}$.

Optionally, a signal DIR can be used to select a polarity for the read voltages during a valid read operation. For example, when DIR=0, the row voltage switch 2255 selects $-V_{R1}$ for the row select voltage $V_{SR}$ and the column voltage switch 2257 selects $+V_{R2}$ for the column select voltage $V_{SC}$. On the other hand, when DIR=1, the row voltage switch 2255 selects $+V_{R1}$ for the row select voltage $V_{SR}$ and the column voltage switch 2257 selects $-V_{R2}$ for the column select voltage $V_{SC}$. The advantages of alternating read voltage polarity will be discussed in greater detail below.

Address Decoding

The address unit 101 receives and decodes the address ADDR from the address bus 125 and applies the appropriate select voltages and non-select voltages to the conductive traces 1 and 2 in the array 100. Referring again to FIG. 22, the address ADDR on the address bus 125 can be separated into the row address 2203 and the column address 2205, with the row decoder 2251 receiving the row address 2203 as an input and the column decoder 2253 receiving the column address 2205 as an input. To uniquely address one of the four first conductive traces 1 and one of the four second conductive traces 2 in the array 100, a two-bit wide row address 2203 and a two-bit wide column address are required. Therefore, to select a single memory element 10', only one of the first conductive traces 1 can be the selected conductive trace 1' and only one of the second conductive traces 2 can be the selected conductive trace 2'. Therefore, the two-bits of the row address 2203 are decoded to select which of the four first conductive traces 1 will be the selected first conductive trace 1' for a read or write operation. Similarly, the two-bits of the column address 2205 are decoded to select which of the four second conductive traces 2 will be the selected second conductive trace 2'. The row and column decoders 2251 and 2253 apply the select voltages $V_{SR}$ and $V_{SC}$ to the selected first and second conductive traces 1' and 2' and apply the non-select voltages $V_{NR}$ and $V_{NC}$ to the remaining first and second conductive traces 1 and 2.

Row Decoder

Figures 24A, 24B:
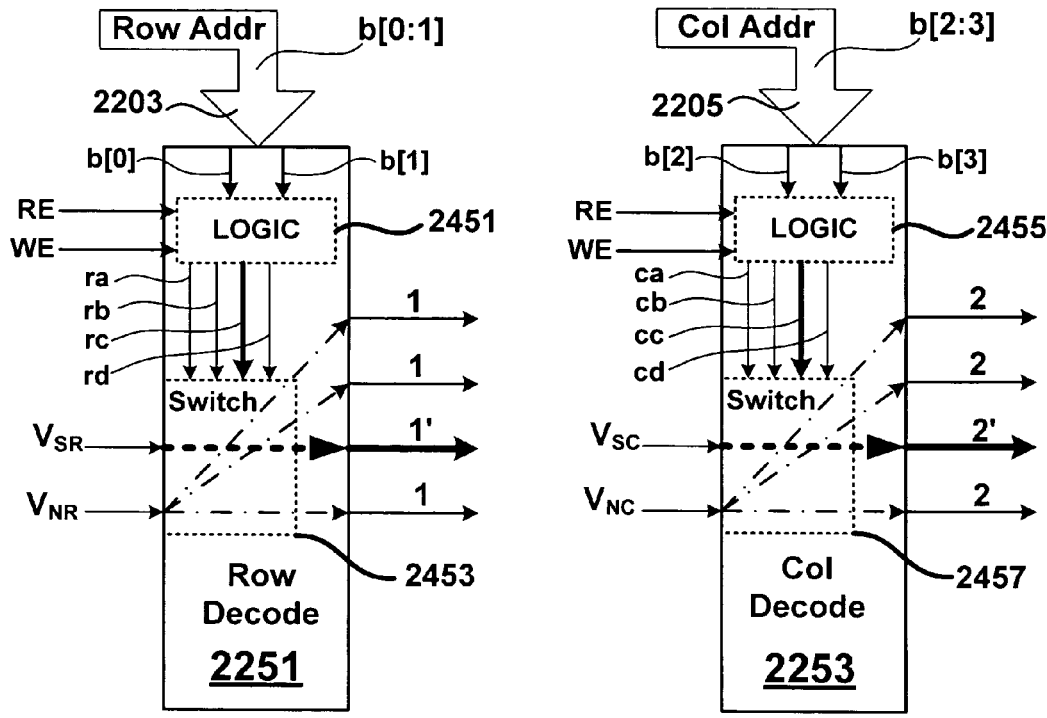
FIG. 24A is a block diagram depicting one embodiment of a row decoder and an example of a truth table for the row decoder.
FIG. 24B is a block diagram depicting one embodiment of a column decoder and an example of a truth table for the column decoder.

Turning to FIG. 24A, an exemplary row decoder 2251 includes a logic unit 2451 and a switch unit 2453. The logic unit 2451 receives the two-bits (b[0], b[1]) from the row address 2203 as inputs. The logic unit 2451 outputs four row signals (ra, rb, rc, rd) that are coupled with the switch unit 2453. Based on the values of the row signals (ra, rb, rc, rd), the switch unit 2453 routes the select voltage $V_{SR}$ to the selected first conductive trace 1' and routes the non-select voltage $V_{NR}$ to the unselected first conductive traces 1. The most significant bit of the row address 2203 is b[1] and the least significant bit is b[0]. For a given row address 2203, only one of the four row signals (ra, rb, rc, rd) will be a logic "1" and the remaining row signals will be a logic "0". Accordingly, as one example of how the two-bits (b[0], b[1]) can be decoded, when b[1]=1 and b[0]=0, then the row signal rc is a logic "1" and the remaining three row signals (ra, rb, rd) are a logic "0". Accordingly, the select voltage $V_{SR}$ is applied to the selected first conductive trace 1' which corresponds to the first conductive trace 1 in row r2 of the array 100 and is depicted by a heavy dashed arrow connected with trace 1'. On the other hand, the non-select voltage $V_{NR}$ is applied to the remaining first conductive traces 1 in rows r0, r1, and r3 as depicted by the dashed arrows connected with first conductive traces 1.

Figure 25A:
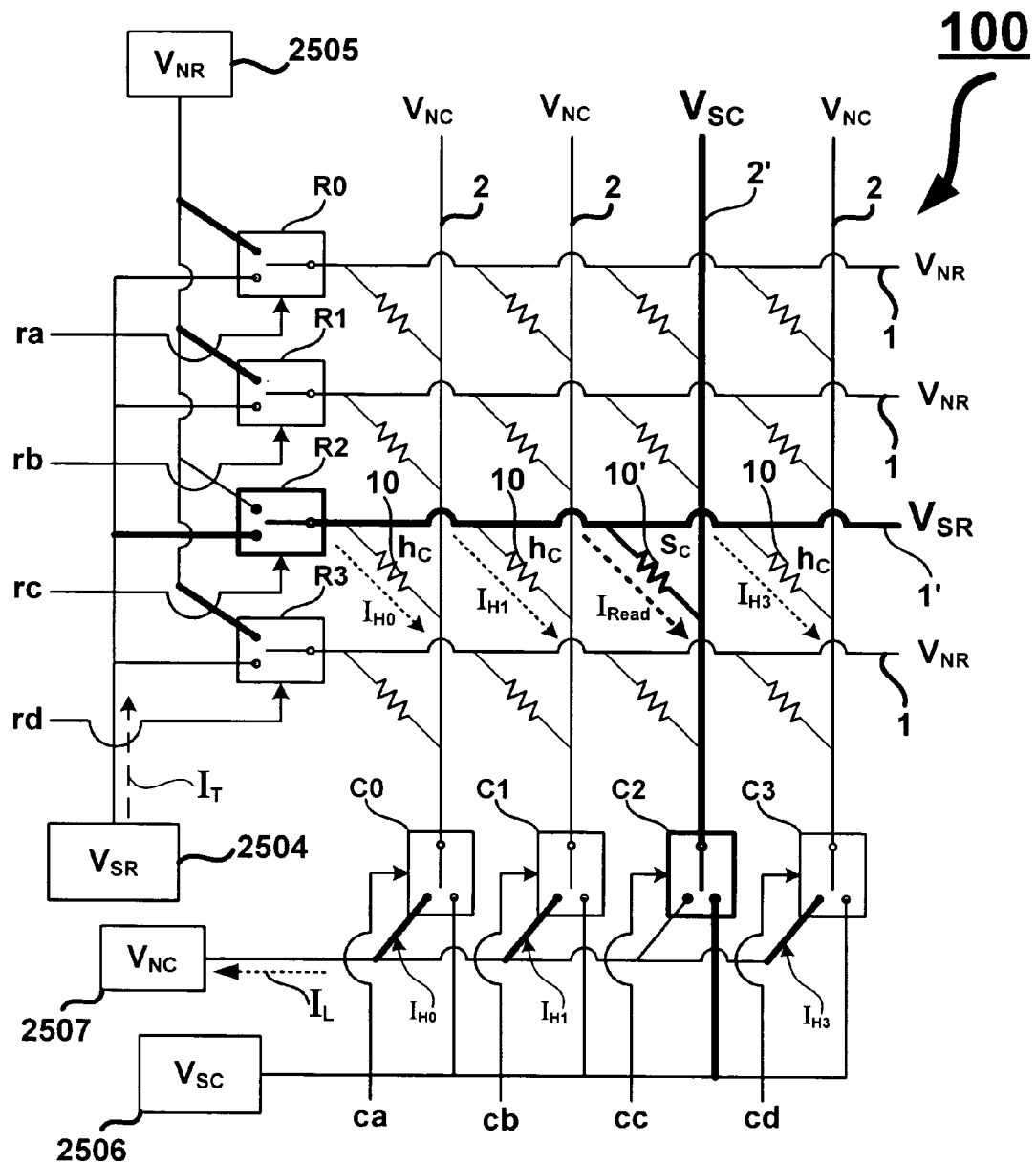
FIG. 25A is a schematic view depicting one embodiment of applying select voltages and sensing total and leakage currents.

A truth table in FIG. 24A depicts logic for the above example with the four possible values for the two-bits b[1:0] in the first column and the resulting values for the four row signals (ra, rb, rc, rd) in the adjacent columns. Therefore, for b[1:0]=10, rc=1 and ra, rb, rd=0. The columns denoted as R0, R1, R2, and R3 represent the outputs of four multiplexers in the switching unit 2453 that receive the row signals ra, rb, rc, and rd as inputs. Referring now to FIG. 25A, each multiplexer (R0, R1, R2, and R3) selects the select voltage $V_{SR}$ or the non-select voltage $V_{NR}$ based on the value of its input and applies the selected voltage to the first conductive trace 1 connected with the multiplexers output. Multiplexers R0, R1, R2, and R3 have their respective outputs connected with the first conductive traces 1 in rows r0, r1, r2, and r3 of the array 100. As will be appreciated by those skilled in the art, multiplexers R0, R1, R2, and R3 may actually choose from a variety of power supplies, such as $+V_{R1}$, $-V_{R1}$, $+V_{W1}$, and $-V_{W1}$. Accordingly, additional control signals can control which of these inputs is delivered to the selected first conductive trace 1'.

Therefore, in the truth table in FIG. 24A for b[1:0]=10, the row signal rc=1 and multiplexer R2 selects the select voltage $V_{SR}$ and applies it to the selected conductive trace 1'. The other multiplexers (R0, R1, and R3) select the non-select voltage $V_{NR}$ and apply it to the remaining first conductive traces 1 because their respective inputs ra, rb, and rd are a logic "0". The truth table also depicts the outcome for the other values of b[1:0]. To uniquely select the selected memory cell 10', the column decoder 2253 must also select the selected second conductive trace 2' based on the bits b[3:2] of the column address 2205.

Column Decoder

In FIG. 24B, an exemplary column decoder 2253 includes a logic unit 2455 and a switch unit 2457. The logic unit 2455 receives two-bits (b[2], b[3]) from the column address 2205 as inputs. The logic unit 2455 outputs four column signals (ca, cb, cc, cd) that are coupled with the switch unit 2457. Based on the values of the column signals (ca, cb, cc, cd), the switch unit 2457 routes the select voltage $V_{SC}$ to the selected second conductive trace 2' and routes the non-select voltage $V_{NC}$ to the unselected second conductive traces 2. The most significant bit of the column address 2205 is b[3] and the least significant bit is b[2]. For a given column address 2205, only one of the four column signals (ca, cb, cc, cd) will be a logic "1" and the remaining column signals will be a logic "0". Accordingly, as another example of how the two-bits (b[2], b[3]) can be decoded, when b[3]=1 and b[2]=0, then the column signal cc is a logic "1" and the remaining three column signals (ca, cb, cd) are a logic "0". Accordingly, the select voltage $V_{SC}$ is applied to the selected second conductive trace 2' which corresponds to the second conductive trace 2 in column c2 of the array 100 and is depicted by a heavy dashed arrow connected with trace 2'. Conversely, the non-select voltage $V_{NC}$ is applied to the remaining second conductive traces 2 in columns c0, c1, and c3 as depicted by the dashed arrows connected with the second conductive traces 2.

Figure 25B:
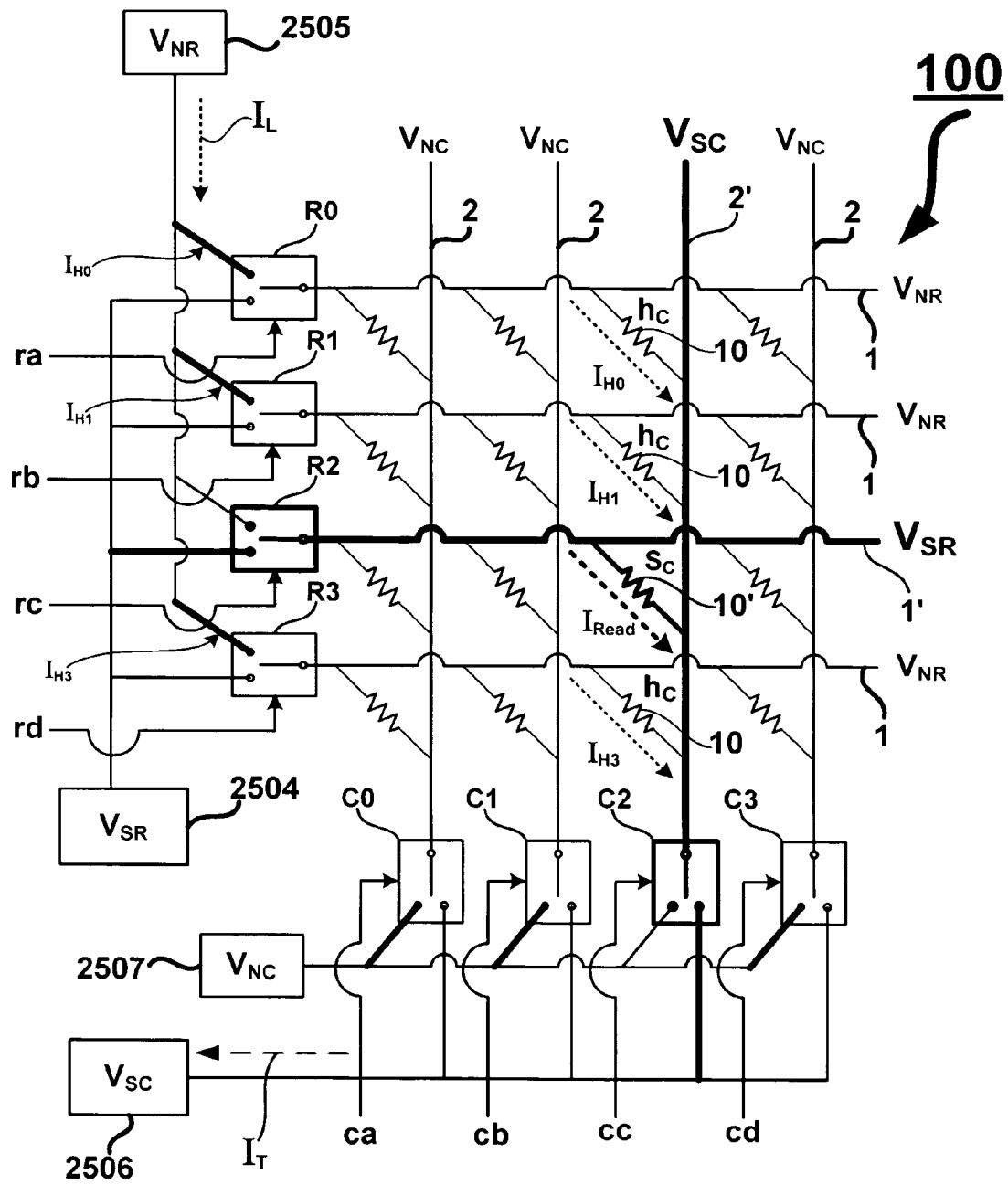
FIG. 25B is a schematic view depicting an alternative embodiment of applying select voltages and sensing total and leakage currents.

A truth table in FIG. 24B depicts logic for the above example with the four possible values for the two-bits b[3:2] in the first column and the resulting values for the four column signals (ca, cb, cc, cd) in the adjacent columns. Therefore, for b[3:2]=10, cc=1 and ca, cb, cd=0. The columns denoted as C0, C1, C2, and C3 represent the outputs of four multiplexers in the switching unit 2457 that receive the column signals ca, cb, cc, cd as inputs. Referring now to FIG. 25B, each multiplexer (C0, C1, C2, and C3) selects the select voltage $V_{SC}$ or the non-select voltage $V_{NC}$ based on the value of its input and applies the selected voltage to the second conductive trace 2 connected with the multiplexers output. Multiplexers C0, C1, C2, and C3 have their respective outputs connected with the second conductive traces 2 in columns c0, c1, c2, and c3 of the array 100. As will be appreciated by those skilled in the art, multiplexers C0, C1, C2, and C3 may actually choose from a variety of power supplies, such as $+V_{R2}$, $-V_{R2}$, $+V_{W2}$, and $-V_{W2}$. Accordingly, additional control signals can control which of these inputs is delivered to the selected second conductive trace 2'.

Therefore, in the truth table in FIG. 24B, for b[3:2]=10, the column signal cc=1 and multiplexer C2 selects the select voltage $V_{SC}$ and applies it to the selected conductive trace 2'. The other multiplexers (C0, C1, and C3) select the non-select voltage $V_{NC}$ and apply it to the remaining second conductive traces 2 because their respective inputs ca, cb, and cd are a logic "0". The truth table also depicts the outcome for the other values of b[3:2].

Accordingly, with the select voltages $V_{SR}$ and $V_{SC}$ applied to the selected first and second conductive traces 1' and 2' and the non-select voltages $V_{NR}$ and $V_{NC}$ applied to unselected traces 1 and 2, the memory element 10' in row r2 and column c2 is uniquely selected for a read or a write operation. In a similar manner, the other memory elements 10 in the array 100 can be selected for a read or a write operation by providing appropriate row and column addresses 2203 and 2205.

Sensing Total and Leakage Currents

After the select voltages $V_{SR}$ and $V_{SC}$ have been applied across the selected conductive traces 1' and 2', the total current $I_T$ and the leakage current $I_L$ are sensed by the sense unit 103. Referring again to FIG. 25A, a power source 2504 supplies the row select voltage $V_{SR}$ and a power source 2506 supplies the column select voltage $V_{SC}$. Similarly, a power source 2505 supplies the row non-select voltage $V_{NR}$ and a power source 2507 supplies the column non-select voltage $V_{NC}$. Depending on the polarities of the select and non-select voltages, the power sources 2504, 2506, 2505, and 2507 will either sink or source current through the conductive traces they are connected with. The power sources 2504 and 2506 that supply the select voltages $V_{SR}$ and $V_{SC}$ will typically be supplying the read and write voltages $+V_R$, $-V_R$, $+V_W$, and $-V_W$. Accordingly, four separate power sources (or inputs if obtained externally) can be used. Although the power sources 2504 and 2506 are shown as separate components, a single power source for a particular magnitude (e.g., $-V_W$) might be shared by multiple rows or columns across bit-blocks, shared by rows and columns in one or more bit-blocks, or might supply a single row or column.

One means for sensing the total current $I_T$ and/or the leakage current $I_L$ is to monitor the current flowing through the power source that supplies the select voltages $V_{SR}$ and $V_{SC}$ and non-select voltages $V_{NR}$ and $V_{NC}$. The following examples describe how monitoring current flow can be used to sense $I_T$ and/or $I_L$. As a first example, in FIG. 25A, power source 2504 sources the total current $I_T$ flowing through the selected first conductive trace 1' and power source 2507 sinks the leakage current $I_L$ flowing through the unselected second conductive traces 2.

In that the row and column orientation is arbitrary, the total current $I_T$ flowing through the selected second conductive trace 2' can be sensed by monitoring current flow through a power source and the leakage current $I_L$ flowing through the unselected first conductive traces 1 can be sensed by monitoring current flow through another power source.

Therefore, as a second example, in FIG. 25B, a power source 2506 sinks the total current $I_T$ flowing through the selected second conductive trace 2' and a power source 2505 sources the leakage current $I_L$ flowing through the unselected first conductive traces 1. Therefore, the total current $I_T$ can be sensed by monitoring the current flow through power source 2504 or 2506 and the leakage current can be sensed by monitoring the current flow through power source 2507 or 2505.

Alternating Read Voltage Polarities

As was described above in reference to FIG. 23A, RE can be active high during a read operation and WE can be active high during a write operation. During read operations to the array 100, it may be desirable to toggle the DIR signal between "0" and "1". Accordingly, a truth table in FIG. 26A depicts one example of logic for toggling DIR during a read operation. In the first row of the truth table, where RE=1 and DIR=0, the row select voltage $V_{SR}$ and the column select voltage $V_{SC}$ are set to $-V_{R1}$ and $+V_{R2}$ respectively. Conversely, in the second row, where RE=1 and DIR=1, the row select voltage $V_{SR}$ and the column select voltage $V_{SC}$ are set to $+V_{R1}$ and $-V_{R2}$ respectively. The control unit 105 can generate and control the toggling of DIR between logic "0" and logic "1" for successive read operations, for example. Reference is now made to FIG. 26B, where the toggling of DIR is depicted over a period of time in which four successive read operations are performed as indicated by a series of four pulses of the RE signal denoted as $1^{st}$, $2^{nd}$, $3^{rd}$, and $4^{th}$. During the period depicted, DIR toggles from 0-to 1 for the 1st RE pulse, DIR is a 0 for the $2^{nd}$ RE pulse, DIR toggles from 0-to-1 for the $3^{rd}$ RE pulse, and DIR is a 0 for the $4^{th}$ RE pulse.

One advantage to toggling DIR is that the polarity of the read voltages applied to selected memory cells 10' is not always of the same polarity. Alternating read voltage polarity during a pre-read can reduce or eliminate data corruption caused by read disturbs in certain types of memory elements 10. A read disturb is caused by multiple read operations to a memory element 10 using a read voltage of unchanging polarity (e.g., $+V_{R1}$ and $-V_{R2}$). After several thousand or more read operations to the same memory element 10, the resistive state of the memory element 10 can be slowly degraded such that an accurate reading of the resistive state is not possible.

For example, if the memory element 10 is in the first resistive state of $R_0 \approx 1$ M$\Omega$, then after one-million read operations to that memory element 10 using the same read voltage (e.g., $+V_{R1}$ and $-V_{R2}$), the read disturb may result in a gradual degradation in $R_0$ from 1 MD to 0.8 MD. Consequently, during subsequent read operations to the same memory element 10, it may not be possible to accurately determine whether or not the stored data in the memory element 10 is a logic "0" or a logic "1". By alternating read voltage polarity, the average read disturb over time is approximately zero because approximately fifty-percent of the read operations apply read voltages of $+V_{R1}$ and $-V_{R2}$ and approximately fifty-percent of the read operations apply read voltages of $-V_{R1}$ and $+V_{R2}$.

Although the above example illustrates the toggling of DIR in conjunction with a read operation, one skilled in the art will appreciate that alternating read voltages can be accomplished using signals other than DIR or using other signals in conjunction with DIR. For example, in that pre-reading can occur for a read operation or a write operation (i.e., to prevent the writing of redundant data), the pre-read signal PR can be used to effectuate the toggling of DIR. Moreover, for write operation where WE=1 and RE=0, the PR signal can be used to initiate a pre-read of the selected memory element 10' to determine whether or not to abort or consummate the write operation. The pre-read signal PR can also initiate the toggling of DIR so that pre-reads during a write operation use alternating read voltages for the reasons set forth above.

Reference is now made to FIG. 27 where an example of a pre-read during either a read operation or a write operation depicts a first rising edge 2703 on PR resulting in DIR rising to a logic "1", a second rising edge 2705 on PR resulting in DIR falling to a logic "0", and a third rising edge 2707 on PR resulting in DIR rising to a logic "1". Therefore, over a course of three assertions of PR, the signal DIR toggles from 1-to-0 and then from 0-to-1. Consequently, during the pre-read, the average read disturb over time is approximately zero because approximately fifty-percent of the read operations apply read voltages of $+V_{R1}$ and $-V_{R2}$ and approximately fifty-percent of the read operations apply read voltages of $-V_{R1}$ and $+V_{R2}$. As was mentioned above, the DIR signal can be eliminated and PR or some other signal can be used to effectuate alternating the read voltage polarities.

Two-Cycle Pre-Read Operation

The signals that represent the leakage current $I_L$ and the total current $I_T$ can be sensed in two-cycles. During both cycles, the currents $I_L$ and $I_T$ are sensed flowing through the same selected conductive trace (i.e., 1' or 2'). Each of the currents $I_L$ and $I_T$ can be stored after being sensed so that the leakage current $I_L$ and the total current $I_T$ can be compared to each other. Preferably, the currents $I_L$ and $I_T$ are converted to voltages and then stored. Subsequently, a comparator can be used to compare a voltage equivalent of $I_L$ with a voltage equivalent of $I_T$. For example, the comparator can subtract the voltage equivalent of $I_L$ from voltage equivalent of $I_T$ to generate a signal indicative of the read current $I_R$ and that signal can be compared with $R_{SIG}$ to generate the data signal $R_{DATA}$. As another example, as was described above, a property of a device (e.g., logic threshold voltage or a trip point of a logic gate) combined with a signal can be used to generate the data signal $R_{DATA}$.

First Cycle Current Sensing

Figure 28A:
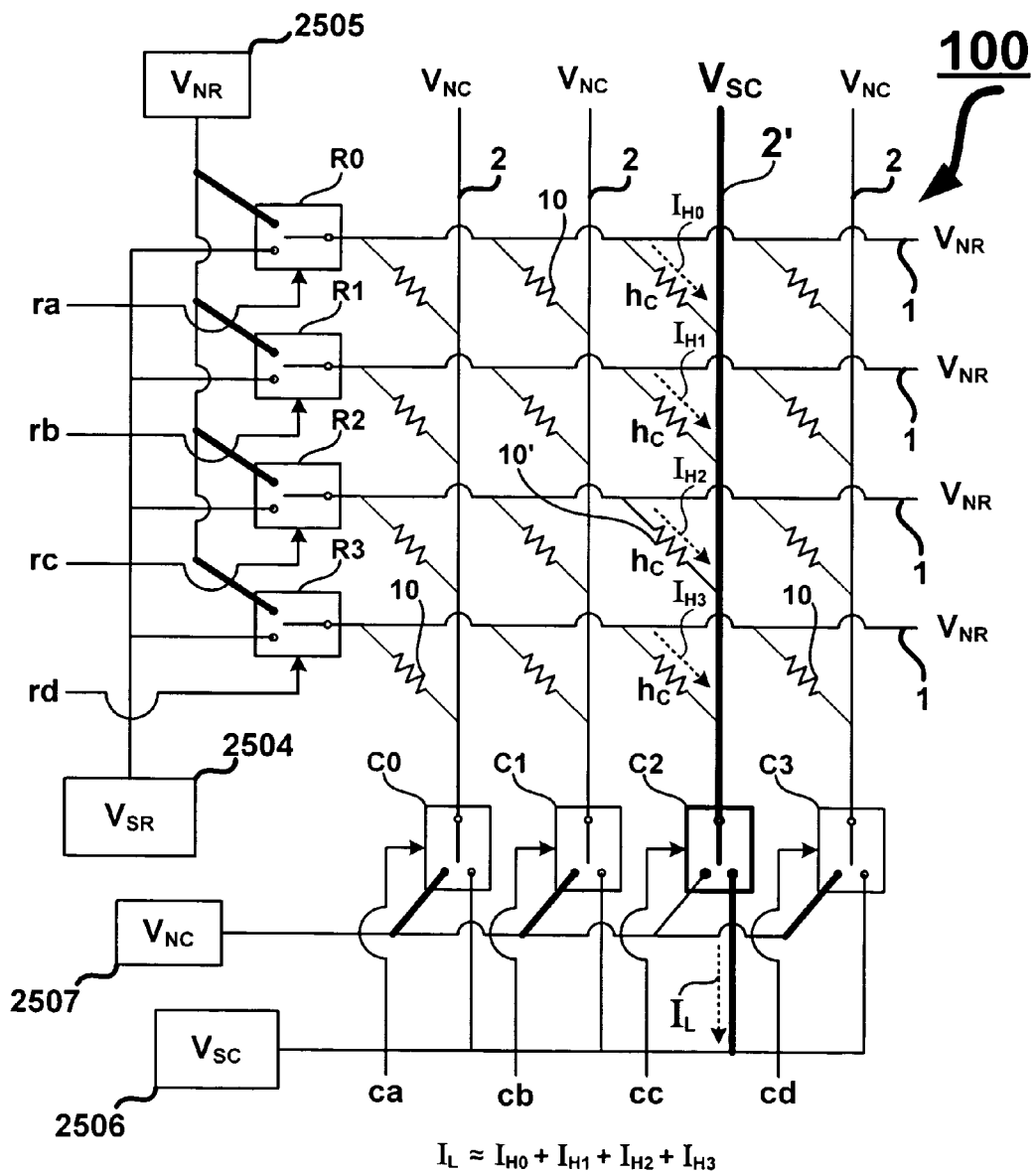
FIG. 28A is a schematic view depicting current flow in a first cycle of a two-cycle pre-read operation.

Turning to FIG. 28A, a first cycle of an exemplary two-cycle pre-read operation includes the address unit 101 receiving the address ADDR during a read operation. As was described above, the address ADDR can include the row address 2203 received by the row decoder 2251 and the column address 2205 received by the column decoder 2253. In that the currents $I_L$ and $I_T$ are sensed flowing through the same selected conductive trace in both the first and second cycles, during the first cycle, either the row decoder 2251 selects one of the first conductive traces 1' in the rows of the array 100 and both currents $I_L$ and $I_T$ are sensed flowing through the selected first conductive trace 1' or the column decoder 2253 selects one of the second conductive traces 2' in the columns of the array 100 and both currents $I_L$ and $I_T$ are sensed flowing through the selected second conductive trace 2'.

In the embodiment depicted in FIG. 28A, the currents $I_L$ and $I_T$ are sensed flowing through the selected second conductive trace 2'. Accordingly, the address ADDR selects the $10^{th}$ memory element 10' (i.e., m10 at r2, c2) and the column decoder 2253 selects second conductive trace 2' based on the bits for the column address 2205 being set to b[3:2]=10. Consequently, the power source 2506 applies the column select voltage $V_{SC}$ to the selected second conductive trace 2' at a read voltage magnitude (e.g., $+V_{R2'}$ or $-V_{R2'}$). In a truth table in FIG. 28A, during the first cycle with b[3:2]=10, the non-select voltage $V_{NR}$ is applied to all of the first conductive traces 1 and the non-select voltage $V_{NC}$ is applied to the remaining second conductive traces 2. As a result, memory elements m2, m6, m10, and m14 have one of their terminals (i.e., 11) connected with the non-select voltage $V_{NR}$ and the other of their terminals (i.e., 12) connected with the select voltage $V_{SC}$, such that those memory elements are half-selected memory elements hc through which half-select currents $I_{H0}$, $I_{H1}$, $I_{H2}$, and $I_{H3}$ flow. The leakage current $I_L$ approximately is the sum of the half-select currents (i.e., $I_L=I_{H0}+I_{H1}+I_{H2}+I_{H3}$). It should be noted that during the first cycle of the two-cycle pre-read operation, the $10^{th}$ memory element 10' (i.e., m10) is also a half-selected memory element hc (i.e., it is not fully selected during the first cycle).

Second Cycle Current Sensing

Figure 28B:
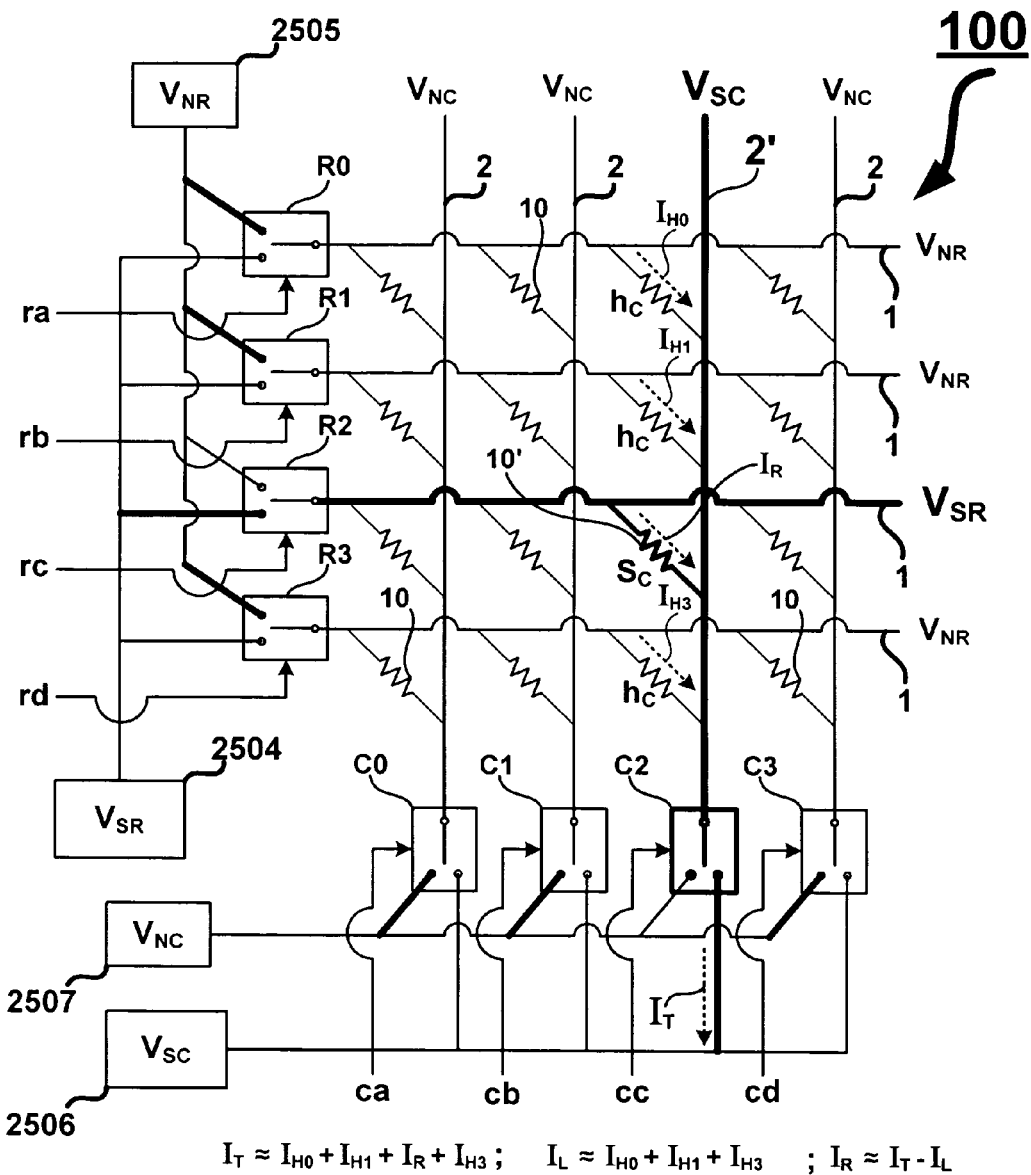
FIG. 28B is a schematic view depicting current flow in a second cycle of the two-cycle pre-read operation.

Turning now to FIG. 28B, in a second cycle, bits b[1:0]= 10 of the row address 2203 result in the row select voltage $V_{SR}$ being applied to a selected first conductive trace 1' such that the $10^{th}$ (i.e., m10) memory element 10' is a fully selected memory element Sc and has appropriate read voltages applied across both of its terminals 11 and 12 (e.g., $+V_{R1}'$ and $-V_{R2}'$). Therefore, during the second cycle, the read current $I_R$ flows through the selected memory element 10' and the total current $I_T$ flowing through the selected second conductive trace 2' approximately is the sum of the read current $I_R$ and the remaining half-select currents $I_{H0}$, $I_{H1}$, and $I_{H3}$ such that $I_T \approx I_{H0} + I_{H1} + I_R + I_{H3}$. The read current $I_R$ can be determined by taking the difference between the total current $I_T$ and the leakage current $I_L$, that is, the read current $I_R$ approximately is $I_R = I_T - I_L$.

Sensing Leakage Current and Total Current

Figure 28C:
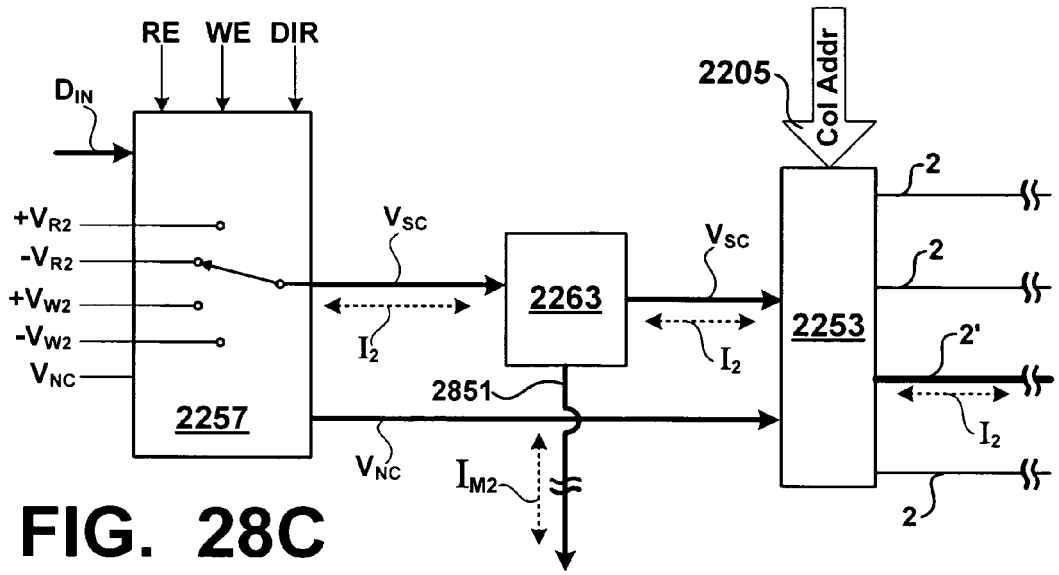
FIG. 28C is a block diagram depicting one embodiment of a sense unit.

In FIG. 28C, an exemplary circuit for sensing the total current $I_T$ and the leakage current $I_L$ includes a current mirror circuit connected in series with the power source that supplies the read voltage to the selected conductive trace (i.e., 1' or 2'). The current mirror circuit is used for sensing the magnitudes of both the total current $I_T$ and the leakage current $I_L$. Therefore, in FIG. 28C, a column current mirror 2263 is electrically in series with the column switch 2257 and column decoder 2253. A current $I_2$ represents current that flows through the selected second conductive trace 2' during the first and second cycles of the two-cycle pre-read operation. A mirrored current $I_{M2}$ represents a mirrored current that is output by the column current mirror 2263 at a node 2851. Therefore, during the first cycle, the mirrored current $I_{M2}$ is approximately equal to the leakage current $I_L$ (i.e., $I_{M2} \approx I_L$) and during the second cycle the mirrored current $I_{M2}$ is approximately equal to the total current $I_T$ (i.e., $I_{M2} \approx I_T$).

Storing and Comparing Signals

Figure 28D:
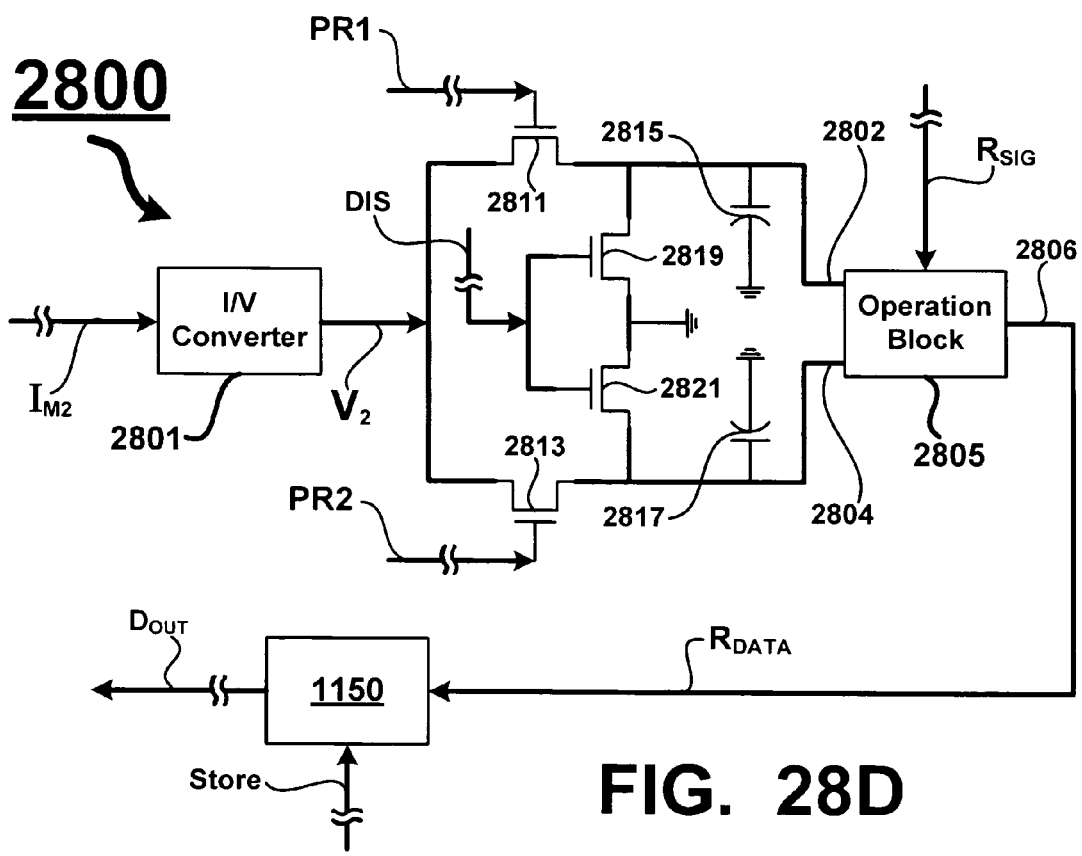
FIG. 28D is a schematic view depicting an exemplary circuit for leakage error correction for a two-cycle pre-read operation.

Reference is now made to FIG. 28D where an exemplary circuit 2800 for comparing the leakage current $I_L$ and the total current $I_T$ includes an I/V converter 2801 that receives the mirrored current $I_{M2}$ and converts the mirrored current $I_{M2}$ into an output voltage $V_2$. The voltage $V_2$ is connected with the input terminals of FET 2811 and FET 2813. Signals PR1 and PR2 are connected with the gate terminals of FET 2811 and FET 2813, respectively. During the first cycle, the signal PR1 turns FET 2811 on and the signal PR2 turns FET 2813 off. Therefore, when the FET 2811 is on, the voltage $V_2$ charges a capacitor 2815 that is connected with an output terminal of the FET 2811. The signal PR1 is held active (e.g., is a logic 1) long enough for capacitor 2815 to charge to a level of the voltage $V_2$. Accordingly, a voltage equivalent to the leakage current $I_L$ is applied to a first terminal 2802 of an operation block 2805.

Similarly, during the second cycle, the signal PR2 goes active (e.g., is a logic 1) turning on FET 2813 and the signal PR1 goes inactive (e.g., is a logic 0) turning off FET 2811 thereby preserving charge in the capacitor 2815 and the voltage applied to the first terminal 2802. Therefore, when the FET 2813 is on, the voltage $V_2$ charges a capacitor 2817 that is connected with an output terminal of the FET 2813. The signal PR2 is held active long enough for capacitor 2817 to charge to a level of the voltage $V_2$. Accordingly, a voltage equivalent to the total current $I_T$ is applied to a second terminal 2804 of the operation block 2805.

The operation block 2805 operates on voltage equivalents of the total current $I_T$ and leakage current $I_L$, and optionally, other signals (e.g., $R_{SIG}$), to generate the data signal $R_{DATA}$ on an output node 2806. Generation of the data signal $R_{DATA}$ by the operation block 2805 will be application specific and will depend on which signals in addition to those on the terminals 2802 and 2804 are coupled with the operation block 2805. As one example, the operation block 2805 can subtract the voltages at first and second the terminals 2802 and 2804 from each other to generate the data signal $R_{DATA}$. The output signal 706 can be connected with an input terminal of the storage unit 1150 as was described above.

Preferably, before the first cycle begins, a signal DIS is asserted to discharge the capacitors 2815 and 2817 to an approximately equal potential so that voltages on the first and second terminals 2802 and 2804 are equalized (e.g., are approximately 0 Volts or approximately equal voltages). The DIS signal is connected to the gate terminals of FET 2819 and FET 2821. The input terminals of FET 2819 and FET 2821 are connected to a ground potential and the output terminals of FET 2819 and FET 2821 are connected with the first and second terminals 2802 and 2804 of the operation block 2805, respectively. Therefore, when the signal DIS goes active (e.g., is a logic 1), the capacitors 2815 and 2817 discharge prior to the start of the first cycle. Additionally, the nodes 2802 and 2804 can also be equalized by an FET while the DIS signal is active, to ensure that these two nodes are at the same value before the beginning of the two read cycles.

Optionally, the operation block 2805 can receive the reference signal $R_{SIG}$ and the voltages at the first and second terminals 2802 and 2804 can be used in conjunction with the reference signal $R_{SIG}$ to derive the data signal $R_{DATA}$. As one example, the voltages at the first and second terminals 2802 and 2804 can be subtracted from each other to generate a difference signal that is compared with the reference signal $R_{SIG}$ to generate the data signal $R_{DATA}$. As another example, the voltage at the first terminal 2802 and the reference signal $R_{SIG}$ can be added to each other and the sum compared with the voltage at the second terminal to generate the data signal $R_{DATA}$. Preferably, the signals received by the operation block 2805 are in the voltage domain.

Figure 28E:
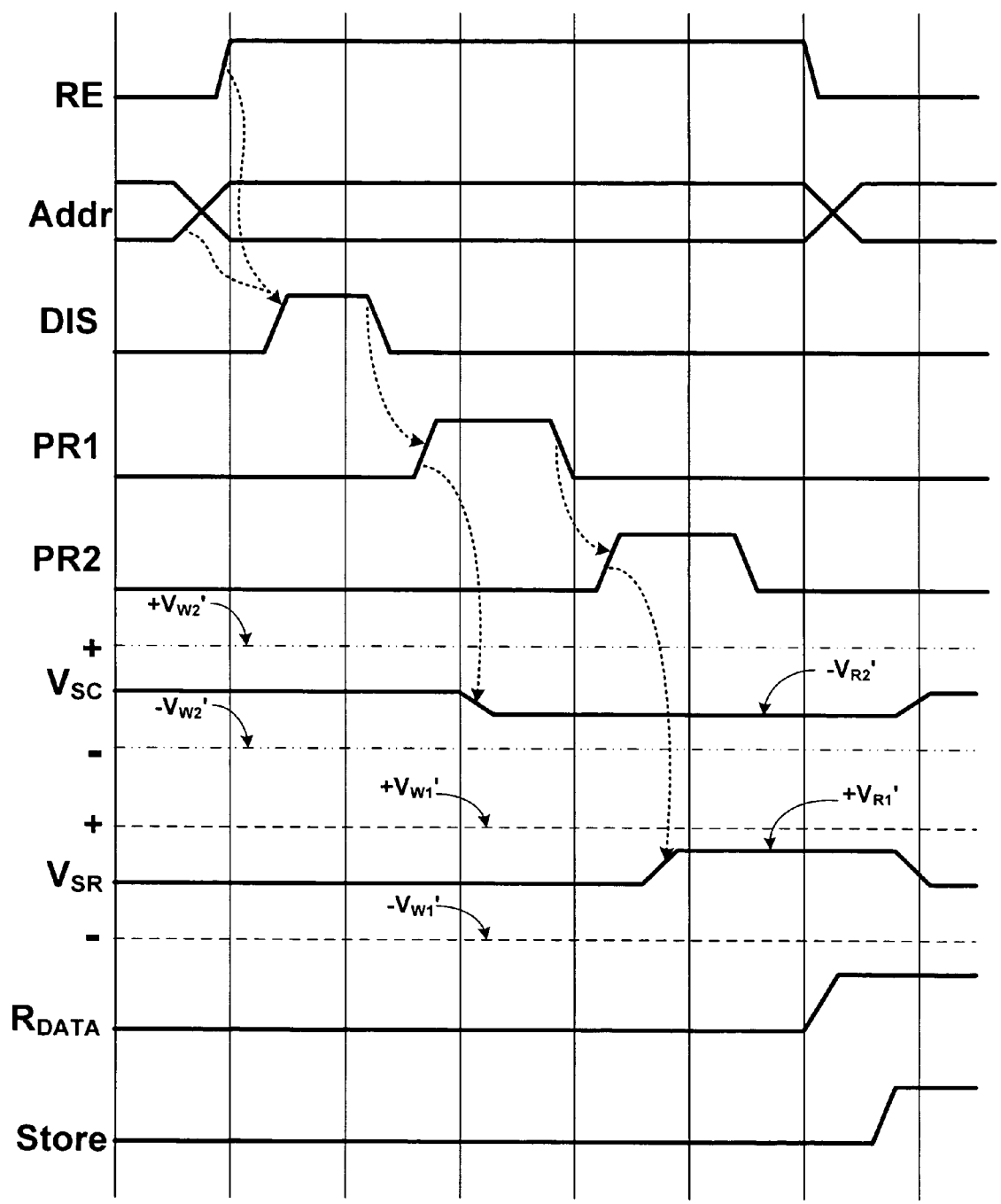
FIG. 28E is a timing diagram depicting a two-cycle pre-read operation.

FIG. 28E depicts an exemplary timing diagram for a two-cycle pre-read operation. The two-cycle pre-read operation is initiated by a high transition on the read enable signal RE and a stable read address on ADDR. The transition on RE causes the discharge signal DIS to go active thereby discharging the capacitors 2815 and 2817. A falling edge on the signal DIS initiates the first cycle and the signal PR1 goes active resulting in the read voltage $-V_{R2}'$ being applied to the selected second conductive trace 2'. The resulting leakage current $I_L$ flowing through the selected second conductive trace 2' is converted to the voltage $V_2$ and charges the capacitor 2815 via the FET 2811. A falling edge on PR1 initiates the second cycle and the signal PR2 goes active resulting in the read voltage $+V_{R1}'$ being applied to the selected first conductive trace 1'. The resulting total current $I_T$ flowing through the selected second conductive trace 2' is converted to the voltage $V_2$ and charges the capacitor 2817 via the FET 2813. The capacitor 2815 applies a voltage that is equivalent to the leakage current $I_L$ to the first terminal 2802 and the capacitor 2817 applies a voltage that is equivalent to the total current $I_T$ to the second terminal 2804. Subsequent to PR1 and PR2 going inactive, FET 2811 and FET 2813 are turned off to prevent charge from draining out of the capacitors 2815 and 2817 so that the voltages at terminals 2802 and 2804 are stable. Consequently, the operand block 2805 generates the data signal. The Store signal can be pulsed to store the value of $R_{DATA}$ in the storage unit 1150.

Those skilled in the art can appreciate that the apparatus 150 may include arrays 100 that are configured into one or more memory banks. A memory bank can provide read/write access to one bit of data or multiple bits of data. If one bit of data is accessed, the memory bank can be referred to as a bit block. Turning now to FIG. 28F, the apparatus 150 includes two memory banks 2850 and 2860. Some of the circuitry previously depicted in apparatus 150 and the arrays 100 have been omitted in order to explain two-cycle pre-read operation for multi-bit memory banks. The memory banks 2850 and 2860 are multi-bit banks with each bank partitioned into two portions as denoted by a dashed line that defines partitions 2851 and 2853 in bank 2850 and partitions 2861 and 2863 in bank 2860. The banks 2850 and 2860 with their associated partitions (2851, 2853 and 2861, 2863) provide two-cycle pre-read access to data in four memory cells. For example, if a word is 4-bits wide, and each memory cell holds a single bit, one word can be read from or written to the banks 2850 and 2860.

Current Sensing

An exemplary means for sensing the currents $I_T$ and $I_L$ is to use a current mirror circuit. Referring back to FIG. 22, an exemplary sense unit 103 includes a row current mirror 2261 and a column current mirror 2253. The row current mirror 2261 is electrically in series with the row switch 2255 and the row decoder 151. The column current mirror 2263 is electrically in series with the column switch 2257 and the column decoder 2253. The mirrored currents $I_{MT1}$ and $I_{ML2}$ depict one embodiment where $I_{MT1}$ is the mirrored total current and is substantially equal to the total current $I_T$ flowing through the selected first conductive trace 1'; whereas, $I_{ML2}$ is the mirrored leakage current flowing through unselected second conductive traces 2 and is substantially equal to the leakage current $I_L$. Accordingly, the mirrored currents $I_{MT1}$ and $I_{ML2}$ are output as the total current $I_T$ and the leakage current $I_L$ by the sense unit 103 and those currents serve as inputs to the data unit 1130.

Turning now to FIG. 29A, where exemplary row and column current mirrors 2261 and 2263 are depicted in greater detail. The row voltage switch 2255 selects read voltage $+V_{R1}$ (i.e., for a read operation) and the row decoder 2251 applies the read voltage $+V_{R1}$ to the selected first conductive trace 1'. The row decoder 2251 also applies the non-select voltage $V_{NR}$ to the unselected first conductive traces 1. The row current mirror 2261 is electrically in series with the row voltage switch 2255 and the row decoder 2251 so that the current flowing from the power source 2504 (see FIG. 25A) that supplies the select voltage $V_{SR}$ (e.g., $+V_{R1}$) can be mirrored. Therefore, the total current $I_T$ from the power source 2504 that supplies the select voltage $V_{SR}$, flows through the row voltage switch 2255, the row current mirror 2261, the row decoder 2251, and through the selected first conductive trace 1'. The total current $I_T$ is mirrored by the row current mirror 2261 and is output as a mirrored total current $I_{MT1}$ on a node 2903. In FIG. 22, the node 2903 connects with the data unit 1130 and is denoted by the heavy solid line for $I_{MT1}$.

Column voltage switch 2257 selects the read voltage $-V_{R2}$ and the column decoder 2253 applies the read voltage $-V_{R2}$ to the selected second conductive trace 2'. The column decoder 2253 also applies the non-select voltage $V_{NC}$ to the unselected second conductive traces 2. The column current mirror 2263 is electrically in series with the column voltage switch 2257 and the column decoder 2253 so that the current flowing from the power source 2507 (see FIG. 25A) that supplies the non-select voltage $V_{NC}$ can be mirrored. Therefore, the leakage current $I_L$ from the power source 2507 that supplies non-select voltage $V_{NC}$, flows through the column voltage switch 2257, the column current mirror 2263, the column decoder 2253, and through the unselected second conductive traces 2. The leakage current $I_L$ is mirrored by the column current mirror 2263 and is output as a mirrored total leakage current $I_{ML2}$ on a node 2905. In FIG. 22, the node 2905 connects with the data unit 1130 and is denoted by the heavy solid line for $I_{ML2}$.

Reference Signal Generation

The reference signal $R_{SIG}$ can be generated by a reference generator 1140 that outputs the reference signal $R_{SIG}$ as a current or a voltage. One means of generating the reference signal $R_{SIG}$ is to use a constant current source or a constant voltage source. If $R_{SIG}$ is a current, then an I/V converter (e.g., 1401 in FIG. 14) can be used to convert $R_{SIG}$ to a voltage (e.g., $V_{SIG}$). $R_{SIG}$ can be generated by an off-chip reference source and supplied to the apparatus 150 via an input pad, for example. Preferably, the reference signal $R_{SIG}$ is internally generated as opposed to being externally generated (i.e., off-chip via an input pad).

Figure 30A:
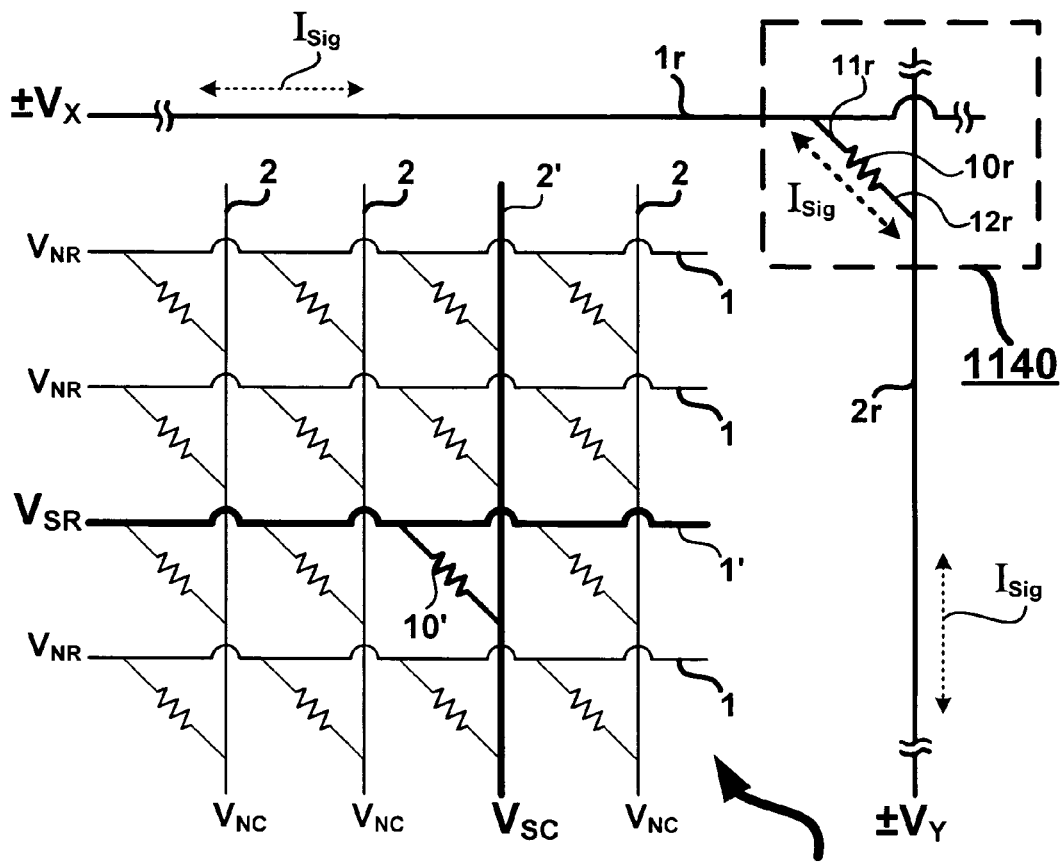
FIG. 30A is a schematic view depicting one embodiment of a reference generator.

Alternatively, in FIG. 30A, the reference generator 1140 comprises a reference memory element 10r with a reference resistance $R_R$. The reference resistance $R_R$ can be fixed at a predetermined value or the reference resistance $R_R$ can be programmed to a desired valued. The desired value for the reference resistance $R_R$ can be intermediate between the high and low resistance states $R_0$ and $R_1$, for example. The reference memory element 10r includes a first terminal 11r connected with a first conductive trace 1r and a second terminal 12r connected with a second conductive trace 2r. The reference memory element 10r is electrically in series with the first terminal 11r and the second terminal 12r and is also electrically in series with the first conductive trace 1r and the second conductive trace 2r. The reference memory element 10r, the terminals 11r and 12r, and the conductive traces 1r and 2r can be integrated with the array 100. The first conductive trace 1r can be associated with the x-axis direction of the first conductive traces 1 in the rows and the second conductive trace 2r can be associated with the y-axis direction of the second conductive traces 2 in the columns. During a pre-read operation, a reference voltage is applied across the first and second conductive traces 1r and 2r so that a reference current $I_{SIG}$ flows through the reference memory element 10r. For example, the reference voltage can include an x-direction voltage $V_X$ applied to the first conductive trace 1r and a y-direction voltage $V_Y$ applied to the second conductive trace 2r. The voltages ($V_X$, $V_Y$) can have opposite polarities and can have magnitudes that are approximately equal. For example, the magnitudes and polarities of $V_X$ and $V_Y$ can be the same as those for the read voltage $V_R$ as described above.

Figure 30B:
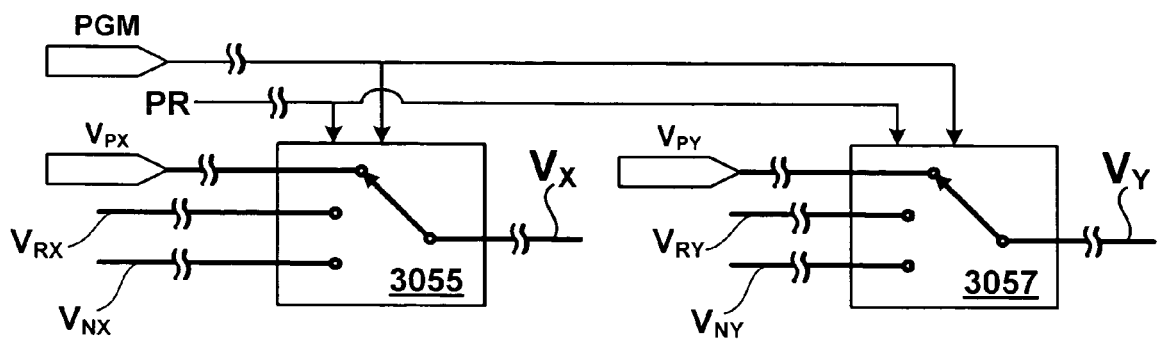
FIG. 30B is a schematic view depicting one embodiment of row and column voltage switches.

In FIG. 30B, a voltage switch 3055 selects between a x-direction reference voltage $V_{RX}$, a x-direction non-select voltage $V_{NX}$, and a x-direction programming voltage $V_{PX}$ based on a value of a pre-read signal PR and a program signal PGM. A truth table depicts one example of logic for the switch 3055. Accordingly, with PGM=0, the x-direction voltage $V_X=V_{NX}$ when PR=0 and the x-direction voltage $V_X=V_{RX}$ when PR=1. Similarly, a voltage switch 3057 selects between a y-direction reference voltage $V_{RY}$, a y-direction non-select voltage $V_{NY}$, and a y-direction programming voltage $V_{PY}$ based on the value of the pre-read signal PR and the program signal PGM. A truth table depicts one example of logic for the switch 3057. Accordingly, with PGM=0, the y-direction voltage $V_Y=V_{NY}$ when PR=0 and the y-direction voltage $V_Y=V_{RY}$ when PR=1. Therefore, when PR=1 the reference current $I_{SIG}$ flows through the reference memory element 10r because of a potential difference of $|V_{RX}-V_{RY}|$ across the first and second conductive traces 1r and 2r. For the same reasons described above for the first and second conductive traces 1 and 2, it may also be desirable to prevent the first and second conductive traces 1r and 2r from floating during a read operation to the array 100. During a write operation to the array 100, the first and second conductive traces 1r and 2r may be allowed to float. Therefore, when PR=0, the non-select voltages $V_{NX}$ and $V_{NY}$ are applied to the first and second conductive traces 1r and 2r. The non-select voltages $V_{NX}$ and $V_{NY}$ can be identical to the non-select voltages $V_{NR}$ and $V_{NC}$, and the reference voltages $V_{RX}$ and $V_{RY}$ can be identical to the select voltages $V_{SR}$ and $V_{SC}$.

Programming the desired value for the reference resistance $R_R$ can be accomplished by applying an appropriate programming voltage across the first and second conductive traces 1r and 2r of the reference memory element 10r. A magnitude and polarity of the programming voltage can be selected to set the desired value for the reference resistance $R_R$. For example, the programming voltage can be two separate voltages $V_{PX}$ and $V_{PY}$. Programming voltages $V_{PX}$ and $V_{PY}$ can be internally generated in the apparatus 150 or they can be supplied by an external voltage source connected with the apparatus 150 by input pads, for example. Moreover, the programming of the reference resistance $R_R$ can occur during a manufacturing process for the apparatus 150 or a system that includes the apparatus 150. As one example, automatic test equipment (ATE) can be used to apply test vectors to the apparatus 150 and voltage sources coupled with the ATE can be used to supply the programming voltages $V_{PX}$ and $V_{PY}$ to pads on the apparatus 150 to program the desired value for the reference resistance $R_R$. For example, when the apparatus 150 is in a test mode or a programming mode, the program signal PGM can be active high (i.e., PGM=1) and based on the truth table in FIG. 30B the voltage switches 3055 and 3057 select programming voltages $V_{PX}$ and $V_{PY}$ respectively and those voltages are applied to the first and second conductive traces 1r and 2r. The program signal PGM can be internally generated by the apparatus 150 based on a value of some other signal or the program signal PGM can be externally generated and supplied to the apparatus 150 via an input pad, for example. A software program can control the magnitude and the polarity of the programming voltages $V_{PX}$ and $V_{PY}$ generated by the voltages sources within the ATE. The ATE can also be used to sense current flowing through the reference memory element 10r during programming or after programming to determine whether or not the desired value for the reference resistance $R_R$ has been obtained.

Reference Signal Sensing

Figure 31:
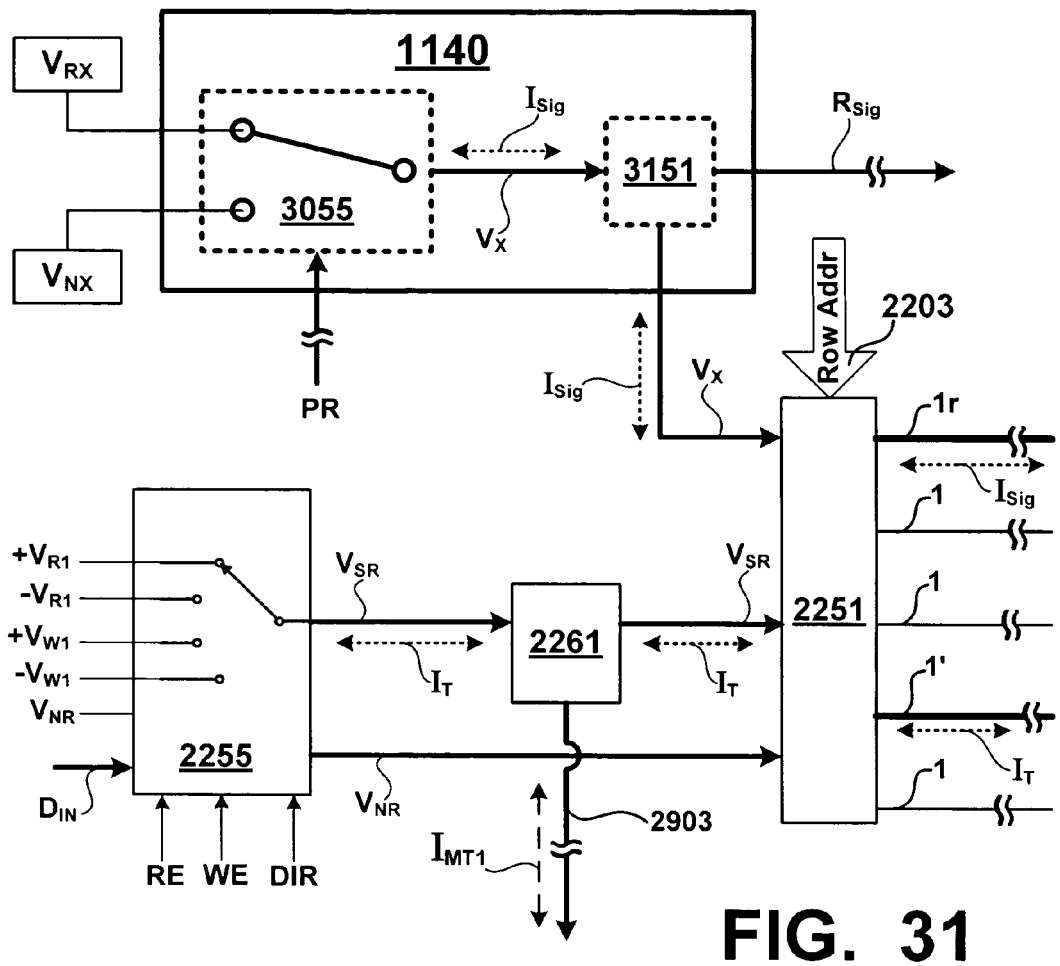
FIG. 31 is a block diagram depicting another embodiment of a reference generator.

A current mirror can also be used to sense the reference current $I_{SIG}$ and to generate the reference signal $R_{SIG}$. For example, in FIG. 31, the reference generator 1140 includes an x-direction current mirror 3151 coupled with the voltage switch 3055 and the row decoder 2251. During the pre-read operation, with PR=1, the reference current $I_{SIG}$ that flows from the x-direction reference voltage $V_{RX}$ is mirrored by the x-direction current mirror 3151 and is output as the reference signal $R_{SIG}$. The reference signal $R_{SIG}$ can be converted to a voltage using an I/V converter as was described above. In this example, the total current $I_T$ flowing through the selected first conductive trace 1' is mirrored by the current mirror 2261 and is sensed by the sense unit 103. The pads used for programming the reference resistance $R_R$ may be used for some other function when the apparatus 150 is not in the test mode or program mode.

Reference Resistance

A value for the reference resistance $R_R$ for the reference memory element 10r can be selected to fall between the values for the first resistive state $R_0$ and the second resistance state $R_1$. As a first example, if $R_0 \approx 1$ MΩ and $R_1 \approx 100$ kΩ, then the reference resistance $R_R$ can be selected to be about half-way in between the values for $R_0$ and $R_1$ (e.g., $R_R \approx 550$ kΩ). As a second example, the reference resistance $R_R$ can be selected to be approximately half-way on a logarithmic scale such that $R_R \approx 300$ kΩ. As a third example, another method for selecting the value for the reference resistance $R_R$ can be based on selecting desired magnitudes for the read current $I_R$ and the half-select currents $I_H$. For example, in FIG. 30A, if $I_R=10$ µA for the second resistance state $R_1$ and $I_R=1.0$ µA for the first resistive state $R_0$, then the value for the reference resistance $R_R$ can be selected so that $I_{SIG}=5$ µA when a potential difference of $|V_X-V_Y|$ is applied across the conductive traces 1r and 2r. Those skilled in the art will appreciate that some memory elements 10 can be directly programmed to the desired reference resistance $R_R$.

Figure 32:
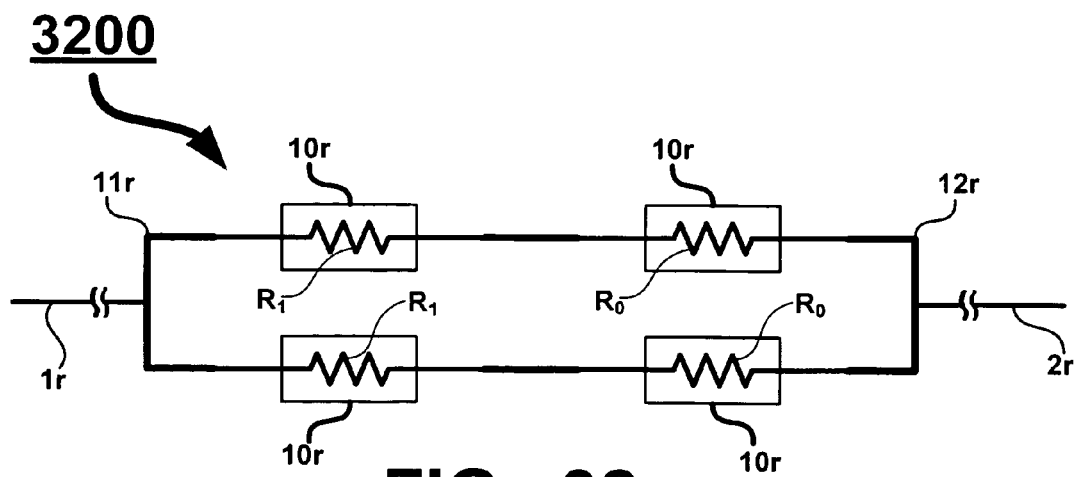
FIG. 32 is a schematic view depicting one example of a reference resistance.

Alternatively, FIG. 32 depicts one embodiment where a plurality of the reference memory elements 10r can be arranged in both serial and parallel to form a resistive circuit 3200 that produce the desired reference resistance $R_R$. The conductive traces 1r and 2r can be connected with nodes 11r and 12r of the resistive circuit 3200. Some of the reference memory element 10r are programmed to the first resistive state $R_0$ and some of the reference memory element 10r are programmed to the second resistive state $R_1$. The resulting reference resistance $R_R$ is determined by the series and parallel resistances of the resistive circuit 3200. The reference memory elements 10r need not be programmed to the first and second resistive states ($R_0$ and $R_1$) and can be programmed to values that are between the first and second resistive states ($R_0$ and $R_1$) or on a logarithmic scale, for example. One skilled in the art will understand that the resistive circuit 3200 need not be configured as depicted in FIG. 32 and that other circuit configurations using different combinations of a plurality of the reference memory elements 10r can be used to obtain a desired value for the reference resistance $R_R$. Moreover, the apparatus 150 may include a plurality of reference resistances $R_R$ that are programmed to predetermined resistance values that can be different from each other.

Method of Sensing Current

The sensing of the total current $I_T$ and the leakage current $I_L$ can be accomplished using hardware, software, or a combination of hardware and software. Software for sensing the currents can be implemented in a computer readable media including but not limited to RAM, ROM, optical disc, magnetic disc, magnetic tape, firmware, communicated over a network electrically, optically, or wirelessly (e.g., a LAN), volatile memory, and non-volatile memory, just to name a few. The software can be code running on a computer such as a PC or a microprocessor, for example.

Figure 33:
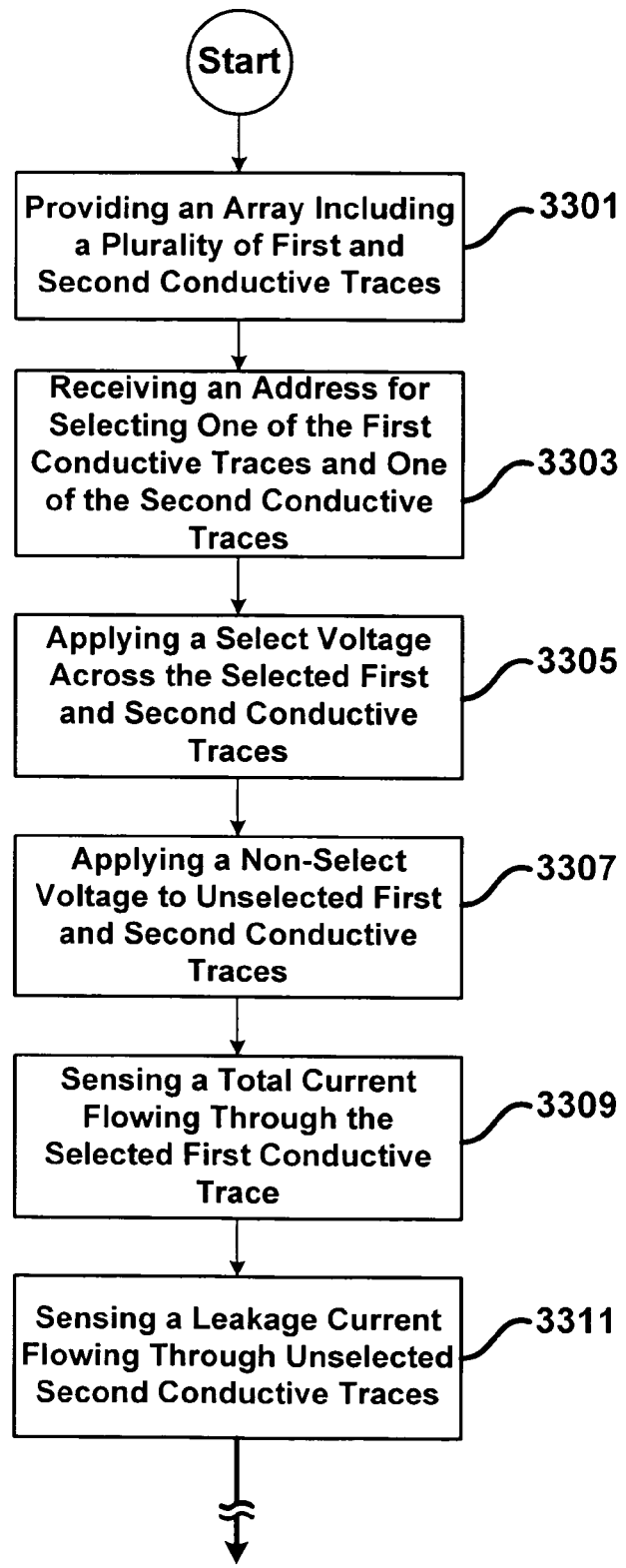
FIG. 33 is a flow diagram depicting a method of sensing current in a two-terminal memory array.

Referring now to FIG. 33, a flow chart depicts a method 3300 for sensing current in a two-terminal memory array. At a stage 3301, the array 100 including a plurality of first and second conductive traces 1 and 2 is provided. Alternatively, at the stage 3301, a plurality of bit-block arrays 100 may be provided (see FIGS. 2C and 2D), with each bit-block array 100 including a plurality of first and second conductive traces 1 and 2. As was described above, the array 100 can be a two-terminal cross-point array. At a stage 3303, an address ADDR is received and is operative to select at least one of the plurality of first conductive traces 1' and at least one of the plurality of second conductive traces 2'. At a stage 3305 a select voltage $V_{SR}$ and $V_{SC}$ is applied across the selected first and second conductive traces 1' and 2'. At a stage 3307, a non-select voltage $V_{NR}$ and $V_{NC}$ is applied to unselected conductive traces 1 and 2. At a stage 3309, a total current $I_T$ flowing through the selected first conductive trace 1' is sensed. At a stage 3311, a leakage current $I_L$ flowing through unselected second conductive traces 2 is sensed. One skilled in the art will understand that at the stage 3309, the total current $I_T$ can be sensed flowing through the selected second conductive trace 2' and at the stage 3311, the leakage current $I_L$ can be sensed flowing through unselected first conductive traces 1.

Figure 33A:
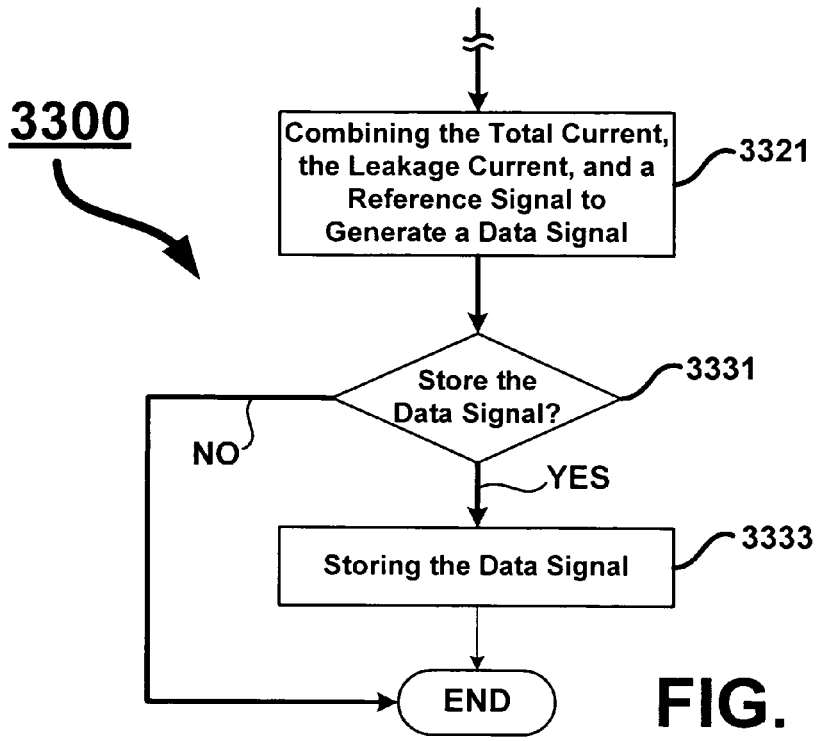
FIG. 33A is a flow diagram depicting a combining step and a storing step.

In FIG. 33A, the method may optionally include, at a stage 3321, combining the total current $I_T$, the leakage current $I_L$, and a reference signal $R_{SIG}$ to generate a data signal $R_{DATA}$. At a stage 3331, a decision to store the data signal $R_{DATA}$ can be implemented. If the YES branch is selected, then at a stage 3333, the data signal $R_{DATA}$ is stored. If the NO branch is selected, then the method terminates. The combining step at the stage 3321 can include additional steps such as adding, subtracting, and comparing steps, for example. The combining step at the stage 3321 can occur after the stage 3311, for example.

Figure 33B:
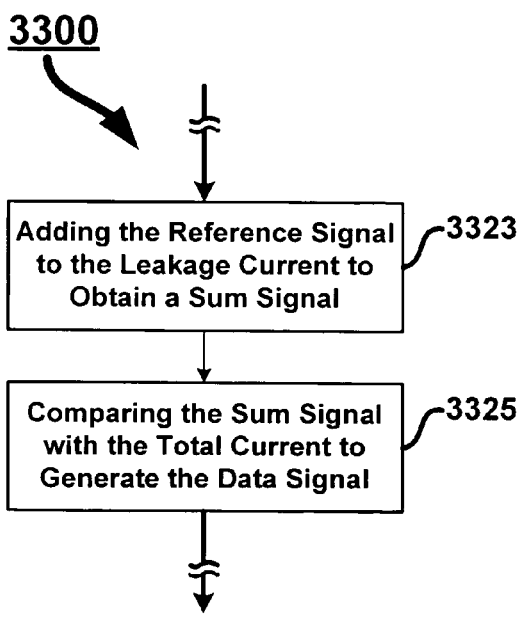
FIGS. 33B and 33C are flow diagrams depicting steps for generating a data signal.

The method 3300 may optionally include an adding step as depicted in FIG. 33B, where at a stage 3323, the reference signal $R_{SIG}$ is added to the leakage current $I_L$ to generate a sum signal SUM. At a stage 3325, the sum signal SUM is compared with the total current $I_T$ to generate the data signal $R_{DATA}$. The adding at the stage 3323 and the comparing at the stage 3325 can be accomplished using the add unit 1211 and the comparator 1213 as described above in reference to FIG. 12A. For example, the stages 3323 and 3325 can occur during or after the stage 3321 and the stage 3331 can occur after the stage 3325.

Figure 33C:
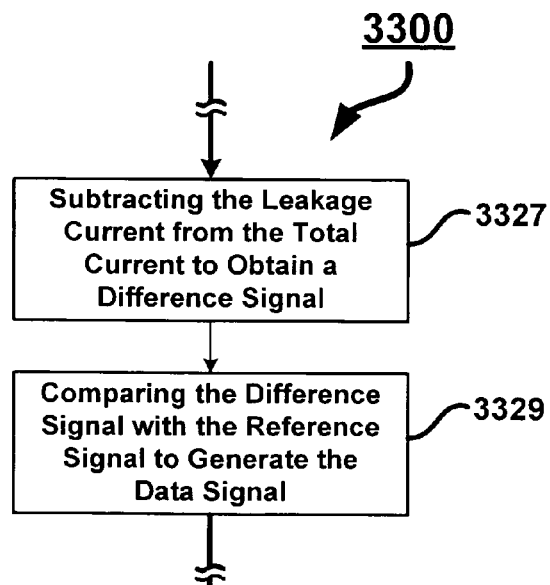

The method 3300 may optionally include a subtracting step as depicted in FIG. 33C, where at a stage 3327, the leakage current $I_L$ is subtracted from the total current $I_T$ to generate a difference signal DIFF. At a stage 3329, the difference signal DIFF is compared with the reference signal $R_{SIG}$ to generate the data signal $R_{DATA}$. The stages 3327 and 3329 can be implemented using the subtract unit 1215 and the comparator 1217 as described above in reference to FIG. 12B. For example, the stages 3327 and 3329 can occur during or after the stage 3321 and the stage 3331 can occur after the stage 3329.

Figure 34:
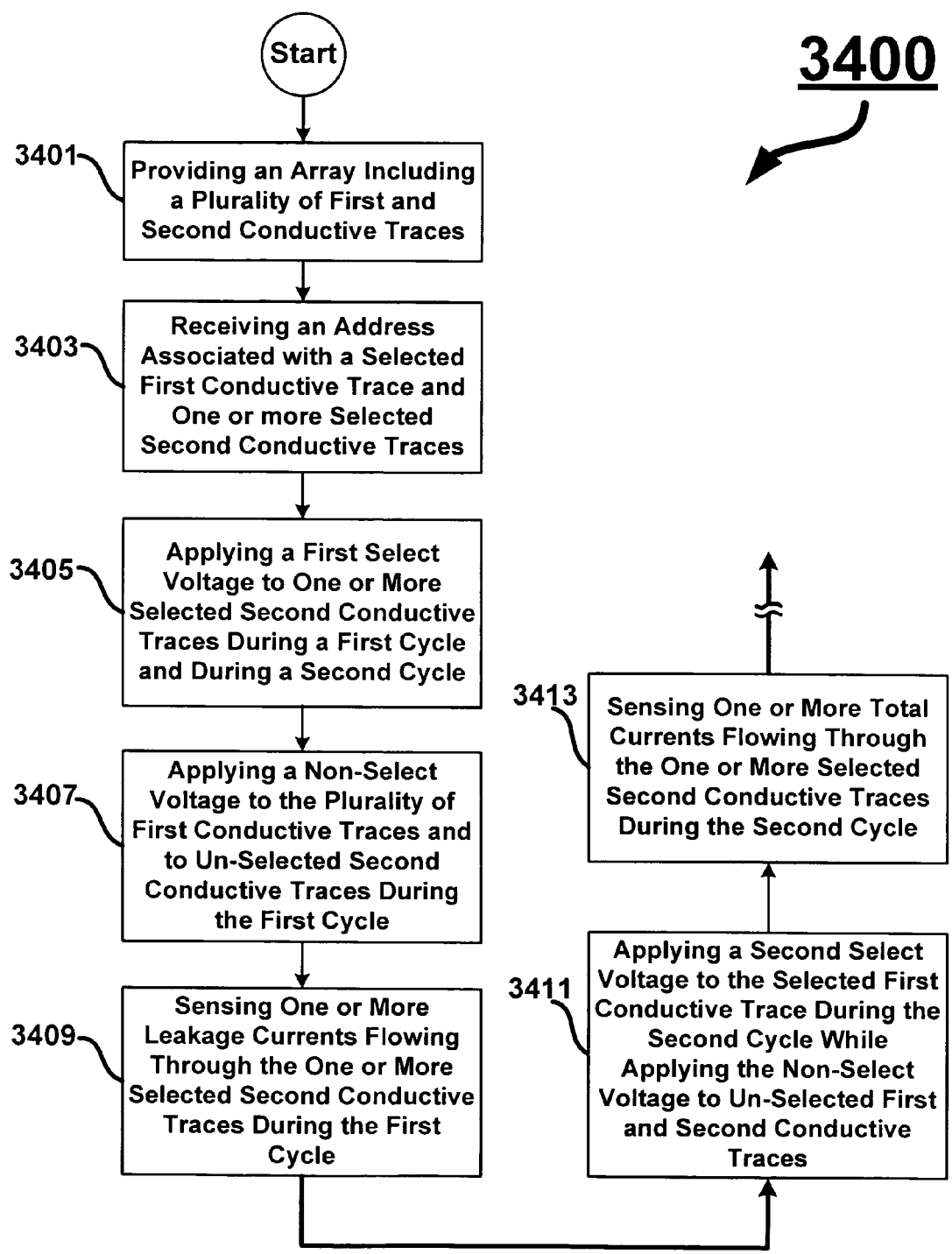
FIG. 34 is a flow diagram depicting a method of sensing current in a two-terminal memory array.

Turning now to FIG. 34, a flow chart depicts a method 3400 for sensing current in a two-terminal memory array. At a stage 3401, the array 100 including a plurality of first and second conductive traces 1 and 2 is provided. Alternatively, at the stage 3401, a plurality of bit-block arrays 100 may be provided (see FIGS. 2C and 2D), with each bit-block array 100 including a plurality of first and second conductive traces 1 and 2. Optionally, the arrays 100 may be configured into memory banks (see 2850 and 2860 in FIG. 28F). As was described above, the arrays 100 can be two-terminal crosspoint arrays. At a stage 3403, an address ADDR is received and the address ADDR is associated with one of the selected first conductive traces 1' and one or more of the selected second conductive traces 2'. At a stage 3405, a first select voltage $V_{SC}$ is applied to the one or more selected second conductive traces 2' during a first cycle and during a second cycle. At a stage 3407, a non-select voltage is applied to the plurality of first conductive traces 1 (e.g., $V_{NR}$) and to un-selected second conductive traces 2 (e.g., $V_{NC}$) during the first cycle. Therefore, during the first cycle, the non-select voltage $V_{NR}$ is applied to all of the plurality of first conductive traces 1; whereas, the non-select voltage $V_{NC}$ is applied to only a subset of the plurality of second conductive traces 2 (see FIG. 28A). At a stage 3409, one or more leakage currents $I_L$ are sensed flowing through the one or more selected second conductive traces 2' during the first cycle.

At a stage 3411, a second select voltage $V_{SR}$ is applied to the selected first conductive trace 1' during the second cycle. Furthermore, during the second cycle, the non-select voltage (e.g., $V_{NR}$ and $V_{NC}$) are applied to the un-selected first and second conductive traces 1 and 2. Therefore, during the second cycle, the second select voltage $V_{SR}$ is applied only to one of the plurality of first conductive traces (i.e., selected conductive trace 1'). A remaining portion of the plurality of first conductive traces 1 are un-selected traces, and the non-select voltage $V_{NR}$ is applied to those un-selected traces. Also during the second cycle, the first select voltage $V_{SC}$ is applied only to the one or more selected second conductive traces 2'. A remaining portion of the plurality of second conductive traces 2 are un-selected traces and the non-select voltage $V_{NC}$ is applied to those un-selected second conductive traces 2 (see FIG. 28B). At a stage 3413, one or more total currents $I_T$ are sensed flowing through the one or more selected second conductive traces 2' during the second cycle.

Figure 34A:
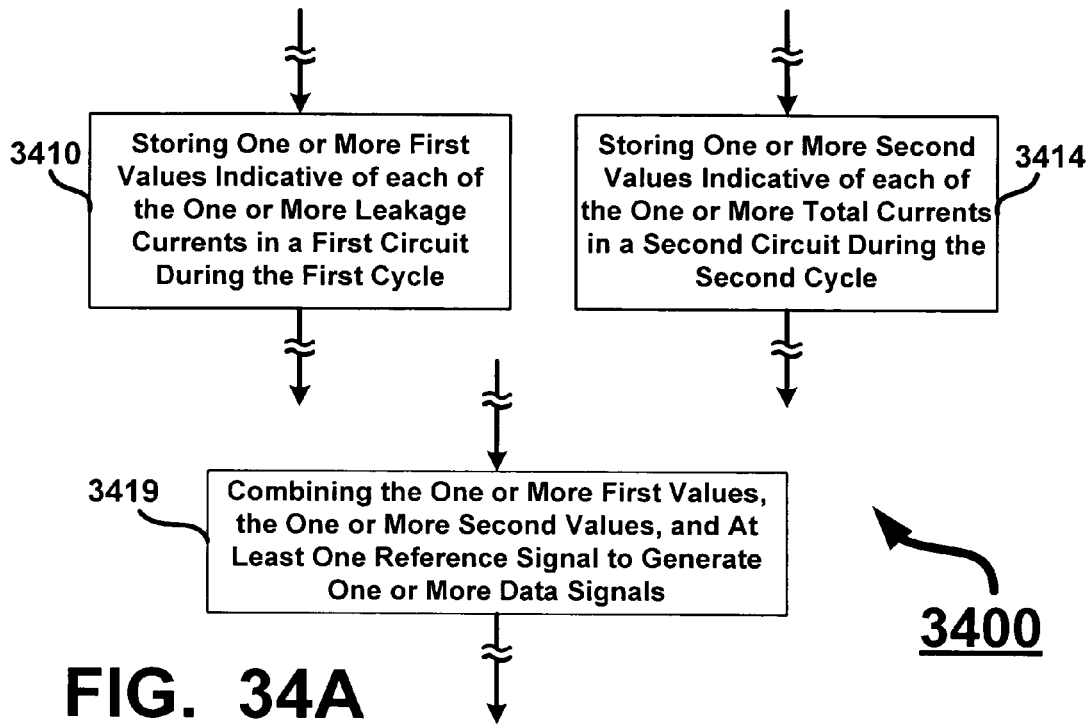
FIG. 34A is a flow diagram depicting storing steps and a combining step.

In FIG. 34A, the method 3400 may optionally include at a stage 3410, storing one or more first values that are indicative of each of the one or more leakage currents $I_L$ in a first circuit. For example, the stage 3410 can occur after the stage 3409. The method 3400 may optionally include at a stage 3414, storing one or more second values that are indicative of the one or more total currents $I_T$ in a second circuit. The stage 3414 can occur after the stage 3413, for example. Furthermore, the method 3400 may optionally include at a stage 3419, combining the one or more first values, the one or more second values, and at least one reference signal $R_{SIG}$ to generate one or more data signals $R_{DATA}$. The stage 3419 can occur after the stage 3414, for example.

Figures 34B, 34C:
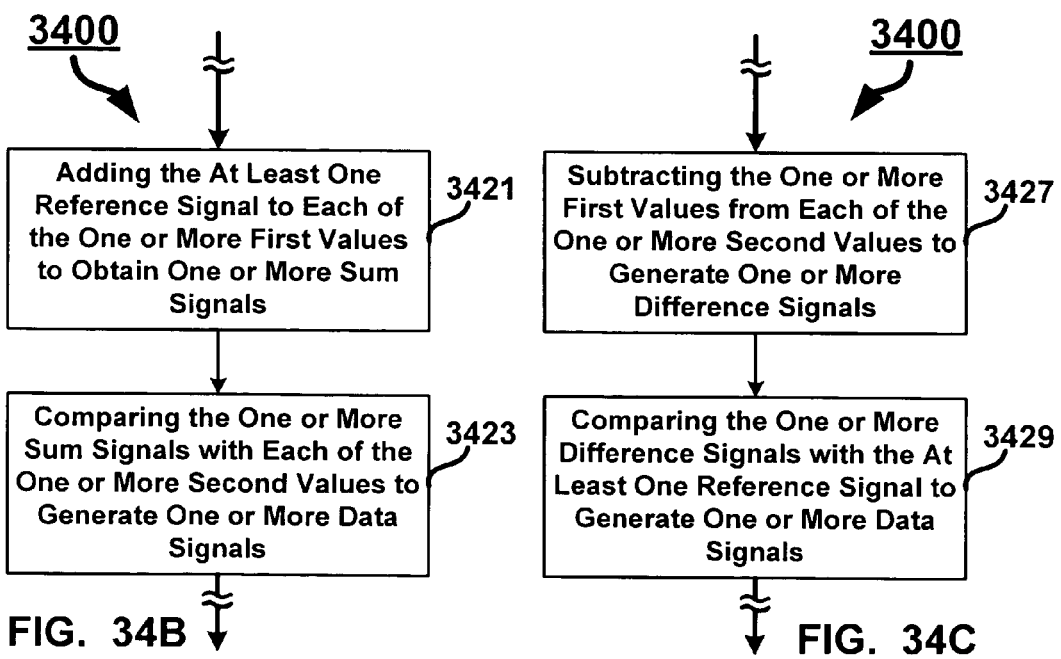
FIGS. 34B and 34C are flow diagrams depicting alternative embodiments of steps for generating one or more data signals.

Referring now to FIG. 34B, the method 3400 may optionally include at a stage 3421, adding the at least one reference signal $R_{SIG}$ to each of the one or more first values to obtain one or more sum signals SUM. At a stage 3423, the one or more sum signals SUM are compared with each of the one or more second values to generate the one or more data signals $R_{DATA}$. The stage 3421 can occur after the stage 3419, for example.

Reference is now made to FIG. 34C, where the method 3400 may optionally include at a stage 3427, subtracting the one or more first values from each of the one or more second values to generate one or more difference signals DIFF. At a stage 3429, the one or more difference signals DIFF are compared with the at least one reference signal $R_{SIG}$ to generate the one or more data signals $R_{DATA}$. The stage 3427 can occur after the stage 3419, for example.

Although several embodiments of an apparatus and a method of the present invention have been disclosed and illustrated herein, the invention is not limited to the specific forms or arrangements of parts so described and illustrated. The invention is only limited by the claims.

What is claimed is:

1. An apparatus for sensing current in a two-terminal memory array, comprising:
an array including a plurality of first conductive traces and a plurality of second conductive traces;
an address unit operative to receive an address, to select one of the plurality of second conductive traces during a first cycle, to apply a first select voltage to the selected second conductive trace and to apply a non-select voltage potential to un-selected traces, to select one of the plurality of first conductive traces during a second cycle, to apply a second select voltage to the selected first conductive trace; and a sense unit operative to sense a leakage current flowing through the selected second conductive trace during the first cycle and to sense a total current flowing through the selected second conductive trace during the second cycle.

2. The apparatus as set forth in claim 1 and further comprising:

a first terminal in communication with the selected first conductive trace and a second terminal in communication with the selected second conductive trace; and a memory element electrically in series with the first and second terminals and operative to store data as a plurality of conductivity profiles that can be determined by applying a read voltage across the first and second terminals, the memory element including a conductive metal oxide material.

3. The apparatus as set forth in claim 2, wherein the conductive metal oxide material is a perovskite.

4. The apparatus as set forth in claim 3, wherein the perovskite is PCMO or LNO.

5. The apparatus as set forth in claim 2, wherein the memory element includes a layer of an electronic insulator material in contact with and electrically in series with the conductive metal oxide material.

6. The apparatus as set forth in claim 2, wherein the data is non-volatile in the absence of a voltage applied across the first and second terminals.

7. The apparatus as set forth in claim 1 and further comprising:

a current mirror circuit electrically in series with the selected second conductive trace and operative to output a mirrored current that is approximately equal in magnitude to the leakage current during the first cycle and is approximately equal in magnitude to the total current during the second cycle.

8. The apparatus as set forth in claim 7 and further comprising:

a current-to-voltage converter coupled with the sense unit and operative to convert current flowing through the selected second conductive trace to an equivalent voltage during the first and second cycles, and wherein during the first cycle the equivalent voltage is indicative of a magnitude of the leakage current and during the second cycle the equivalent voltage is indicative of a magnitude of the total current.

9. The apparatus as set forth in claim 7 and further comprising:

a storage circuit coupled with the current-to-voltage converter and operative to store the equivalent voltage in a first storage element during the first cycle and operative to store the equivalent voltage in a second storage element during the second cycle.

10. The apparatus as set forth in claim 9, wherein the first storage element comprises a first capacitor and the second storage element comprises a second capacitor.

11. The apparatus as set forth in claim 1 and further comprising:

a compare unit operative to combine the leakage current, the total current, and a reference signal to generate a data signal indicative of stored data.

12. The apparatus as set forth in claim 11, wherein receiving the address occurs during a read operation to the array, the select voltage comprises a read voltage applied across the selected first and second conductive traces, the read voltage generates a read current that is a component of the total current, and wherein a magnitude of the read current is indicative of the stored data.

13. The apparatus as set forth in claim 12, wherein the read voltage is non-destructive to the stored data.

14. The apparatus as set forth in claim 11, wherein the compare unit further comprises:

an add unit operative to add the reference signal to the leakage current and generate a sum signal; and a comparator operative to compare the sum signal with the total current and generate the data signal.

15. The apparatus as set forth in claim 11, wherein the compare unit further comprises:

a subtract unit operative to subtract the leakage current from the total current and generate a difference signal; and a comparator operative to compare the difference signal with the reference signal and generate the data signal.

16. The apparatus as set forth in claim 11, wherein receiving the address occurs during a write operation with write data to be written to the address, the select voltage initially comprises a read voltage applied across the selected first and second conductive traces, and the compare unit is operative to compare the data signal with the write data and to generate a result signal, and based on a value of the result signal, either aborting the write operation or consummating the write operation.

17. The apparatus as set forth in claim 16, wherein aborting the write operation occurs when the value of the result signal is indicative of the stored data at the address being approximately equal to the write data.

18. The apparatus as set forth in claim 17, wherein the aborting results in the select voltage decreasing to a magnitude that is lower than a magnitude of the read voltage such that the stored data is not overwritten by the write data.

19. The apparatus as set forth in claim 16, wherein consummating the write operation occurs when the value of the result signal is indicative of the stored data at the address not being approximately equal to the write data.

20. The apparatus as set forth in claim 19, wherein the consummating results in the select voltage increasing from the read voltage to a write voltage applied across the selected first and second conductive traces and the write voltage is operative to overwrite the stored data with the write data.

21. The apparatus as set forth in claim 20, wherein a magnitude of the write voltage is greater than a magnitude of the read voltage.

22. The apparatus as set forth in claim 1, wherein the array comprises a two-terminal cross-point array.

23. The apparatus as set forth in claim 1, wherein the non-select voltage potential is approximately half-way between the first select voltage and the second select voltage.

24. An apparatus for sensing current in a two-terminal memory array, comprising:

a plurality of bit block arrays, each bit block array including a plurality of first conductive traces and a plurality of second conductive traces, an address unit operative to receive an address, to select at least one of the plurality of second conductive traces during a first cycle, to apply a first select voltage to the selected second conductive traces and to apply a non-select voltage potential to un-selected first and second conductive traces during the first cycle, to select one of the plurality of first conductive traces during a second cycle, to apply a second select voltage to the selected first conductive trace during; and a sense unit operative to sense a leakage current flowing through the selected second conductive traces during the first cycle and to sense a total current flowing through the selected second conductive traces during the second cycle.

25. The apparatus as set forth in claim 24, wherein each bit block array comprises a two-terminal cross-point array.

* * * * *

UNITED STATES PATENT AND TRADEMARK OFFICE
CERTIFICATE OF CORRECTION

PATENT NO. : 7,372,753 B1 Page 1 of 1
APPLICATION NO. : 11/583676
DATED : May 13, 2008
INVENTOR(S) : Darrell Rinerson et al.

It is certified that error appears in the above-identified patent and that said Letters Patent is hereby corrected as shown below:

1. In Claim 24, in Column 41, on Line 3,

After the word "during" and before the punctuation mark ";"

Please insert the words --the second cycle--.

Signed and Sealed this

Fifteenth Day of July, 2008

JON W. DUDAS
*Director of the United States Patent and Trademark Office*